United States Patent
Tsubaki et al.

(10) Patent No.: US 8,241,840 B2
(45) Date of Patent: *Aug. 14, 2012

(54) PATTERN FORMING METHOD, RESIST COMPOSITION TO BE USED IN THE PATTERN FORMING METHOD, NEGATIVE DEVELOPING SOLUTION TO BE USED IN THE PATTERN FORMING METHOD AND RINSING SOLUTION FOR NEGATIVE DEVELOPMENT TO BE USED IN THE PATTERN FORMING METHOD

(75) Inventors: Hideaki Tsubaki, Shizuoka (JP); Shinji Tarutani, Shizuoka (JP); Kazuyoshi Mizuyoshi, Shizuoka (JP); Kenji Wada, Shizuoka (JP); Wataru Hoshino, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 14 days.

This patent is subject to a terminal disclaimer.

(21) Appl. No.: 12/825,088

(22) Filed: Jun. 28, 2010

(65) Prior Publication Data

US 2010/0330507 A1   Dec. 30, 2010

Related U.S. Application Data

(63) Continuation of application No. 12/145,151, filed on Jun. 24, 2008, which is a continuation-in-part of application No. 12/102,504, filed on Apr. 14, 2008, now abandoned.

(30) Foreign Application Priority Data

Apr. 13, 2007 (JP) ................................. 2007-105910
Jul. 30, 2007 (JP) ................................. 2007-197838

(51) Int. Cl.
G03F 7/30 (2006.01)
G03F 7/004 (2006.01)

(52) U.S. Cl. ..................... 430/325; 430/270.1; 430/330; 430/910

(58) Field of Classification Search .................. 430/325, 430/326, 330, 270.1, 910
See application file for complete search history.

(56) References Cited

U.S. PATENT DOCUMENTS

| | | | |
|---|---|---|---|
| 4,099,062 A | 7/1978 | Kitcher |
| 4,212,935 A | 7/1980 | Canavello et al. |
| 4,267,258 A | 5/1981 | Yoneda et al. |
| 4,318,976 A | 3/1982 | Shu et al. |
| 4,491,628 A | 1/1985 | Ito et al. |
| 4,690,887 A | 9/1987 | Fukuda et al. |
| 4,777,119 A | 10/1988 | Brault et al. |
| 5,250,375 A | 10/1993 | Sebald et al. |
| 5,268,260 A | 12/1993 | Bantu et al. |
| 5,326,840 A | 7/1994 | Przybilla et al. |
| 5,470,693 A | 11/1995 | Sachdev et al. |
| 5,738,975 A | 4/1998 | Nakano et al. |
| 5,858,620 A | 1/1999 | Ishibashi et al. |
| 5,866,304 A | 2/1999 | Nakano et al. |
| 6,030,541 A | 2/2000 | Adkisson et al. |
| 6,147,394 A | 11/2000 | Bruce et al. |
| 6,221,568 B1 | 4/2001 | Angelopoulos et al. |
| 6,338,934 B1 | 1/2002 | Chen et al. |
| 6,406,829 B1 | 6/2002 | Tachikawa et al. |
| 6,509,134 B2 | 1/2003 | Ito et al. |
| 6,555,607 B1 | 4/2003 | Kanda et al. |
| 6,579,657 B1 | 6/2003 | Ishibashi et al. |
| 6,593,058 B1 | 7/2003 | Feiring et al. |
| 6,800,423 B2 | 10/2004 | Yokoyama et al. |
| 6,998,358 B2 | 2/2006 | French et al. |
| 7,016,754 B2 | 3/2006 | Poolla et al. |
| 7,129,199 B2 | 10/2006 | Zhang et al. |
| 7,348,127 B2 | 3/2008 | Hinsber, III |

(Continued)

FOREIGN PATENT DOCUMENTS

EP    0102450 A2    3/1984

(Continued)

OTHER PUBLICATIONS

Submission of Publications dated Jun. 11, 2010, in Japanese Application No. 2007-325915.
Correspondence Record prepared Jul. 13, 2010, in Japanese Application No. 2007-325915.
M. Maenhoudt, et al.; "Double Patterning scheme for sub-0.25 k1 single damascene structures at NA=0.75, λ=193nm"; Optical Microlithography XVIII; Proc. of SPIE vol. 5754; pp. 1508-1518 (2005).

(Continued)

*Primary Examiner* — John Chu
(74) *Attorney, Agent, or Firm* — Sughrue Mion, PLLC

(57) ABSTRACT

A pattern forming method includes (a) coating a substrate with a resist composition including a resin that includes a repeating unit represented by a following general formula (NGH-1), and, by the action of an acid, increases the polarity and decreases the solubility in a negative developing solution; (b) exposing; and (d) developing with a negative developing solution:

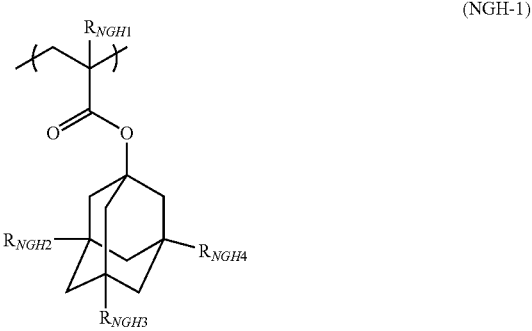

(NGH-1)

wherein $R_{NGH1}$ represents a hydrogen atom or an alkyl group; and $R_{NGH2}$ to $R_{NGH4}$ each independently represents a hydrogen atom or a hydroxyl group, provided that at least one of $R_{NGH2}$ to $R_{NGH4}$ represents a hydroxyl group.

15 Claims, 9 Drawing Sheets

U.S. PATENT DOCUMENTS

| | | | |
|---|---|---|---|
| 7,354,693 B2 | 4/2008 | Hatakeyama et al. |
| 7,371,510 B2 | 5/2008 | Hirayama et al. |
| 7,396,482 B2 | 7/2008 | Brandl |
| 7,399,577 B2 | 7/2008 | Yamato et al. |
| 7,445,883 B2 | 11/2008 | Baba-Ali et al. |
| 7,455,952 B2 | 11/2008 | Hatakeyama et al. |
| 7,608,386 B2 | 10/2009 | Nozaki et al. |
| 7,670,750 B2 | 3/2010 | Harada et al. |
| 7,678,537 B2 | 3/2010 | Allen et al. |
| 7,700,260 B2 | 4/2010 | Kanna et al. |
| 7,771,914 B2 | 8/2010 | Hatakeyama et al. |
| 7,851,140 B2 | 12/2010 | Tsubaki |
| 2002/0045122 A1 | 4/2002 | Iwasa et al. |
| 2002/0132184 A1 | 9/2002 | Babcock |
| 2003/0022095 A1 | 1/2003 | Kai et al. |
| 2003/0073027 A1 | 4/2003 | Namiki et al. |
| 2003/0091936 A1 | 5/2003 | Rottstegge et al. |
| 2003/0143483 A1 | 7/2003 | Takechi |
| 2004/0023150 A1 | 2/2004 | Feiring et al. |
| 2004/0023152 A1 | 2/2004 | Feiring et al. |
| 2004/0096780 A1 | 5/2004 | Nozaki et al. |
| 2004/0229157 A1 | 11/2004 | Rhodes et al. |
| 2004/0242798 A1 | 12/2004 | Sounik et al. |
| 2005/0095532 A1 | 5/2005 | Kodama et al. |
| 2005/0203262 A1 | 9/2005 | Feiring et al. |
| 2005/0224923 A1 | 10/2005 | Daley et al. |
| 2006/0008736 A1 | 1/2006 | Kanda et al. |
| 2006/0040203 A1 | 2/2006 | Kodama et al. |
| 2006/0073420 A1 | 4/2006 | Nozaki et al. |
| 2006/0105267 A1 | 5/2006 | Khojasteh et al. |
| 2006/0204890 A1 | 9/2006 | Kodama |
| 2006/0210919 A1 | 9/2006 | Mizutani et al. |
| 2006/0257781 A1 | 11/2006 | Benoit et al. |
| 2007/0003878 A1 | 1/2007 | Paxton et al. |
| 2007/0054217 A1 | 3/2007 | Kodama et al. |
| 2007/0081782 A1 | 4/2007 | Maeda et al. |
| 2007/0087288 A1 | 4/2007 | Nishiyama et al. |
| 2007/0105045 A1 | 5/2007 | Iwato et al. |
| 2007/0254237 A1 | 11/2007 | Allen et al. |
| 2008/0063984 A1 | 3/2008 | Zhang et al. |
| 2008/0113300 A2 | 5/2008 | Choi et al. |
| 2008/0131820 A1 | 6/2008 | Van Steenwinckel et al. |
| 2008/0187860 A1 | 8/2008 | Tsubaki et al. |
| 2008/0261150 A1 | 10/2008 | Tsubaki et al. |
| 2008/0311530 A1 | 12/2008 | Allen et al. |
| 2008/0318171 A1 | 12/2008 | Tsubaki |
| 2009/0011366 A1 | 1/2009 | Tsubaki et al. |
| 2009/0042147 A1 | 2/2009 | Tsubaki |
| 2009/0183390 A1 | 7/2009 | Miller et al. |
| 2010/0040971 A1 | 2/2010 | Tarutani et al. |
| 2010/0040972 A1 | 2/2010 | Tarutani et al. |
| 2010/0167201 A1 | 7/2010 | Tsubaki |
| 2010/0190106 A1 | 7/2010 | Tsubaki |
| 2010/0239984 A1 | 9/2010 | Tsubaki |
| 2010/0323305 A1 | 12/2010 | Tsubaki et al. |
| 2011/0020755 A1 | 1/2011 | Tsubaki et al. |

FOREIGN PATENT DOCUMENTS

| | | |
|---|---|---|
| EP | 0519297 A2 | 12/1992 |
| EP | 1 338 921 A2 | 8/2003 |
| EP | 1 500 977 A1 | 1/2005 |
| EP | 1612604 A2 | 1/2006 |
| EP | 1 720 072 A1 | 11/2006 |
| EP | 1764652 A2 | 3/2007 |
| EP | 1 980 911 A2 | 10/2008 |
| JP | 57-153433 A | 9/1982 |
| JP | 59-045439 A | 3/1984 |
| JP | 4-039665 A | 2/1992 |
| JP | 05-241348 A | 9/1993 |
| JP | 5-265212 A | 10/1993 |
| JP | 6-138666 A | 5/1994 |
| JP | 6-194847 A | 7/1994 |
| JP | 7-181677 A | 7/1995 |
| JP | 7-199467 A | 8/1995 |
| JP | 7-220990 A | 8/1995 |
| JP | 7-261392 A | 10/1995 |
| JP | 9-244247 A | 9/1997 |
| JP | 10-073927 A | 3/1998 |
| JP | 11-145036 A | 5/1999 |
| JP | 2000-199953 A | 7/2000 |
| JP | 2000-321789 A | 11/2000 |
| JP | 2001-019860 A | 1/2001 |
| JP | 2001-109154 A | 4/2001 |
| JP | 2001-215731 A | 8/2001 |
| JP | 2002-525683 A | 8/2002 |
| JP | 2002-260991 A | 9/2002 |
| JP | 2003-76019 A | 3/2003 |
| JP | 2003-122024 A | 4/2003 |
| JP | 2003-195502 A | 7/2003 |
| JP | 2003-249437 A | 9/2003 |
| JP | 2003-270789 A | 9/2003 |
| JP | 2004-061668 A | 2/2004 |
| JP | 2004-514952 A | 5/2004 |
| JP | 2004-527113 A | 9/2004 |
| JP | 2004-310082 A | 11/2004 |
| JP | 2005-109146 A | 4/2005 |
| JP | 2005-533907 A | 11/2005 |
| JP | 2006-072326 A | 3/2006 |
| JP | 2006-156422 A | 6/2006 |
| JP | 2006-227174 A | 8/2006 |
| JP | 2006-518779 A | 8/2006 |
| JP | 2006-259136 A | 9/2006 |
| JP | 2006-303504 A | 11/2006 |
| JP | 2006-309245 A | 11/2006 |
| JP | 2007-025240 A | 2/2007 |
| JP | 2007-065024 A | 3/2007 |
| JP | 2007-071978 A | 3/2007 |
| JP | 2007-108581 A | 4/2007 |
| JP | 2007-140188 A | 6/2007 |
| JP | 2007-156450 A | 6/2007 |
| JP | 2008-522206 T | 6/2008 |
| JP | 2008-292975 A | 12/2008 |
| JP | 2008-310314 A | 12/2008 |
| WO | 99/14635 A1 | 3/1999 |
| WO | 00/17712 A1 | 3/2000 |
| WO | 02/44845 A2 | 6/2002 |
| WO | 2004/068242 A1 | 8/2004 |
| WO | 2004/074937 A1 | 9/2004 |
| WO | 2004/076495 A2 | 9/2004 |
| WO | 2004/077158 A1 | 9/2004 |
| WO | 2005/019937 A1 | 3/2005 |
| WO | 2005/043239 A1 | 5/2005 |
| WO | 2006/056905 A2 | 6/2006 |
| WO | 2007/037213 A1 | 4/2007 |
| WO | 2008 129964 A1 | 10/2008 |
| WO | 2008 140119 A1 | 11/2008 |

OTHER PUBLICATIONS

Sungkoo Lee, et al.; "Double exposure technology using silicon containing materials"; Advances in Resist Technology and Processing XXIII, Proc. of SPIE Col. 6153; pp. 61531K-1 to 61531K-7 (2006).

Steven R. J. Brueck, et al.; "Extension of 193-nm immersion optical lithography to the 22-nm half-pitch node"; Optical Microlithography VXII, Proc. of SPIE vol. 5377; pp. 1315-1322 (2004).

European Search Report dated Sep. 20, 2010 in counterpart European Application No. 07025004.8.

Office Action dated Sep. 13, 2010 in co-pending U.S. Appl. No. 11/964,454.

Office Action dated Dec. 13, 2010 in copending U.S. Appl. No. 11/964,454.

Notification of Reasons for Refusal in counterpart Japanese Application No. 2007-325915, dated Mar. 30, 2010.

Extended European Search Report dated May 28, 2009.

Non-Final Office Action issued in co-pending U.S. Appl. No. 12/145,151, dated Mar. 26, 2010.

Non-Final Office Action issued in co-pending U.S. Appl. No. 12/145,151, dated Jul. 6, 2009.

Office Action dated Jul. 26, 2011 in Japanese Application No. 2007-197838.

David Van Steenwinckel et al.; "Resist effects at small pitches"; American Vacuum Society, Journal of Vacuum Science Technology B vol. 24 No. 1; Jan./Feb. 2006; pp. 316-320.

Karen E. Petrillo et al.; "Effect of photo acid generator concentration on the process latitude of a chemically amplified resist"; American Vacuum Society; Journal of Vacuum Science Technology B; vol. 12 No. 6; Nov./Dec. 1994; pp. 3863-3867.

Shinji Tarutani et al.; "Development of Materials and Processes for Double Patterning toward 32 nm Node ArF Immersion Lithography"; Journal of Photopolymer Science and Tech; 2008, vol. 21 No. 5; pp. 685-690.

B.J. Lin, "Semiconductor Foundry, Lithography, and Partners", Emerging Lithographic of SPIE, 2002, pp. 11-24, vol. 4688, SPIE.

"Microdevices", Apr. 2004, pp. 76-87, Nikkei Microdevices.

J. A. Hoffnagle et al., "Liquid Immersion Deep-Ultraviolet Interferometric Lithography", J. Vac. Sci. Technol. B, Nov./Dec. 1999, pp. 3306-3309, vol. 17, American Vacuum Society.

Office Action dated Nov. 16, 2010 in Taiwanese Application No. 097121644.

Notification of Reasons for Refusal dated Jul. 13, 2010 in Japanese Application No. 2007-155322.

Office Action dated Apr. 6, 2010 in Japanese Application No. 2008-128797.

Notification of Reasons for Refusal dated Jul. 13, 2010 in Japanese Application No. 2007-155323.

Extended European Search Report dated Apr. 27, 2009 in EP Application No. 08010596.8.

Extended European Search Report dated Apr. 27, 2009 in EP Application No. 08010600.8.

International Search Report (PCT/ISA /210) dated Jul. 22, 2008 for PCT/JP2008/060800.

Written Opinion (PCT/ISA/237) dated Jul. 22, 2008 for PCT/JP2008/060800.

International Search Report (PCT/ISA /210) dated Jun. 17, 2008 for PCT/JP2008/058976.

Written Opinion (PCT/ISA/237) dated Jun. 17, 2008 for PCT/JP2008/058976.

International Search Report (PCT/SA/210) issued May 20, 2008 in PCT/JP2008/057187.

Written Opinion (PCT/ISA/237) issued May 20, 2008 in PCT/JP2008/057187.

Office Action dated Sep. 2, 2010 in U.S. Appl. No. 12/137,371.

Office Action dated Sep. 3, 2010 in U.S. Appl. No. 12/137,232.

Office Action dated Feb. 3, 2011 in U.S. Appl. No. 12/959,147.

Office Action dated Nov. 30, 2010 in U.S. Appl. No. 12/578,520.

Office Action dated Oct. 28, 2010 in U.S. Appl. No. 12/600,038.

Office Action dated Feb. 25, 2011 in U.S. Appl. No. 12/895,516.

Office Action dated Dec. 21, 2010 in European Application No. 08007245.7.

Office Action dated Dec. 17, 2010 in European Application No. 08010596.8.

Office Action dated Dec. 17, 2010 in European Application No. 08010600.8.

Office Action dated Dec. 18, 2010 in Korean Application No. 10-2008-0055449.

Office Action dated Dec. 3, 2010 in Korean Application No. 10-2008-0055461.

Extended European Search Report dated Jan. 14, 2011 in EP Application No. 07025004.8.

English Translation of JP 2000-199953.

Non-Final Office Action dated Nov. 2, 2010 in co-pending U.S. Appl. No. 12/145,270.

Office Action dated Sep. 26, 2011 in U.S. Appl. No. 12/145,270.

EXPOSURE DOSE/RESIDUAL FILM RATIO CURVE
IN THE CASE OF USING POSITIVE DEVELOPING SOLUTION

EXPOSURE DOSE/RESIDUAL FILM RATIO CURVE
IN THE CASE OF USING NEGATIVE DEVELOPING SOLUTION

PATTERN FORMING METHOD, RESIST COMPOSITION TO BE USED IN THE PATTERN FORMING METHOD, NEGATIVE DEVELOPING SOLUTION TO BE USED IN THE PATTERN FORMING METHOD AND RINSING SOLUTION FOR NEGATIVE DEVELOPMENT TO BE USED IN THE PATTERN FORMING METHOD

CROSS-REFERENCE TO RELATED APPLICATIONS

This application is a Rule 53(b) Continuation of U.S. application Ser. No. 12/145,151 filed Jun. 24, 2008, which is a Continuation-In-Part application of U.S. application Ser. No. 12/102,504 filed in the United States on Apr. 14, 2008; the entire contents of which are hereby incorporated by reference.

BACKGROUND OF THE INVENTION

1. Field of the Invention

This invention relates to a pattern forming method which is usable in the course of producing semiconductors such as ICs, producing liquid crystals or circuit boards such as thermal heads and lithographing other photofabrications, a resist composition for negative development to be used in the pattern forming method, a resist composition for multiple development to be used in the pattern forming method, a negative developing solution to be used in the pattern forming method and a rinsing solution for negative development to be used in the pattern forming method. In particular, it relates to a pattern forming method appropriately usable in exposure with the use of an ArF exposure device and an immersion type projection exposure device wherein far-ultraviolet light having a wavelength of 300 nm or less is employed as the light source, and a resist composition to be used in the pattern forming method, a negative developing solution to be used in the pattern forming method and a rinsing solution for negative development to be used in the pattern forming method.

2. Description of the Related Art

After the development of a resist for a KrF excimer laser beam (248 nm), use has been made of a so-called chemical amplification image forming method that is a resist image forming method for compensating for lowering in sensitivity caused by light absorption. In the positive type chemical amplification method for forming an image, for example, an acid-generating agent is decomposed upon exposure in an exposed part to form an acid. In baking after the exposure (PEB: post exposure bake), the acid thus generated is utilized as a reaction catalyst and thus an alkali-insoluble group is converted into an alkali-soluble group. Thus, the exposed part is removed by the alkali development to thereby form an image.

With the recent fine patterning in semiconductors, attempts have been made to shorten the wavelength of an exposure light source and elevate the numerical aperture (high NA) of a projector lens. At present, there has been developed an exposure device using an ArF excimer laser beam having a wavelength of 193 nm as a light source. It is widely known that such devices can be indicated by the following formulae.

(Resolution)=$k_1 \cdot (\lambda/NA)$ (Focal depth)=$\pm k_2 \cdot \lambda/NA^2$ In the above formulae, $\lambda$ represents the wavelength of an exposure light source; NA represents the numerical aperture of a projector lens; and $k_1$ and $k_2$ represent coefficients relating to the process.

As a technique for elevating resolution, there has been known a so-called immersion method wherein the space between a projector lens and a sample is filled with a liquid having a high refractive index (hereinafter also called "immersion liquid").

Concerning this "immersion effect", the resolution and focal depth as described above can be indicated by the following formulae, wherein $\lambda_0$ represents the wavelength of the exposure light in air, n represents the air refractive index of the immersion liquid, $\theta$ represents the convergence half angle of the light, and $NA_0$ is referred to as sine.

(Resolution)=$k_1 \cdot (\lambda_0/n)NA_0$ (Focal depth)=$\pm k_2 \cdot (\lambda_0/n)NA_0^2$ Namely, the immersion effect is equivalent to using exposure light of the wavelength 1/n. In other words, the immersion makes it possible to elevate n-fold the focal depth in the case of using a projection optical system of the same NA. This is effective on any patterns and, moreover, can be combined with the super-resolution techniques under study, for example, the phase-shift method and the distortion illumination method.

To further elevate resolution, there have been proposed the double exposure technology and the double patterning technology which are regarded as techniques whereby resolution is elevated by lessening $k_1$ in the above formulae concerning resolution.

To pattern an electronic device such as a semiconductor, it has been a practice to transfer a pattern of a mask or a reticle, in which the target pattern has been enlarged 4- to 5-fold, onto a substrate to be exposed such as a wafer with the use of a reducing projection exposure device.

With the recent fine patterning, however, there arises a problem in the existing exposure system that light interference occurs in adjacent patterns and thus optical contrast is reduced. To overcome this problem, attempts are made in these techniques to divide the mask design into patterns of a plurality of masks and separately expose the individual masks, thereby forming an image. In such a double exposure system, it is required to divide the mask design and combine these patterns again on a substrate to be exposed such as a wafer to thereby form an image. Therefore, the mask design should be divided in such a manner as ensuring the faithful reproduction of the pattern on a reticle.

JP-A-2006-156422 shows a case wherein the effect of this double exposure system on the transfer of a fine image pattern in a semiconductor.

Moreover, recent advances in the double exposure technology are reported in SPIE Proc 5754, 1508 (2005), SPIE Proc 5377, 1315 (2005), SPIE Proc 61531K-1 (2006) and so on.

In the case where a pattern is formed merely by applying an existing resist composition to an existing resist process, there arises a problem that neither a sufficient exposure margin nor a sufficient focal depth can be obtained since the pattern should be formed in the vicinity of the limit of resolution of the resist in the double exposure system.

Namely, no sufficient resolution performance can be established by applying a pattern forming process which includes coating a substrate with a resist composition containing a resin showing an increase in polarity upon exposure, exposing, and developing by dissolving an exposed part of the resist film with an alkaline developing solution as reported in JP-A-

2001-109154, etc., or a pattern forming process which includes coating a substrate with a resist composition containing a resin showing an increase in molecular weight upon exposure, exposing, and developing by dissolving a non-exposed part of the resist film with an alkaline developing solution as reported in JP-A-2003-76019, etc. to the double exposure system.

As developing solutions for g-ray, i-ray, KrF, ArF, EB and EUV lithography, a 2.38% by mass aqueous alkaline developing solution of TMAH (tetramethylammonium hydroxide) is employed in these days.

As developing solutions other than the above-described one, for example, JP-A-2001-215731 discloses a developing solution for dissolving and developing an exposed part of a resist material containing a copolymer composed of an ethylene-based monomer and an acrylic monomer, which contains an aliphatic linear ether solvent or an aromatic ether solvent with a ketone (having 5 or more carbon atoms) solvent. JP-A-2006-227174 discloses a developing solution for dissolving and developing an exposed part of a resist material being degraded via cleavage in a polymer chain upon radiation, which is characterized by containing two or more of acetate, ketone, ether and phenyl groups and having a molecular weight of 150 or more. JP-A-6-194847 discloses a developing solution for developing an unexposed part of a resist material containing as the main component a photosensitive polyhydroxy ether resin obtained by reacting a polyhydroxy ether resin with glycidyl(meth)acrylate, which is characterized by using an aromatic compound having from 6 to 12 carbon atoms or a solvent mixture containing 50% by mass or more of an aromatic compound having form 6 to 12 carbon atoms as the developing solution.

However, these combinations of a resist composition with a developing solution merely provide a system wherein a specific resist composition is combined with a highly polar alkali developing solution or a developing solution containing an organic solvent with a low polarity to form a pattern.

That is, in a positive system (a combination of a resist composition with a positive developing solution), there is merely provided a material whereby a pattern is formed by selectively dissolving and removing an area with high photo irradiation intensity in an optical aerial image (photo intensity distribution), as shown in FIG. 1. In a negative system (a combination of a resist composition with a negative developing solution), on the other hand, there is merely provided a material whereby a pattern is formed by selectively dissolving and removing an area with low photo irradiation intensity.

The term "positive developing solution" as used herein means a developing solution by which an exposed part located at a definite threshold (shown by the solid line in FIG. 1) or above is selectively dissolved and removed. The term "negative developing solution" as used herein means a developing solution by which an exposed part located below the definite threshold is selectively dissolved and removed. A development step using a positive developing solution is called a positive development (also called a positive development step), while a development step using a negative developing solution is called a negative development (also called a negative development step).

JP-A-2000-199953 discloses a double development technique as a double patterning technique for improving resolution. In this case, a common image forming method by chemical amplification is employed. By utilizing the phenomenon that the polarity of a resin in a resist composition is elevated by photo exposure in an area with a high photo intensity and lowered in an area with a low photo intensity, positive development is conducted by dissolving a high exposure area of a specific resist film with a developing solution having a high polarity and negative development is conducted by dissolving a low exposure area thereof with a developing solution having a low polarity. More specifically speaking, an area wherein the exposure dose of irradiation light 1 is E2 or more is dissolved by using an aqueous alkali solution as a positive developing solution, while an area wherein the exposure dose is E1 or less is dissolved by using a specific organic solvent as a negative developing solution, as shown in FIG. 2. Thus, an area with medium exposure dose (E2 to E1) is left as a non-developed area and an L/S pattern 3 whose pitch is half that of the mask pattern for exposure 2 is formed on a wafer 4, as shown in FIG. 2.

In the above-described case, however, tert-butyl group is employed as an acid-decomposable group in the resin contained in the resist composition. Therefore, it is impossible to express a sufficient change in polarity for causing a difference in dissolution characteristics clue to the chemical amplification reaction accompanying exposure.

Because of using a resin having a styrene skeleton as the resin in the resist composition, moreover, the low exposure area of the resist film has a high polarity. As a result, the development with the use of the negative developing solution proceeds at only a low development speed, which brings about a problem that the developing properties in using the negative developing solution are deteriorated.

SUMMARY OF THE INVENTION

To solve the above-described problem and stably form a highly precise and fine pattern to thereby produce a highly integrated and highly precise electronic device, the present invention aims at providing a pattern forming method whereby line edge roughness can be relieved and the dimensional stability of the pattern can be improved.

The invention has the following constitution whereby the above-described object according to the invention can be achieved.

<1> A pattern forming method comprising:

(a) coating a substrate with a resist composition comprising a resin that comprises a repeating unit represented by a following general formula (NGH-1), and, by the action of an acid, increases the polarity and decreases the solubility in a negative developing solution;

(b) exposing; and (d) developing with a negative developing solution:

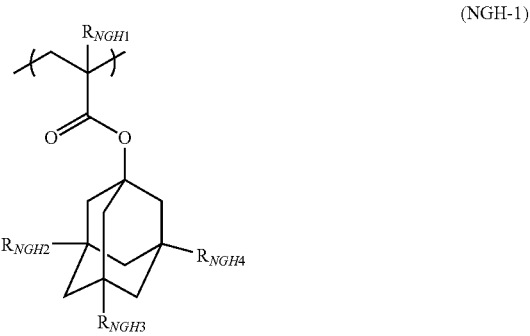

(NGH-1)

wherein $R_{NGH1}$ represents a hydrogen atom or an alkyl group; and $R_{NGH2}$ to $R_{NGH4}$ each independently represents a hydrogen atom or a hydroxyl group, provided that at least one of $R_{NGH2}$ to $R_{NGH4}$ represents a hydroxyl group, <2> The pattern forming method as described in <1>, wherein the negative developing solution comprises an organic solvent and has a vapor pressure of 5 kPa or lower at 20° C.

<3> The pattern forming method as described in <1>, further comprising:

(f) washing with a rinsing solution for negative development, which comprises an organic solvent.

<4> The pattern forming method as described in <3>, wherein the rinsing solution for negative development has a vapor pressure of 0.1 kPa or higher at 20° C.

<5> The pattern forming method as described in <1>, further comprising:

(c) developing with a positive developing solution.

<6> A resist composition for negative development, comprising:

(A) a resin that comprises a repeating unit represented by a following general formula (NGH-1), and, by the action of an acid, increases the polarity and decreases the solubility in a negative developing solution;

(B) a compound capable of generating an acid upon irradiation with an actinic ray or radiation; and (C) a solvent:

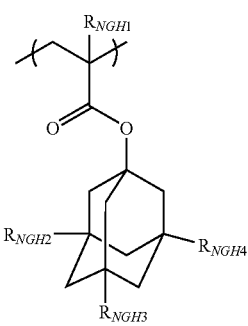

(NGH-1)

wherein $R_{NGH1}$ represents a hydrogen atom or an alkyl group; and $R_{NGH2}$ to $R_{NGH4}$ each independently represents a hydrogen atom or a hydroxyl group, provided that at least one of $R_{NGH2}$ to $R_{NGH4}$ represents a hydroxyl group.

<7> A resist composition for multiple development, comprising:

(A) a resin that comprises a repeating unit represented by a following general formula (NGH-1), and, by the action of an acid, decreases the solubility in a negative developing solution and increases the solubility in a positive developing solution;

(B) a compound capable of generating an acid upon irradiation with an actinic ray or radiation; and (C) a solvent:

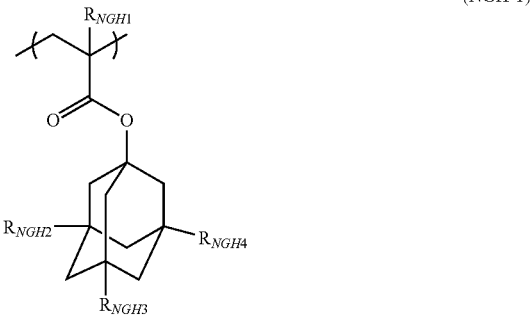

(NGH-1)

wherein $R_{NGH1}$ represents a hydrogen atom or an alkyl group; and $R_{NGH1}$ to $R_{NGH4}$ each independently represents a hydrogen atom or a hydroxyl group, provided that at least one of $R_{NGH2}$ to $R_{NGH4}$ represents a hydroxyl group.

<8> A negative developing solution for the pattern forming method as described in <1>, comprising an organic solvent and having a vapor pressure of 5 kPa or lower at 20° C.

<9> A rinsing solution for negative development for the pattern forming method as described in <3>, comprising an organic solvent and has a vapor pressure of 0.1 kPa or higher at 20° C.

DETAILED DESCRIPTION OF THE INVENTION

Next, the best mode for carrying out the invention will be described.

In illustrating groups (atomic groups) herein, those which are not indicated as being substituted or unsubstituted include both of groups having no substituent and those having a substituent. For example, the term "alkyl group" includes an alkyl group having no substituent (an unsubstituted alkyl group) as well as an alkyl group having a substituent (a substituted alkyl group).

Figure 1:
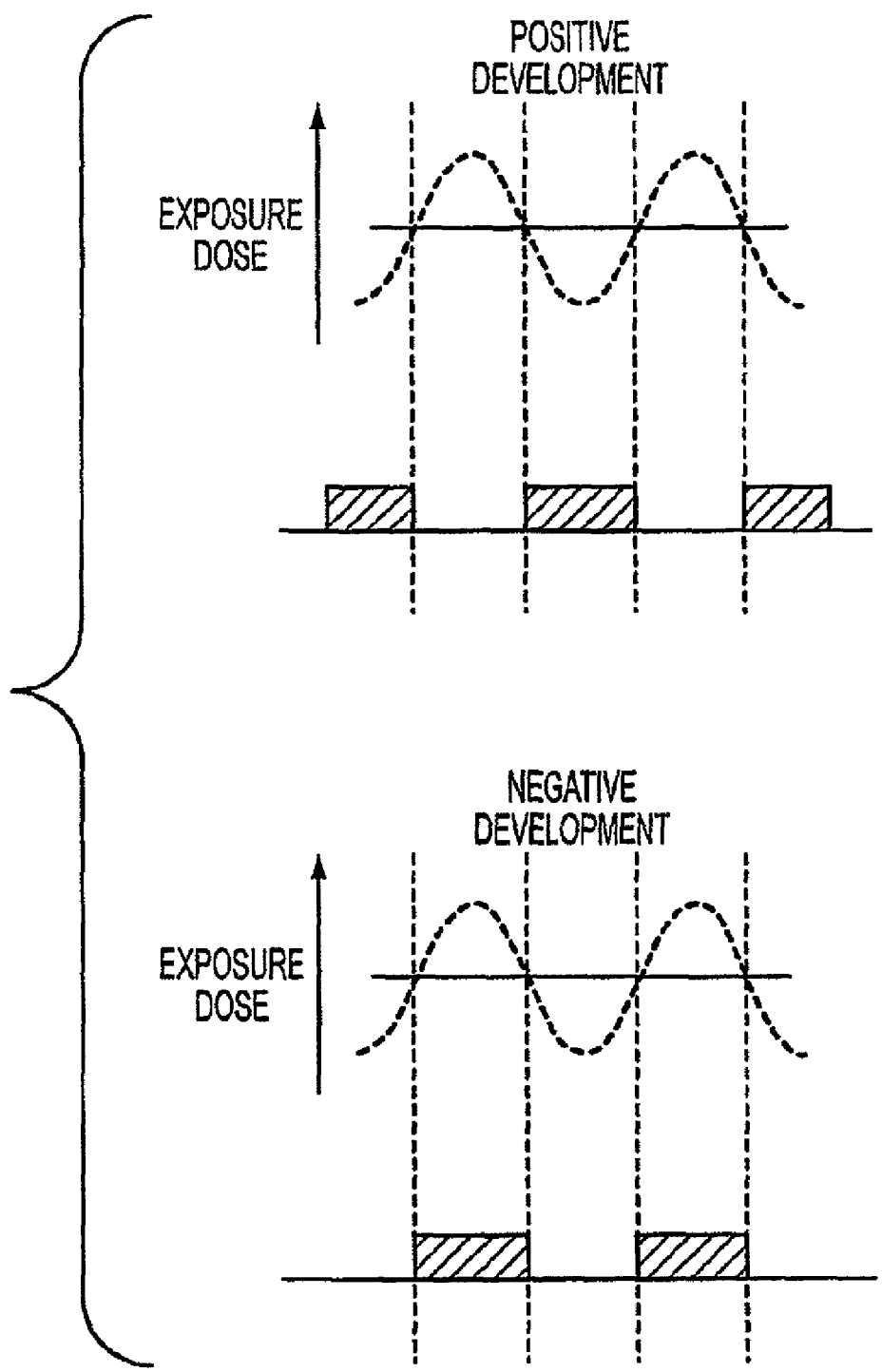
FIG. 1 is a model view which shows the relationship of positive development, negative development and exposure dose in the existing method.
Figure 2:
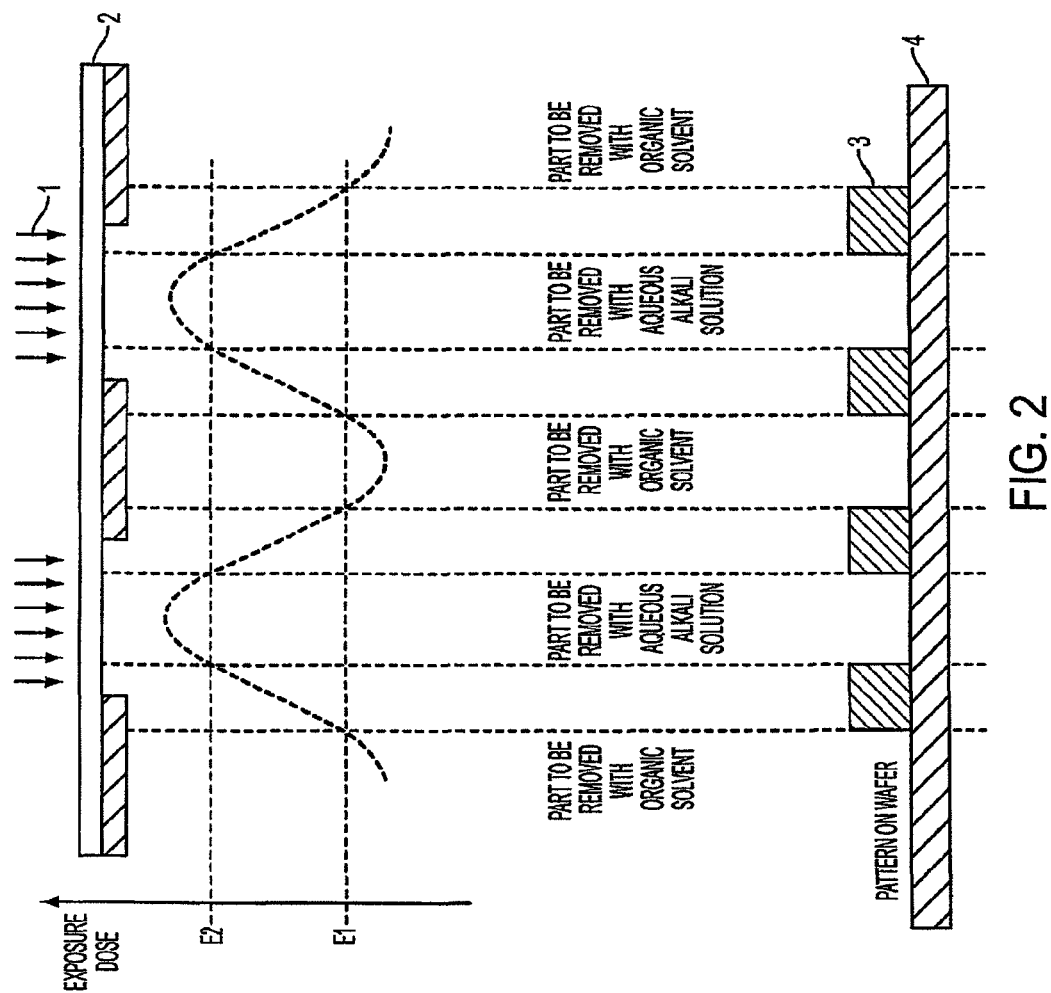
FIG. 2 is a model view which shows a pattern forming method with the combined use of positive development and negative development.

First, the meanings of terms employed herein will be illustrated. Pattern forming methods are classified into the positive system and the negative system. Although a change in the solubility of a resist film in a developing solution due to a chemical reaction induced by photo irradiation is utilized in both of these systems, an irradiated part is dissolved in a developing solution in the positive system while a non-irradiated part is dissolved in a developing solution in the negative system. There are two types of developing solutions, i.e., negative developing solutions and positive developing solutions, to be used therein. A positive developing solution is a developing solution by which an exposed part above a definite threshold shown by a solid line in FIG. 1 is selectively dissolved and removed. A negative developing solution is a developing solution by which an exposed part below the definite threshold as described above is selectively dissolved and removed. A development step using a positive developing solution is called a positive development (also called a positive development step), while a development step using a negative developing solution is called a negative development (also called a negative development step). A development system wherein a development step with the use of a positive developing solution as described above is combined with a development system with the use of a negative developing solution as described above is called a multiple development (also called a multiple development step). In the invention, a resist composition to be used in negative development is called a resist composition for negative development, while a resist composition to be used in multiple development is called a resist composition for multiple development. A mere expression "resist composition" indicates both of a resist composition for negative development and a resist composition for multiple development. A rinsing solution for negative development means a rinsing solution containing an organic solvent that is to be used in a washing step following the negative development step.

Figure 3:
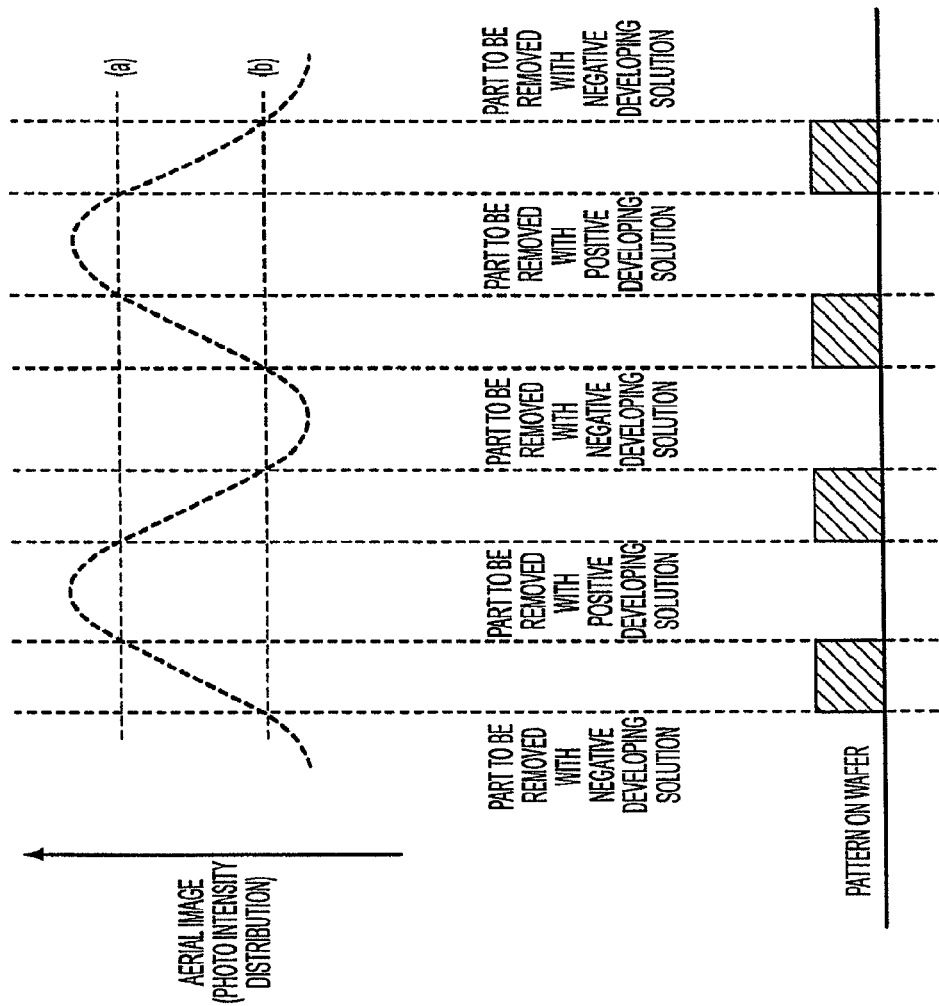
FIG. 3 is a model view which shows the relationship of positive development, negative development and exposure dose.

As a technique for improving resolution, the invention presents a novel pattern forming method wherein a developing solution (a negative developing solution) by which an exposed part below a definite threshold (b) is selectively dissolved and removed as shown in FIG. 3 is combined with a resist composition for negative development containing a resin which has a repeating unit represented by the following general formula (NGH-1) and shows an increase in polarity and a decrease in the solubility in a negative developing solution by the action of an acid.

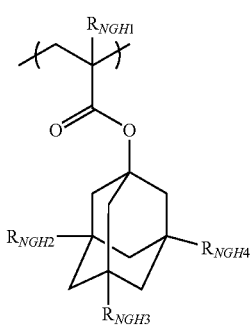

(NGH-1)

In the general formula (NGH-1), $R_{NGH1}$ represents a hydrogen atom or an alkyl group. $R_{NGH2}$ to $R_{NGH4}$ each independently represents a hydrogen atom or a hydroxyl group, provided that at least one of $R_{NGH2}$ to $R_{NGH4}$ represents a hydroxyl group.

As a technique for improving resolution, the invention preferably presents a novel pattern forming method wherein a developing solution (a positive developing solution) by which an exposed part above a definite threshold (a) is selectively dissolved and removed and a developing solution (a negative developing solution) by which an exposed part below a definite threshold (b) is selectively dissolved and removed are combined with a resist composition for multiple development containing a resin which has a repeating unit represented by the following general formula (NGH-1) and shows an increase in polarity, a decrease in the solubility in a negative developing solution and an increase in the solubility in a positive developing solution by the action of an acid.

When pattern elements on an exposure mask are projected onto a wafer by photo irradiation as FIG. 3 shows, namely, an area with a high irradiation intensity (an exposed area above the definite threshold (a)) is dissolved and removed by using a positive developing solution, while an area with a low irradiation intensity (an exposed area below the definite threshold (b)) is dissolved and removed by using a negative developing solution. Thus, a pattern having a resolution twice as high as the frequency of an optical aerial image can be obtained. In the method according to the invention, moreover, it is unnecessary to divide the exposure mask design.

As a resist composition for multiple development by which two or more development procedures as described above are simultaneously conducted, a resist composition for negative development can be used as such.

The pattern forming process required in embodying the invention includes the following steps:

(a) the step of coating a resist composition containing a resin which has a repeating unit represented by the following general formula (NGH-1) and shows an increase in polarity and a decrease in the solubility in a negative developing solution by the action of an acid;

(b) the step of exposing; and (d) the step of developing by using a negative developing solution.

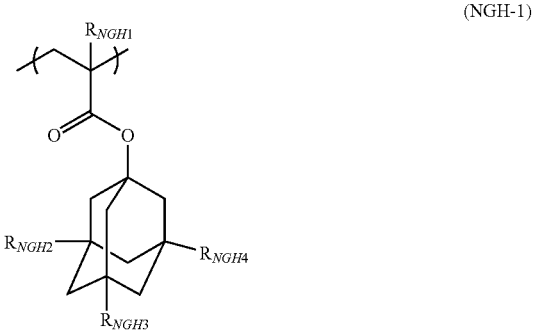

(NGH-1)

In the general formula (NGH-1), $R_{NGH1}$ represents a hydrogen atom or an alkyl group. $R_{NGH2}$ to $R_{NGH4}$ each independently represents a hydrogen atom or a hydroxyl group, provided that at least one of $R_{NGH2}$ to $R_{NGH4}$ represents a hydroxyl group.

It is preferable that the pattern forming method according to the invention further includes (f) the step of washing by using a rinsing solution for negative development which contains an organic solvent.

It is preferable that the pattern forming method according to the invention furthermore includes (c) the step of developing by using a positive developing solution.

It is preferable that the pattern forming method according to the invention includes (e) the step of heating which follows (b) the step of exposing.

In the pattern forming method according to the invention, (b) the step of exposing can be conducted multiple times.

In the pattern forming method according to the invention, (e) the step of heating can be conducted multiple times.

To carry out the invention, a resist composition containing a resin which has a repeating unit represented by the following general formula (NGH-1) and shows an increase in polarity and a decrease in the solubility in a negative developing solution by the action of an acid, a negative developing solution (preferably an organic developing solution) and a rinsing solution for negative development which preferably contains an organic solvent are needed.

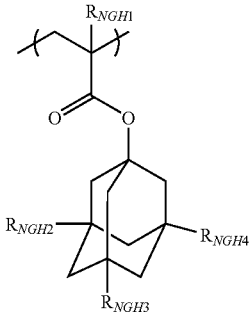

(NGH-1)

In the general formula (NGH-1), $R_{NGH1}$ represents a hydrogen atom or an alkyl group. $R_{NGH2}$ to $R_{NGH4}$ each independently represents a hydrogen atom or a hydroxyl group, provided that at least one of $R_{NGH2}$ to $R_{NGH4}$ represents a hydroxyl group.

To carry out the invention, it is preferable to further use a positive developing solution (preferably an alkali developing solution).

In the pattern forming process using two kinds of developing solutions, i.e., a positive developing solution and a negative developing solution, the order of the developments is not particularly restricted. It is preferred that, after conducting the first exposure, a first development is conducted by using a positive developing solution or a negative developing solution and then a negative or positive development is conducted by using a developing solution of the different type from the first development. It is also preferred to conduct washing with the use of a rinsing solution for negative development, which contains an organic solvent, after the negative development.

Pattern forming systems include (a) a system using a chemical reaction such as polarity change and (b) a system using the intermolecular bond formation such as crosslinkage or polymerization.

In a resist material the molecular weight of which increases due to intermolecular bond formation such as crosslinkage or polymerization, it is difficult to construct a system wherein a single resist material serves as a positive resist to a developing solution but as a negative resist to another developing solution.

The resist composition according to the invention is "a resin composition which has a repeating unit represented by the following general formula (NGH-1) and shows an increase in polarity and a decrease in the solubility in a negative developing solution by the action of an acid".

The resin contained in the resist composition according to the invention shows an increase in polarity by the action of an acid. As a result, it shows not only a decrease in the solubility in a negative developing solution but also an increase in the solubility in an alkali developing solution.

Therefore, the resist composition according to the invention serves as a negative resist to a negative developing solution but as a positive resist to a positive developing solution.

In the invention, an organic developing solution containing an organic solvent can be used as a negative developing solution, while an alkali (aqueous) developing solution can be used as a positive developing solution.

It is important in the invention to control the "thresholds" of the exposure dose (i.e., the exposure dose at which a film becomes soluble or insoluble in the photo irradiation area). To obtain a desired line width in pattern forming, the minimum exposure amount at which the film is soluble in the positive developing solution and the maximum exposure dose at which the film is insoluble in the negative developing solution are regarded as the "thresholds".

The "thresholds" can be determined in the following manner.

To obtain a desired line width in pattern forming, the minimum exposure amount at which the film is soluble in the positive developing solution and the maximum exposure dose at which the film is insoluble in the negative developing solution are regarded as the "thresholds".

More strictly speaking, the thresholds are defined as follows.

Figure 4:
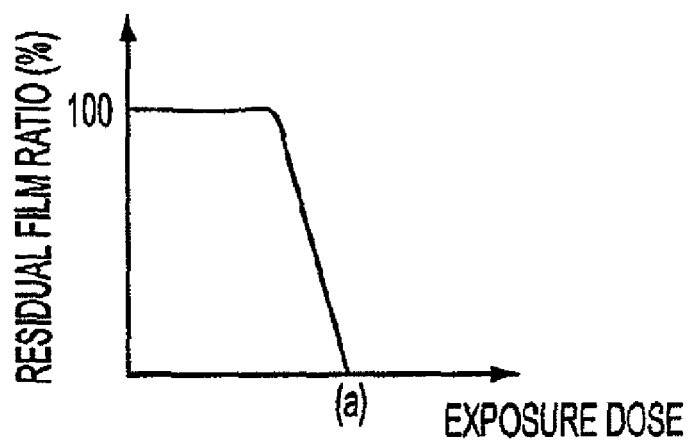
FIG. 4 is graphs each showing the relationship of the exposure dose and the residual film ratio in using a positive developing solution or a negative developing solution.
Figure 4:
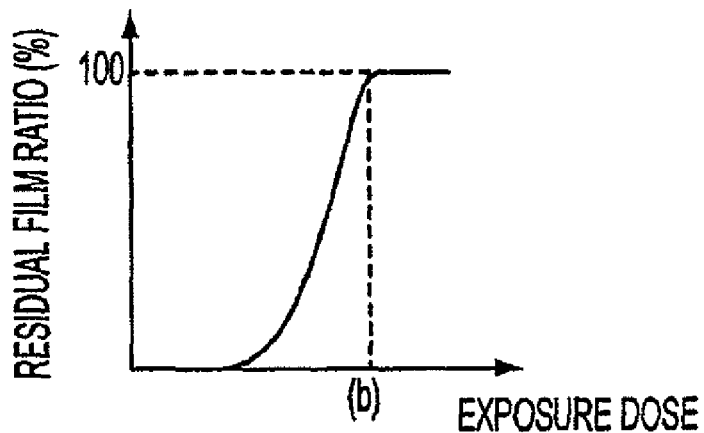

When the residual film ratio of a resist film to an exposure dose is measured, the exposure dose at which the residual film ratio to a positive developing solution attains 0% is referred to as the threshold (a) and the exposure dose at which the residual film ratio to a negative developing solution attains 100% is referred to as the threshold (b), as shown in FIG. 4.

Figure 5:
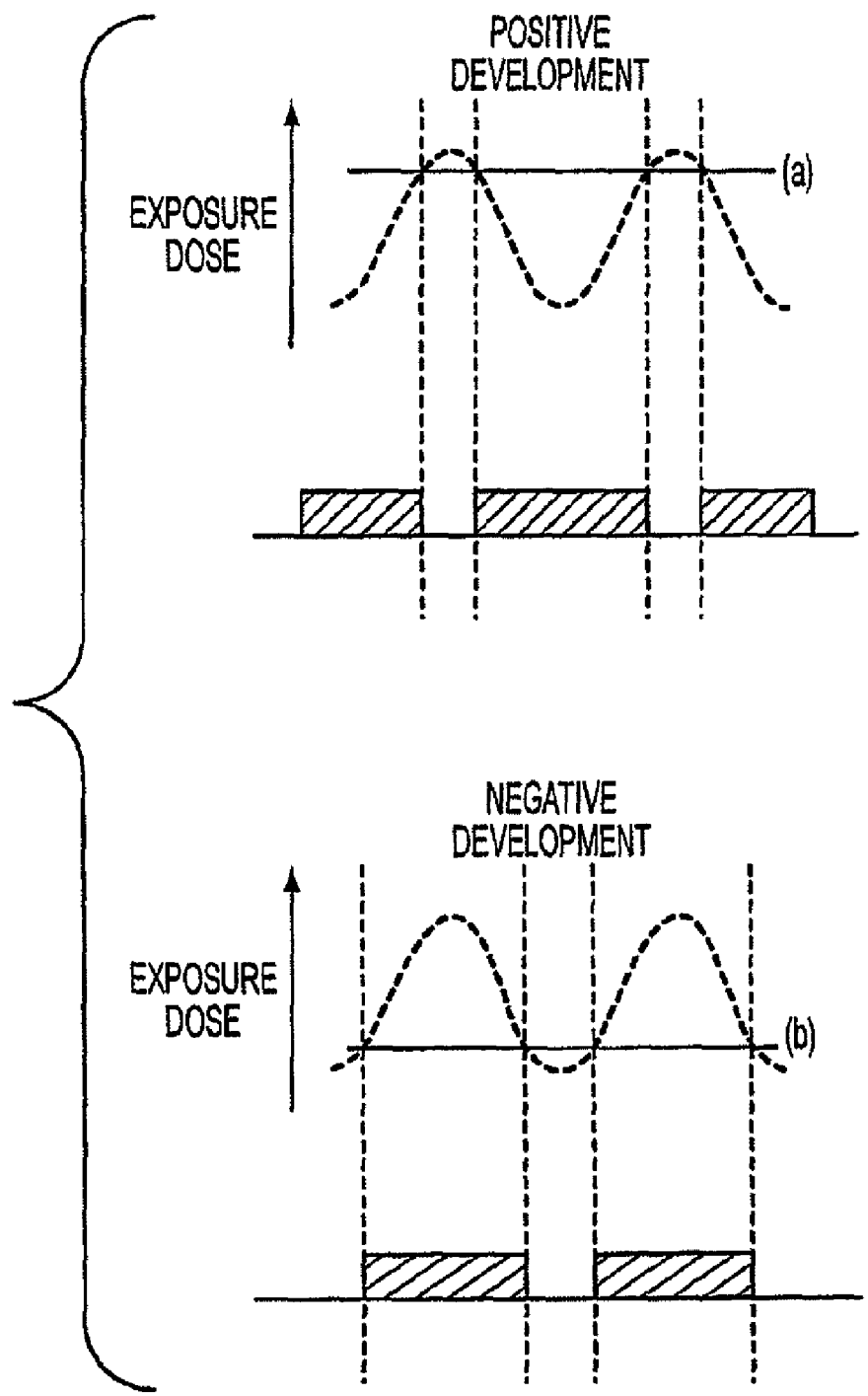
FIG. 5 is a model view which shows the relationship of positive development, negative development and exposure dose in the method according to the invention.
Figure 6:
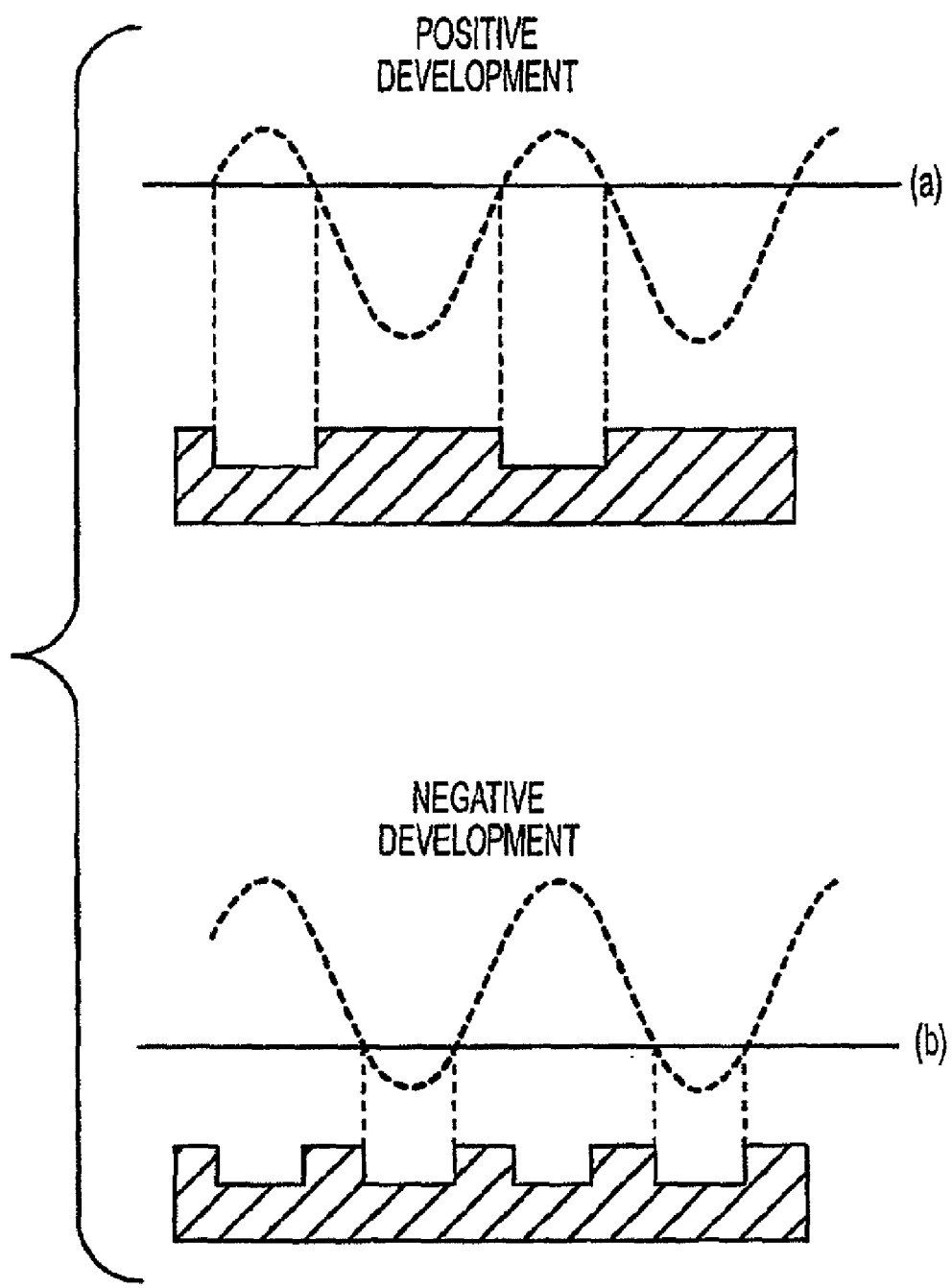
FIG. 6 is a model view which shows the relationship of positive development, negative development and exposure dose in the method according to the invention.

For example, by controlling the threshold (a) of the exposure dose at which the film becomes soluble in the positive developing solution to a level higher than the threshold (b) of the exposure dose at which the film becomes soluble in the negative developing solution as in FIG. 5, a pattern can be made by a single exposure. As FIG. 6 shows, namely, a wafer coated with the resist is exposed and a part higher than the threshold (a) of the exposure dose is first dissolved by using the positive developing solution. Next, a part lower than the threshold (b) of the exposure dose is dissolved by using the negative developing solution. Thus, pattern forming can be completed by a single exposure. In this case, the developments with the positive and negative developing solutions may be conducted in an arbitrary order. By washing the film with a rinsing solution containing an organic solvent after the negative development, an improved pattern can be obtained.

As the methods of controlling the thresholds, use can be made of a method including controlling parameters concerning materials such as a resist composition and developing solutions and parameters concerning the process.

As the parameters concerning materials, it is effective to control various physical values concerning the solubilities of the resist composition in developing solutions and organic solvents, i.e., SP values (solubility parameters), LogP values and so on. Specific examples thereof include the weight-average molecular weight, weight average dispersion, monomer composition ratio, monomer polarity, monomer sequence and polymer blend of a polymer contained in the resist composition, a low-molecular weight additive if contained, the concentrations of developing solutions, a low-molecular weight additive if contained, a surfactant if contained and so on.

Examples of the parameters concerning the process include film-forming temperature, film-forming time, the temperature and time at the post-exposure heating, development temperature, development time, the nozzle system (solution-supply method) of the development device, post-development rinsing method and so on.

To obtain an excellent pattern by the pattern forming method by using negative development and the pattern forming method by using multiple development with the use of a combination of negative development with positive development, therefore, it is important to appropriately control the parameters concerning materials and the parameters concerning process as described above and combine the same.

In the pattern forming process by using two types of developing solution, i.e., a positive developing solution and a negative developing solution, the exposure may be conducted once as in the above example. Alternatively, the exposure may be conducted multiple times. In the latter case, namely, the first exposure is conducted followed by development by using a positive or negative developing solution and then the second exposure is conducted followed by development by using a developing solution which is different from the one used in the first development.

Figure 7:
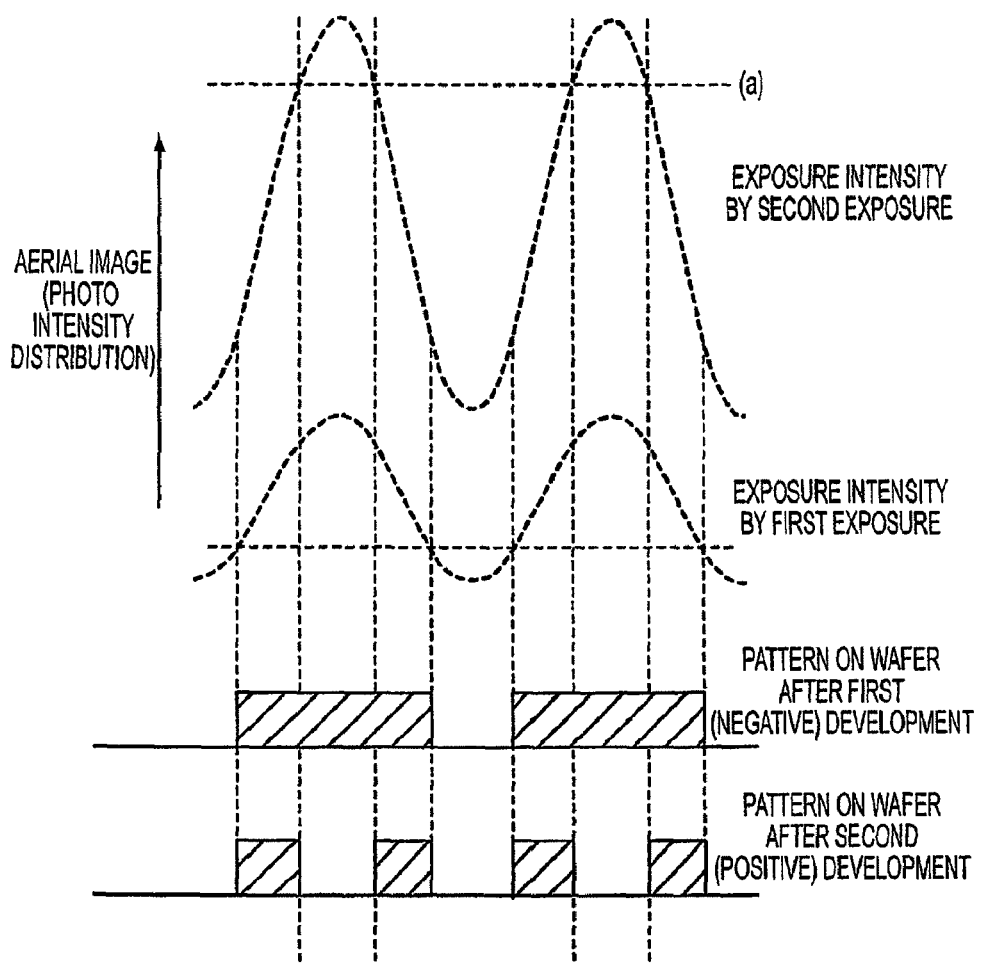
FIG. 7 is a model view which shows the relationship of positive development, negative development and exposure dose in the method according to the invention.

The merit achieved by conducting the exposure twice or more resides in that the thresholds in the development following the first exposure can be controlled and the thresholds in the development following the second exposure can be controlled at a higher degree of freedom. In the case of conducting the exposure twice or more, it is desirable that the exposure dose in the second exposure is higher than the exposure dose in the first exposure. In the second development, as FIG. 7 shows, the thresholds are determined based on the history of the first and second exposure doses. When the exposure dose in the second exposure is sufficiently higher than the exposure dose in the first exposure, the exposure dose in the first exposure exerts only a small effect that can be ignored in some cases.

It is desirable that the exposure dose (Eo1 [mJ/cm$^2$]) in the first exposure step is lower by 5 [mJ/cm$^2$] or more than the exposure dose (Eo2 [mJ/cm$^2$]) in the second exposure step. Thus, the effect of the first exposure history on the pattern forming process by the second exposure can be lessened.

To change the first exposure dose and the second exposure dose, it is effective to employ the method of controlling various parameters concerning materials and process as discussed above. It is particularly effective to control the temperature in the first heating step and the temperature in the second heating step. To make the first exposure dose lower than the second exposure dose, it is effective to conduct the first heating step at a higher temperature than in the second heating step.

In a practical lithography process, the threshold (a) in positive development is as follows.

On a substrate, a film of a resist composition containing a resin, which has a repeating unit represented by the following general formula (NGH-1) and shows an increase in polarity and a decrease in the solubility in a negative developing solution by the action of an acid, is formed. Next, the film is exposed under desired illumination conditions via a photo mask having a desired pattern size. In this step, the exposure is conducted while altering the exposure focus at intervals of 0.05 [μm] and the exposure dose at intervals of 0.5 [mJ/cm$^2$]. After the exposure, the film is heated at a desired temperature for a desired period of time and developed with an alkali developing solution having a desired concentration for a desired period of time. After the development, the pattern line width is measured by using a CD-SEM so that the exposure dose A [mJ/cm$^2$] and focal position at which a desired line width is formed are determined. Subsequently, the film is irradiated at a specific exposure dose A [mJ/cm$^2$] and a specific focal position via the above-described photo mask and the intensity distribution of the optical image is computed. The computation can be made by using a simulation software (Prolith ver.9.2.0.15 manufactured by KLA). Detailed computation method is described in Inside PROLITH (Chris, A. Mack, FINLE Technologies, Inc. Chapter 2 Aerial Image Formation).

Figure 8:
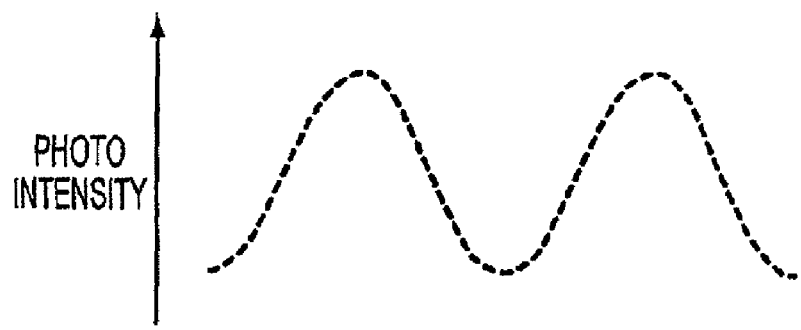
FIG. 8 shows the aerial intensity distribution of an optical image.

FIG. 8 shows the aerial intensity distribution of an optical image as an example of the computed data.

Figure 9:
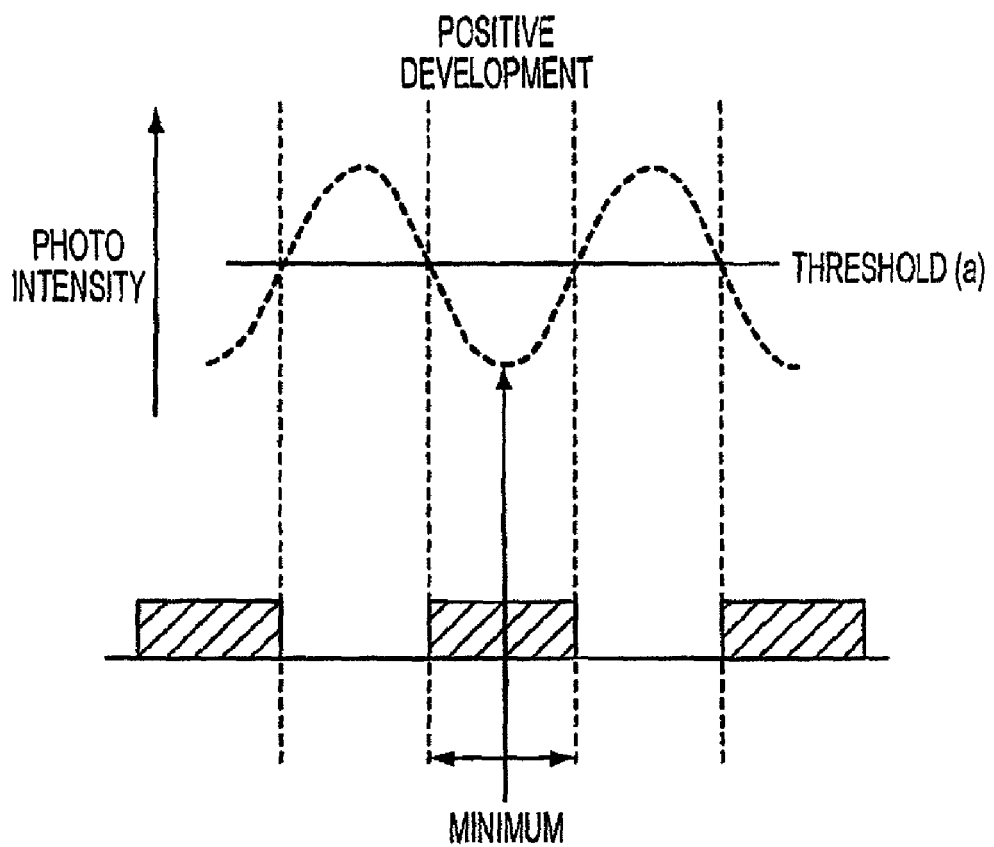
FIG. 9 is a model view which shows the relevancy of positive development, threshold (a) and photo intensity.

As FIG. 9 shows, the photo intensity at the position determined by shifting the aerial position from the minimum of the aerial intensity distribution of the optical image by a half of the obtained pattern line width corresponds to the threshold (a).

In a practical lithography process, the threshold (b) in negative development is as follows.

On a substrate, a film of a resist composition containing a resin, which has a repeating unit represented by the following general formula (NGH-1) and shows an increase in polarity and a decrease in the solubility in a negative developing solution by the action of an acid, is formed. Next, the film is exposed under desired illumination conditions via a photo mask having a desired pattern size. In this step, the exposure is conducted while altering the exposure focus at intervals of 0.05 [μm] and the exposure dose at intervals of 0.5 [mJ/cm$^2$]. After the exposure, the film is heated at a desired temperature for a desired period of time and developed with an alkali developing solution having a desired concentration for a desired period of time. After the development, the pattern line width is measured by using a CD-SEM so that the exposure dose A [mJ/cm$^2$] and focal position at which a desired line width is formed are determined. Subsequently, the film is irradiated at a specific exposure dose A [mJ/cm$^2$] and a specific focal position via the above-described photo mask and the intensity distribution of the optical image is computed. The computation can be made by using a simulation software (manufactured by KLA).

Figure 10:
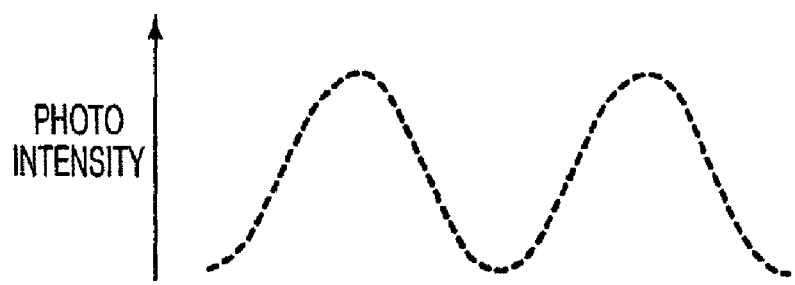
FIG. 10 shows the aerial intensity distribution of an optical image.

FIG. 10 shows the aerial intensity distribution of an optical image as an example of the computed data.

Figure 11:
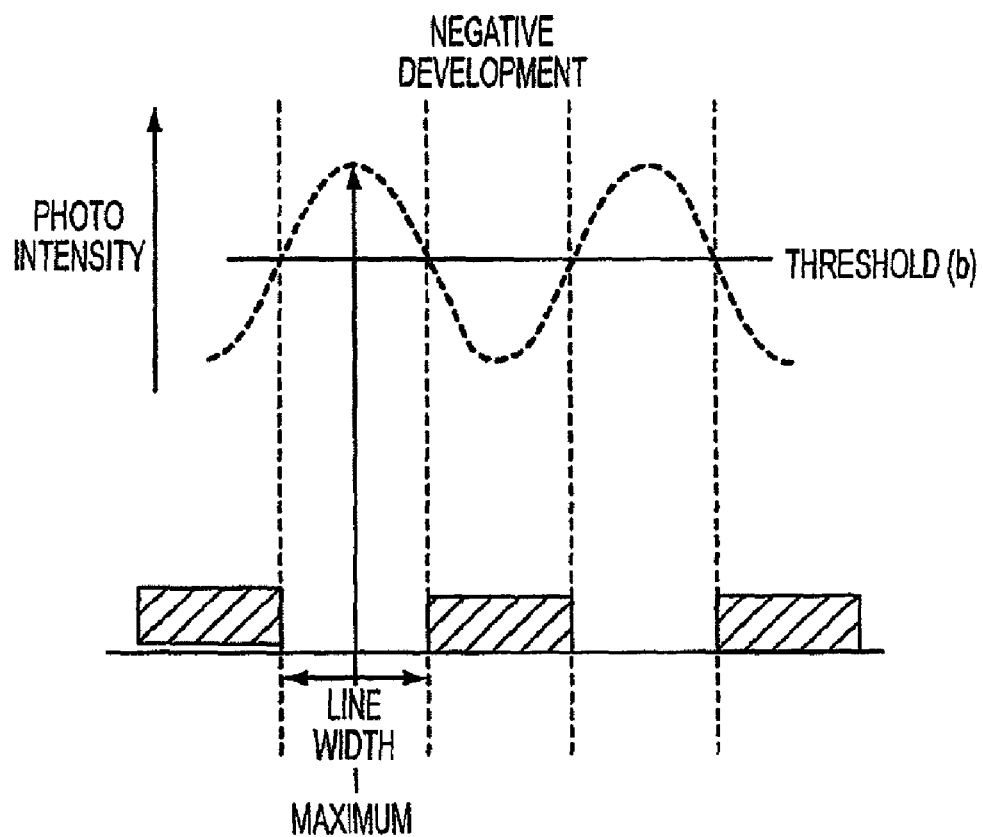
FIG. 11 is a model view which shows the relevancy of positive development, threshold (b) and photo intensity.

As FIG. 11 shows, the photo intensity at the position determined by shifting the aerial position from the maximum of the aerial intensity distribution of the optical image by a half of the obtained pattern line width corresponds to the threshold (b).

The threshold (a) is preferably from 0.1 to 100 [mJ/cm$^2$], more preferably from 0.5 to 50 [mJ/cm$^2$] and more preferably from 1 to 30 [mJ/cm$^2$]. The threshold (b) is preferably from 0.1 to 100 [mJ/cm$^2$], more preferably from 0.5 to 50 [mJ/cm$^2$] and more preferably from 1 to 30 [mJ/cm$^2$]. The difference between the threshold (a) and the threshold (b) is preferably from 0.1 to 80 [mJ/cm$^2$], more preferably from 0.5 to 50 [mJ/cm$^2$] and more preferably from 1 to 30 [mJ/cm$^2$].

In the invention, the film formed on the substrate is a film that is formed by coating a resist composition containing a resin which has a repeating unit represented by the following general formula (NGH-1) and shows an increase in polarity and a decrease in the solubility in a negative developing solution by the action of an acid.

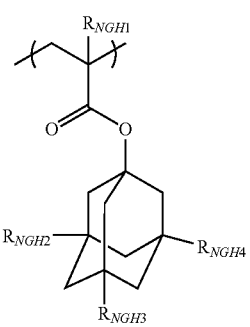

(NGH-1)

In the general formula (NGH-1), $R_{NGH1}$ represents a hydrogen atom or an alkyl group. $R_{NGH2}$ to $R_{NGH4}$ each independently represents a hydrogen atom or a hydroxyl group, provided that at least one of $R_{NGH2}$ to $R_{NGH4}$ represents a hydroxyl group.

Next, resist compositions usable in the invention will be described. (A) Resin having a repeating unit represented by the general formula (NGH-1) and showing an increase in polarity and a decrease in the solubility in a negative developing solution by the action of an acid The resist composition according to the invention contains a resin which has a repeating unit represented by the following general formula (NGH-1) and shows an increase in polarity and a decrease in the solubility in a negative developing solution by the action of an acid (hereinafter also called "resin (A)").

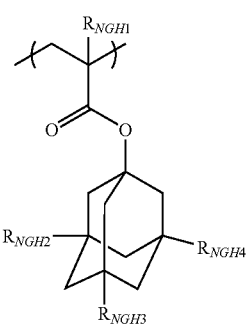

(NGH-1)

In the general formula (NGH-1), $R_{NGH1}$ represents a hydrogen atom or an alkyl group. $R_{NGH2}$ to $R_{NGH4}$ each independently represents a hydrogen atom or a hydroxyl group, provided that at least one of $R_{NGH2}$ to $R_{NGH4}$ represents a hydroxyl group.

The alkyl group represented by $R_{NGH1}$ in the general formula (NGH-1) is preferably an alkyl group having from 1 to 4 carbon atoms which may be substituted by a fluorine atom, a hydroxyl group, etc.

As $R_{NGH1}$, hydrogen atom, a methyl group or an ethyl group is preferable. A methyl group is more preferable as $R_{NGH1}$.

It is preferable that one or two of $R_{NGH2}$ to $R_{NGH4}$ are hydroxyl groups and the remainder is a hydrogen atom.

The content of the repeating unit represented by the general formula (NGH-1) is preferably from 1 to 15% by mol and more preferably from 5 to 15% by mol. By controlling the content thereof to 1 to 15% by mol, the compatibilities of the resist composition with a negative developing solution and a positive developing solution can be improved.

The adhesiveness of the resin (A) to a substrate can be improved owing to the repeating unit represented by the general formula (NGH-1) contained therein.

Next, specific examples of the repeating unit represented by the general formula (NGH-1) will be presented, though the invention is not restricted thereto.

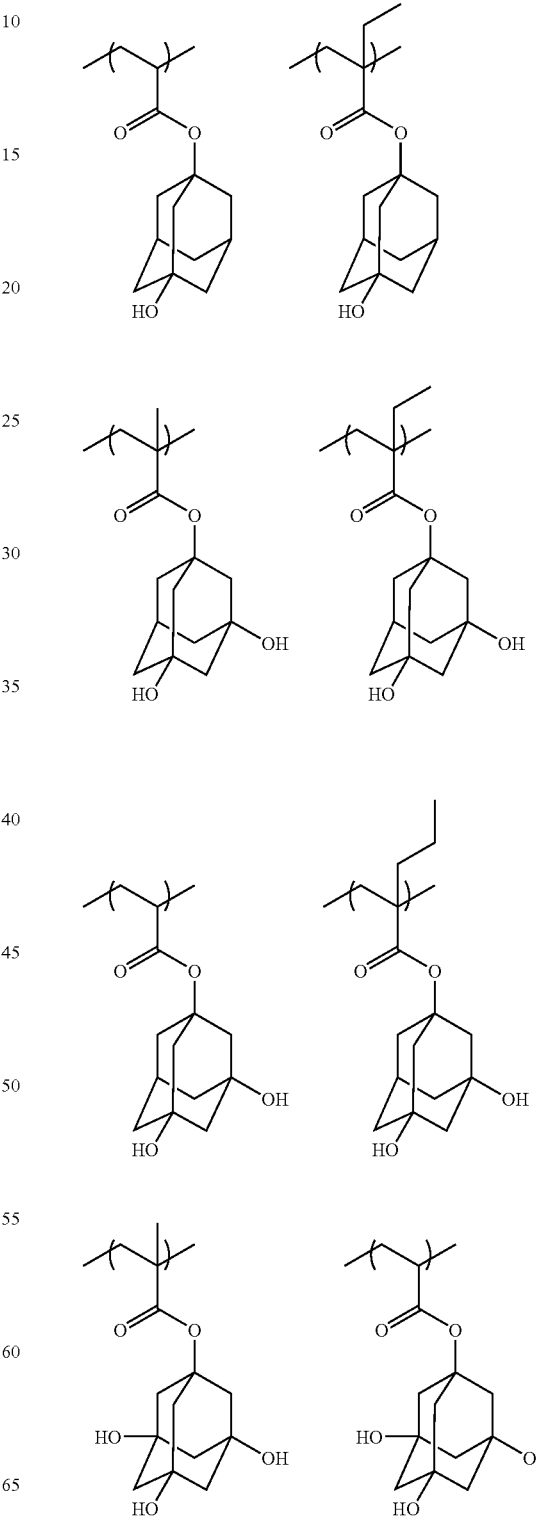

-continued

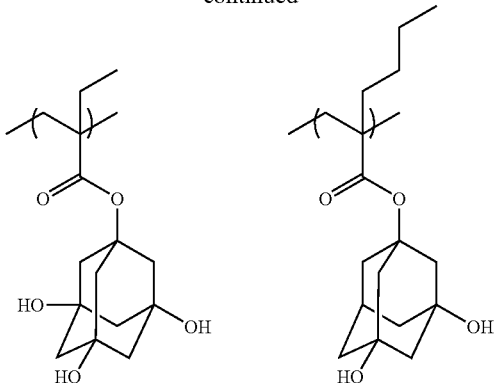

The resin (A) is a resin that shows an increase in polarity by the action of an acid.

It is preferable that the resin (A) is a resin which has a group that can be decomposed by an acid to form an alkali-soluble group (hereinafter sometimes referred to as "acid-decomposable group") in the main chain or a side chain of the resin or both of the main chain and a side chain, thereby showing an increase in polarity.

The resin (A) shows a decrease in the solubility in a negative developing solution by the action of an acid due to the increase in polarity by the action of an acid.

The resin (A) shows an increase in the solubility in a positive developing solution by the action of an acid due to the increase in polarity by the action of an acid.

As the acid-decomposable group, a group wherein a hydrogen atom in an alkali soluble group has been substituted by a group leaving by the action of an acid is preferred.

Examples of the alkali-soluble group include a phenolic hydroxyl group, a carboxylate group, a fluoro alcohol group, a sulfonate group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group and so on.

Preferable examples of the alkali-soluble group include carboxylate group, a fluoro alcohol group (preferably hexafluoroisopropanol) and a sulfonate group.

Examples of the group leaving by the action of an acid include —$C(R_{36})(R_{37})(R_{38})$, —$C(R_{36})(R_{37})(R_{39})$, —$C(R_{01})R_{02})(R_{39})$ and so on.

In these formulae, $R_{36}$ to $R_{39}$ each independently represents an alkyl group, a cycloalkyl group, an aryl group, an aralkyl group or an alkenyl group. $R_{36}$ and $R_{37}$ may be bonded together to form a ring.

$R_{01}$ to $R_{02}$ each independently represents a hydrogen atom, an alkyl group, a cycloalkyl group, an aryl group, an aralkyl group or an alkenyl group.

As the acid-decomposable group, a cumyl ester group, an enol ester group, an acetal ester group, a tertiaryl alkyl ester group, etc. are preferred and a tertiaryl alkyl ester is still preferred.

It is preferable that the resin (A) is a resin which has a monocyclic or polycyclic alicyclic hydrocarbon structure, shows an increase in polarity, a decrease in the solubility in a negative developing solution and an increase in the solubility in a positive developing solution by the action of an acid (hereinafter sometimes called an "alicyclic hydrocarbon-based acid-decomposable resin").

This is because owing to the monocyclic or polycyclic alicyclic hydrocarbon structure, the polarity of the resin largely changes before and after irradiation with an actinic ray or a radiation. As a result, the contrast can be improved when developed by using a negative developing solution (preferably an organic solvent) and a positive developing solution (preferably an alkali developing solution).

Moreover, a resin having a monocyclic or polycyclic alicyclic hydrocarbon structure generally has a high hydrophobic nature. When an area with a low photo irradiation intensity is developed by using a negative developing solution (preferably an organic solvent), therefore, a high development speed and improved development properties with the use of the negative developing solution can be obtained.

The resist composition according to the invention containing an alicyclic hydrocarbon-based acid-decomposable resin is appropriately usable in the case of irradiating with an ArF excimer laser beam.

It is preferable that the alicyclic hydrocarbon-based acid-decomposable resin is a resin which contains at least one repeating units selected from among a repeating unit having a partial structure containing an alicyclic hydrocarbon represented by one of the following general formulae (pI) to (pV) and the repeating units represented by the following general formula (II-AB).

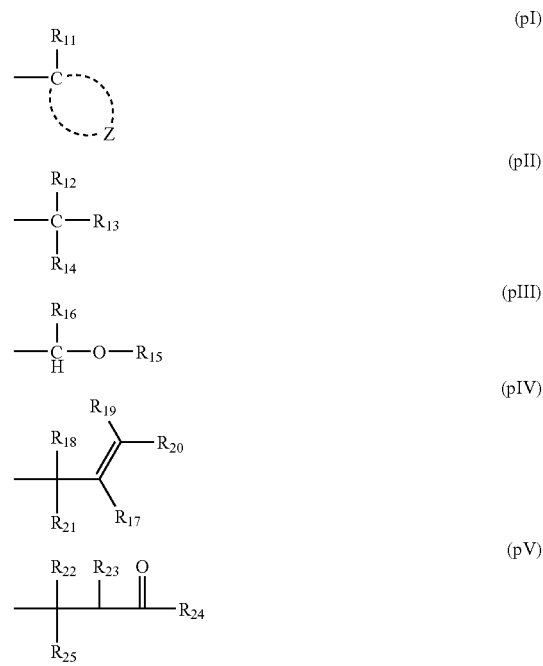

In the general formulae (pI) to (pV), $R_{11}$ represents an alkyl group.

Z represents an atomic group required in forming a cycloalkyl group together with a carbon atom.

$R_{12}$ to $R_{14}$ each independently represents an alkyl group or a cycloalkyl group, provided that at least one of $R_{12}$ to $R_{14}$ is a cycloalkyl group.

$R_{15}$ and $R_{16}$ each independently represents an alkyl group or a cycloalkyl group, provided that at least one of $R_{15}$ and $R_{16}$ is a cycloalkyl group.

$R_{17}$ to $R_{21}$ each independently represents a hydrogen atom or an alkyl group or a cycloalkyl group, provided that at least one of $R_{17}$ to $R_{21}$ is a cycloalkyl group and one of $R_{19}$ and $R_{21}$ is an alkyl group or a cycloalkyl group.

$R_{22}$ to $R_{25}$ each independently represents a hydrogen atom or an alkyl group or a cycloalkyl group, provided that at least one of $R_{22}$ to $R_{25}$ is a cycloalkyl group and $R_{23}$ and $R_{24}$ may be bonded together to form a ring.

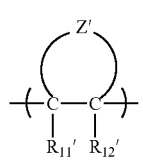

(II-AB)

In the general formula (II-AB), $R_{11}'$ and $R_{12}'$ each independently represents a hydrogen atom, a cyano group, a cyano group, a halogen atom or an alkyl group.

Z' represents an atomic group containing two carbon atoms bonded together (C—C) for forming an alicyclic structure.

It is more preferable that the general formula (II-AB) as described above is the following general formula (II-AB1) or the following general formula (II-AB2),

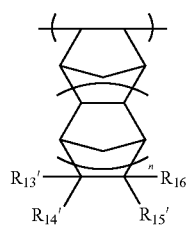

(II-AB1)

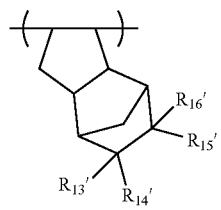

(II-AB2)

In the general formulae (II-AB1) and (II-AB2), $R_{13}'$ to $R_{16}'$ each independently represents a hydrogen atom, a halogen atom, a cyano group, —COOH, —COOR$_5$, a group being decomposed by the action of an acid, —C(=O), —X-A'—$R_{17}'$, an allyl group or a cycloalkyl group, provided that at least two of $R_{13}'$ to $R_{16}'$ may be bonded together to form a ring.

$R_5$ as described above represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

$R_6$ represents an alkyl group or a cycloalkyl group.

n represents 0 or 1.

In the general formulae (pI) to (pV), the alkyl groups represented by $R_{12}$ to $R_{25}$ are preferably linear or branched alkyl groups having from 1 to 4 carbon atoms such as methyl, ethyl, n-propyl, isopropyl, n-butyl, isobutyl and sec-butyl groups.

The cycloalkyl groups $R_{12}$ to $R_{25}$ or the cycloalkyl group formed by Z with a carbon atom may be either monocyclic or polycyclic. Specific examples thereof include groups carrying 5 or more carbon atoms and having a monocyclo, bicyclo, tricyclo or tetracyclo structure. These cycloalkyl groups preferably have from 6 to 30, more preferably from 7 to 25, carbon atoms. These cycloalkyl groups may have a substituent.

Preferable examples of the cycloalkyl groups include adamantyl, noradamantyl, decaline residue, tricyclodecanyl, tetracyclododecanyl, norbornyl, cedrol, cyclopentyl, cyclohexyl, cycloheptyl, cyclooctyl, cyclodecanyl and cyclododecanyl groups. More preferable examples thereof include adamantyl, norbornyl, cyclohexyl, cyclopentyl, tetracyclododecanyl and tricyclodecanyl groups.

These alkyl and cycloalkyl groups may further have a substituent. Examples of the substituent for the alkyl and cycloalkyl groups include an alkyl group (having from 1 to 4 carbon atoms), a halogen atom, a hydroxyl group, an alkoxy group (having from 1 to 4 carbon atoms), a carboxyl group and an alkoxycarbonyl group (having from 2 to 6 carbon atoms). Examples of the substituent that may be attached to the alkyl, alkoxy and alkoxycarbonyl groups as described above include a hydroxyl group, a halogen atom and an alkoxy group.

The structures represented by the general formulae (pI) to (pV) are usable in protecting the alkali-soluble group. Examples of the alkali-soluble group include various groups having been publicly known in the technical field.

More specifically speaking, there can be enumerated structures wherein a hydrogen atom in a carboxylate group, a sulfonate group, a phenol group or a thiol group is substituted by a structure represented by one of the general formulae (pI) to (pV). Preferable examples thereof include structures wherein a hydrogen atom in a carboxylate group or a sulfonate group is substituted by a structure represented by one of the general formulae (pI) to (pV).

As the repeating unit having an alkali-soluble group protected by the structure represented by one of the general formulae (pI) to (pV), a repeating unit represented by the following general formula (pA) is preferred.

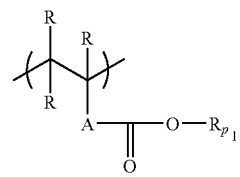

(pA)

In the general formula (pA), R represents a hydrogen atom, a halogen atom or an alkyl group (preferably having from 1 to 4 carbon atoms). Multiple R's may be either the same or different from each other.

A represents a single bond or one or more groups selected from a group consisting of alkylene, ether, thioether, carbonyl, ester, amide, sulfonamide, urethane and ureylene groups and a combination thereof. It is preferable that A is a single bond.

$R_{p1}$ represents one of the groups represented by the above general formulae (pI) to (pV).

It is particularly preferable that the repeating unit represented by the general formula (pA) is a repeating unit including 2-alkyl-2-adamantyl(meth)acrylate or dialkyl(1-adamantyl)methyl(meth)acrylate.

Next, specific examples of the repeating unit having an acid-decomposable group will be given, though the invention is not restricted thereto.
In the following formulae, $R_x$ represents H, $CH_3$ or $CH_2OH$; and $R_{xa}$ and $R_{xb}$ each represents an alkyl group having from 1 to 4 carbon atoms.
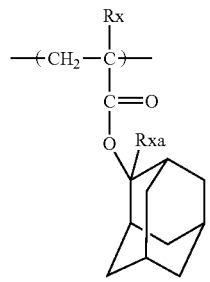
1
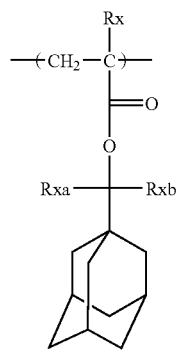
2
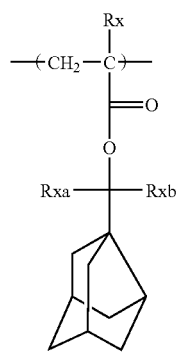
3
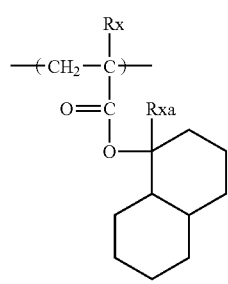
4
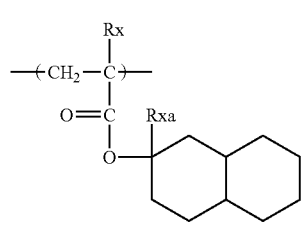
5
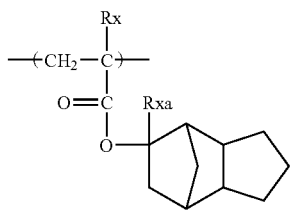
6
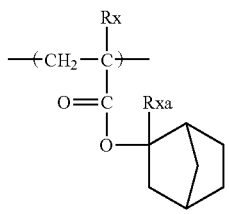
7
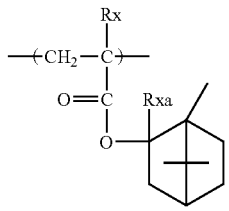
8
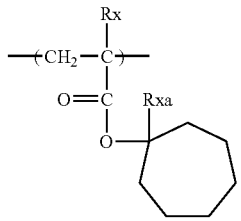
9
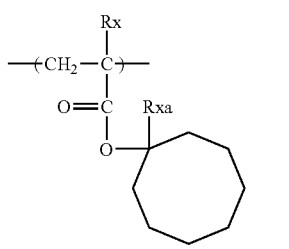
10
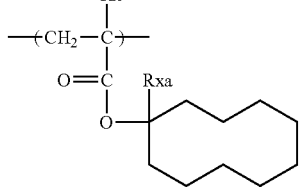
11
12

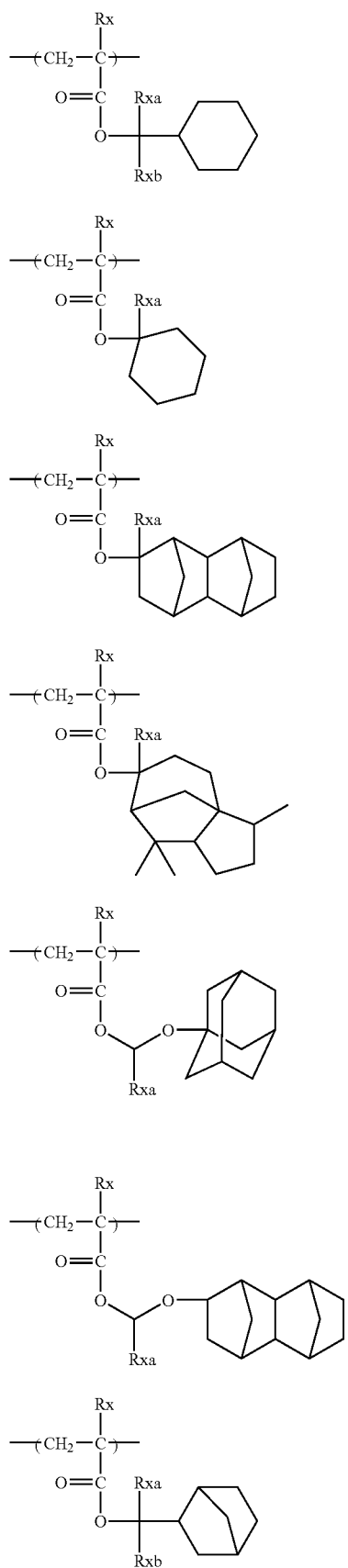
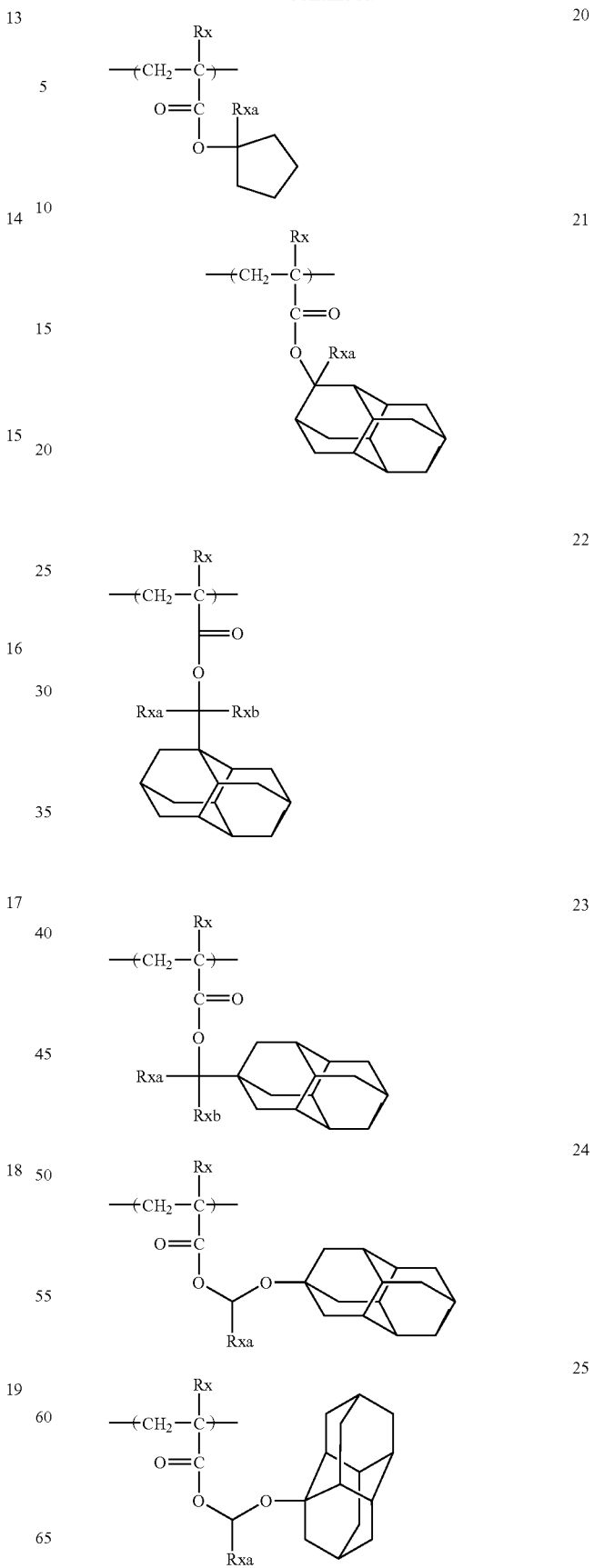

-continued

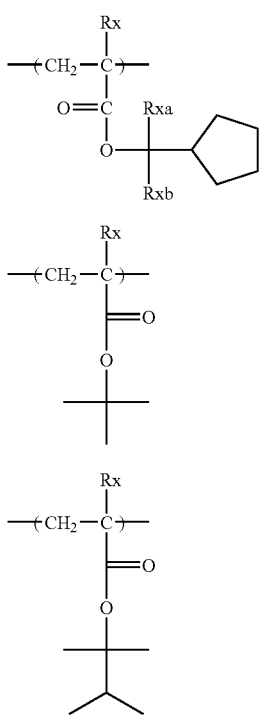

Examples of the halogen atoms represented by $R_{11}'$ and $R_{12}'$ in the general formula (II-AB) include a chlorine atom, a bromine atom, a fluorine atom, an iodine atom and so on.

Examples of the alkyl groups represented by $R_{11}'$ and $R_{12}'$ include linear or branched alkyl groups having from 1 to 10 carbon atoms.

The atomic group for forming the alicyclic structure Z' is an atomic group forming a repeating unit of an alicyclic hydrocarbon, which may have a substituent, in the resin. In particular, an atomic group for forming a crosslinked alicyclic structure forming a crosslinked alicyclic hydrocarbon repeating unit is preferred.

Examples of the skeleton of the alicyclic hydrocarbon thus formed include the same ones as the alicyclic hydrocarbon groups represented by $R_{12}$ to $R_{25}$ in the general formulae (pI) to (pV).

The skeleton of the alicyclic hydrocarbon may have a substituent. Examples of the substituent include $R_{13}'$ to $R_{16}'$ in the above general formula (II-AB1) or (II-AB2).

In the alicyclic hydrocarbon-based acid-decomposable resin according to the invention, the acid-decomposable group can have at least one repeating unit selected from among a repeating unit having a partial structure containing an alicyclic hydrocarbon represented by one of the above general formulae (pI) to (pV), a repeating unit represented by the general formula (II-AB) and a repeating unit of a copolymerizable component as will be discussed hereinafter. It is preferable that the acid-decomposable group is contained in a repeating unit having a partial structure containing an alicyclic hydrocarbon represented by one of the above general formulae (pI) to (pV).

Each of the substituents of $R_{13}'$ to $R_{16}'$ in the above general formula (II-AB1) or (II-AB2) may serve as a substituent of the atomic group Z' for forming an alicyclic structure or a crosslinked alicyclic structure in the above general formula (II-AB).

Next, specific examples of the repeating unit represented by the above general formula (II-AB1) or (II-AB2) will be presented, though the invention is not restricted to these specific examples.

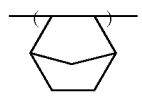
[II-1]

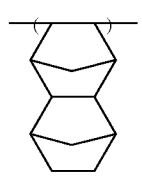
[II-2]

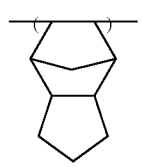
[II-3]

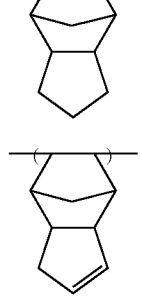
[II-4]

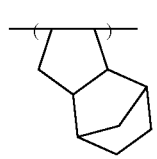
[II-5]

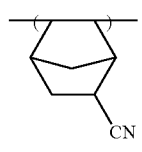
[II-6]

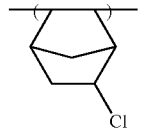
[II-7]

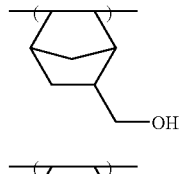
[II-8]

[II-9]

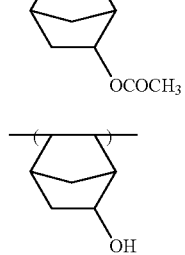
[II-10]

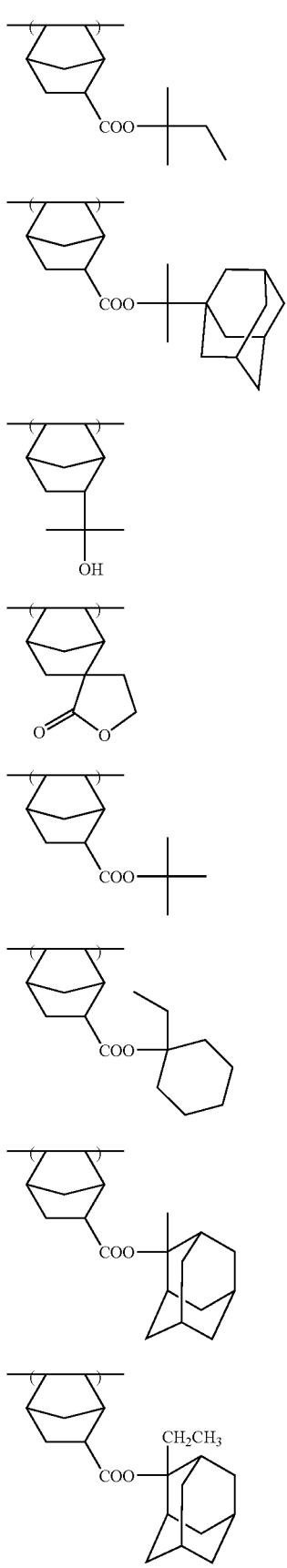
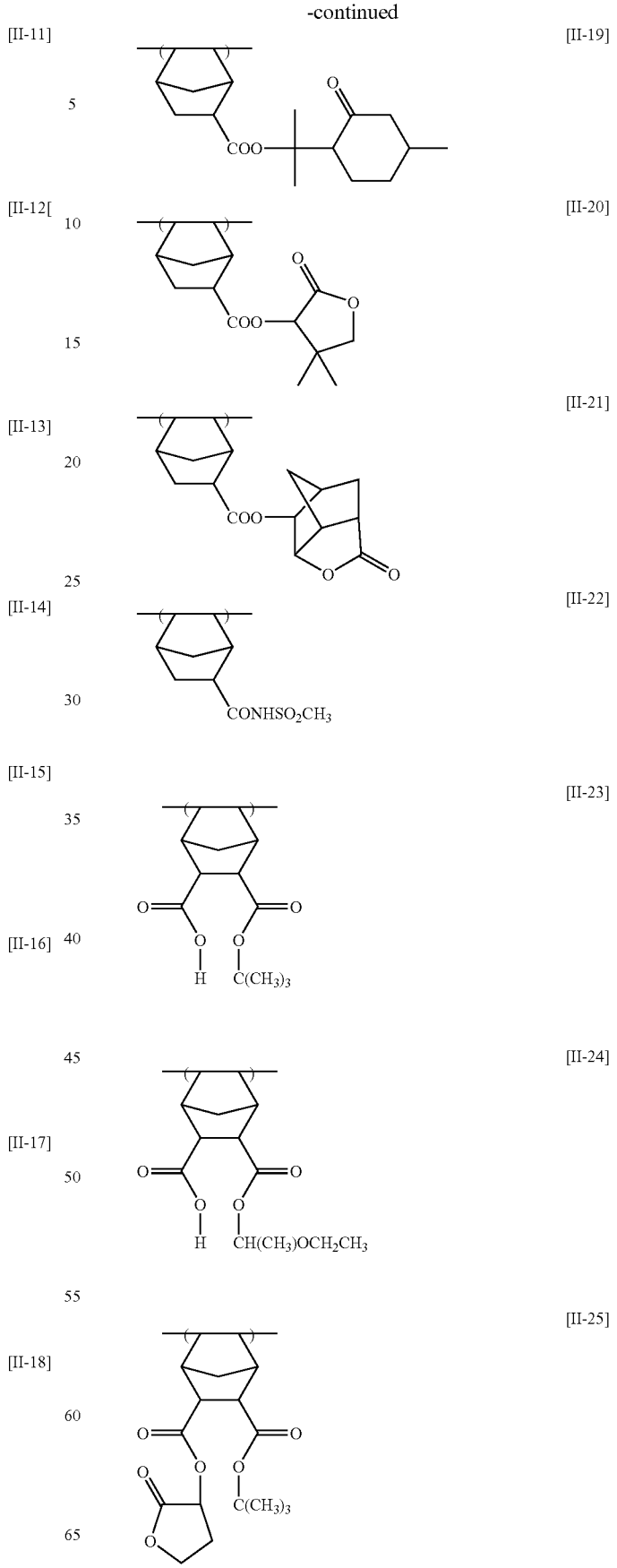

[II-26]
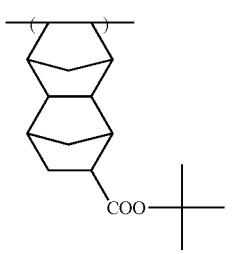

[II-27]
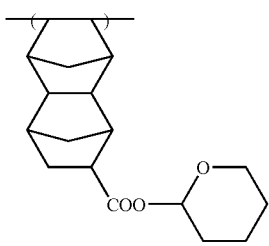

[II-28]
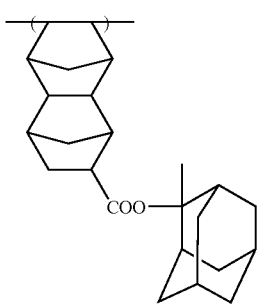

[II-29]
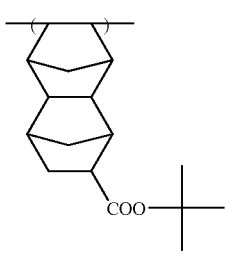

[II-30]
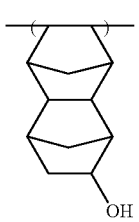

[II-31]
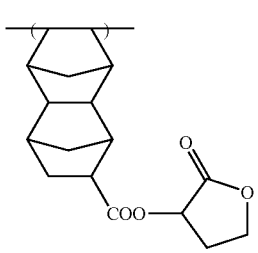

[II-32]
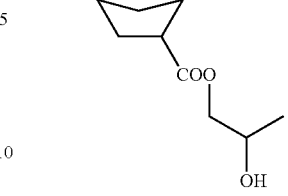

It is preferred that the alicyclic hydrocarbon-based acid-decomposable resin according to the invention has a repeating unit having a lactone group. As the lactone group, any group may be used so long as it has a lactone structure. A group having a 5- to 7-membered lactone ring structure is preferred and a group in which another cyclic structure is fused with the 5- to 7-membered lactone ring structure to form a bicyclo structure or a spiro structure is still preferred. It is more preferred that the alicyclic hydrocarbon-based acid-decomposable resin according to the invention has a repeating unit having a lactone structure represented by any one of the following general formulae (LC1-1) to (LC1-16). The group having a lactone structure may be attached directly to the main chain. Preferable lactone structures include those represented by (LC1-1), (LC1-4), (LC1-5), (LC1-6), (LC1-13) and (LC1-14). By using a specific lactone structure, line edge roughness and under development can be improved.

LCI-1
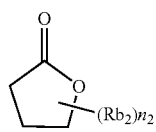

LCI-2
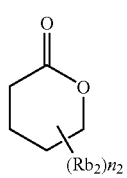

LCI-3
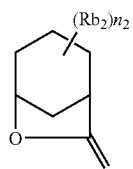

LCI-4
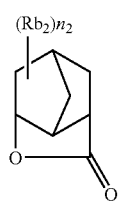

LCI-5

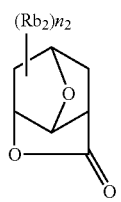

LCI-6

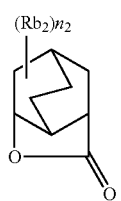

LCI-7

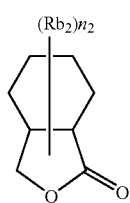

LCI-8

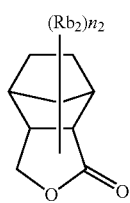

LCI-9

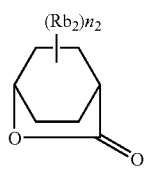

LCI-10

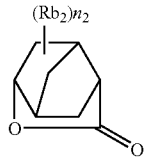

LCI-11

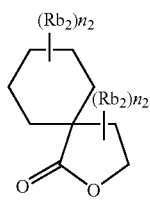

LCI-12

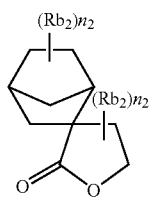

LCI-13

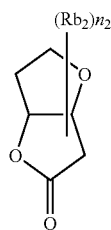

LCI-14

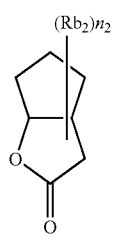

LCI-15

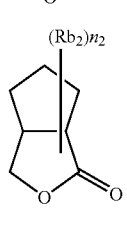

LCI-16

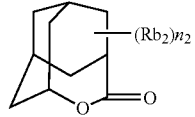

The lactone ring structure may or may not have a substituent ($Rb_2$). Preferable examples of the substituent $Rb_2$ include an alkyl group (preferably having from 1 to 8 carbon atoms), a cycloalkyl group (preferably having from 4 to 7 carbon atoms), an alkoxy group (preferably having from 1 to 8 carbon atoms), an alkoxycarbonyl group (preferably having from 2 to 8 carbon atoms), a carboxyl group, a halogen atom, a hydroxyl group, a cyano group, an acid-decomposable group and so on. $n_2$ represents an integer of from 0 to 4. In the case where $n_2$ is an integer of 2 or more, multiple $Rb_2$'s may be either the same or different. Also, multiple $Rb_2$'s may be bonded together to form a ring.

Examples of the repeating unit having a lactone structure represented by any one of the general formulae (LC1-1) to (LC1-16) include a repeating unit wherein at least one of $R_{13}'$ to $R_{16}'$ in the above general formula (II-AB1) or (II-AB2) has a group represented by one of the general formulae (LC1-1) to (LC1-16) (for example, one wherein $R_5$ in —$COOR_5$ is a group represented by one of the general formulae (LC1-1) to (LC1-16)), a repeating unit represented by the following general formula (AI) and so on.

(AI)

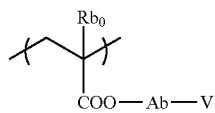

In the general formula (AI), $Rb_0$ represents a hydrogen atom, a halogen atom or an alkyl group (preferably having from 1 to 4 carbon atoms).

As examples of a substituent which the alkyl group $Rb_0$ may have, a hydroxyl group and a halogen atom can be enumerated.

Examples of the halogen atom $Rb_0$ include a fluorine atom, a chlorine atom, a bromine atom and an iodine atom.

$Rb_0$ is preferably a hydrogen atom, a methyl group, a hydroxymethyl group or a trifluoromethyl group, and more preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group or a divalent group including a combination thereof. A single bond or a linking group represented by $-Ab_1-CO_2-$ is preferred. $Ab_1$ represents a linear or branched alkylene group or a monocyclic or polycyclic cycloalkylene group and preferable examples thereof include a methylene group, an ethylene group, a cyclohexylene group, an adamantyl group and a norbornyl group.

V represents a group having a lactone structure represented by any one of the general formulae (LC1-1) to (LC1-16).

A repeating unit having a lactone structure usually occurs as optical isomers and use can be made of either optical isomer. Moreover, use can be made of either a single optical isomer alone or a mixture of optical isomers. In the case of using a single optical isomer alone, the optical purity (ee) thereof is preferably 90 or higher, more preferably 95 or higher.

Next, specific examples of the repeating unit having a lactone structure will be presented, though the invention is not restricted thereto.

In the following formulae, $R_x$ represents H, $CH_3$, $CH_2OH$ or $CF_3$.

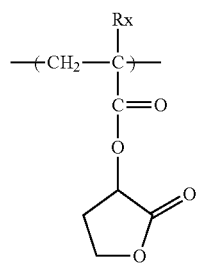
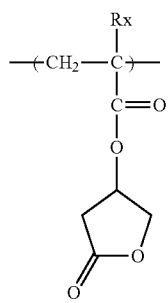
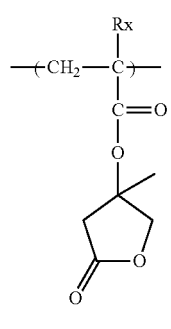
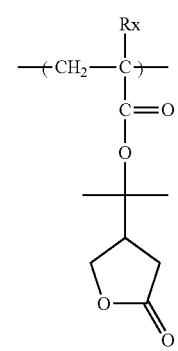

-continued

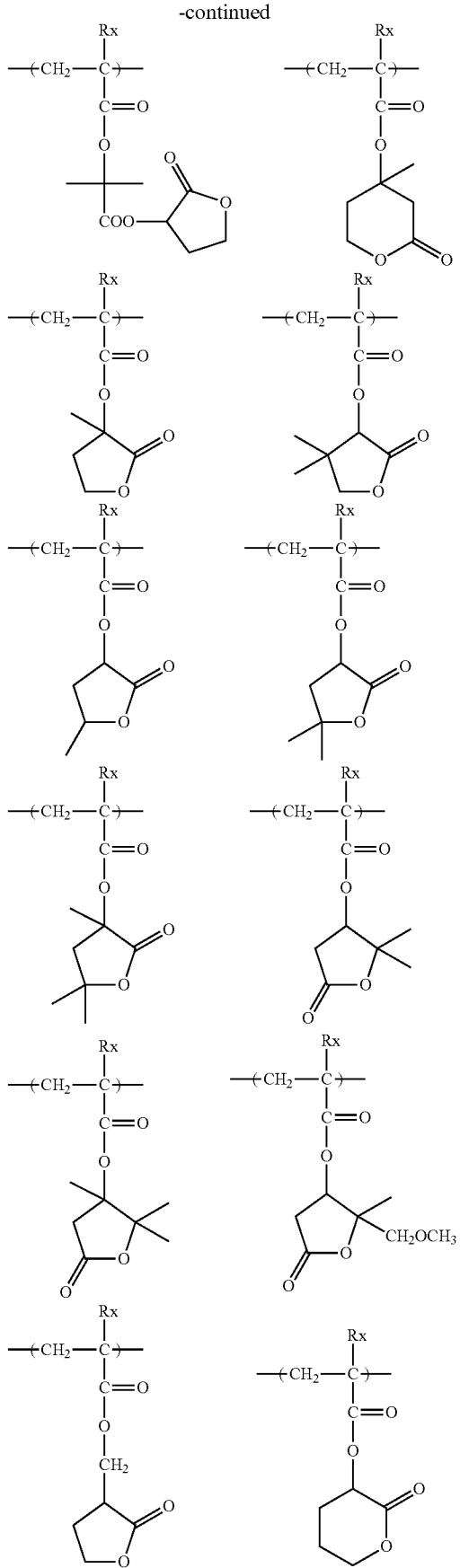

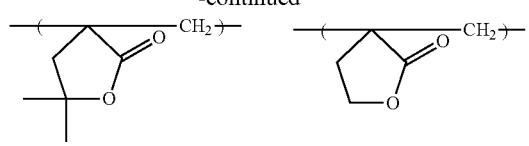
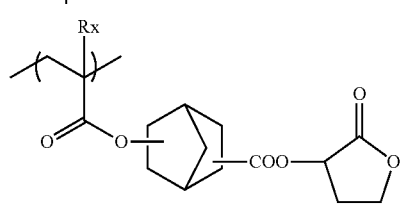
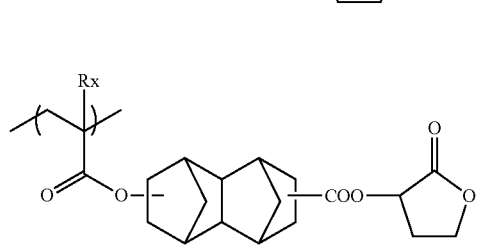
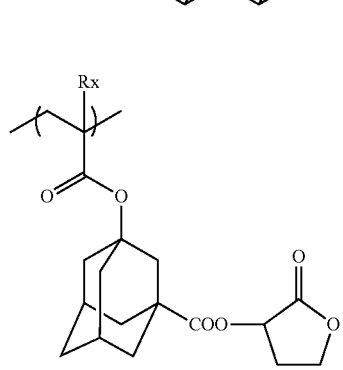
In the following formulae, $R_x$ represents H, $CH_3$, $CH_2OH$ or $CF_3$.
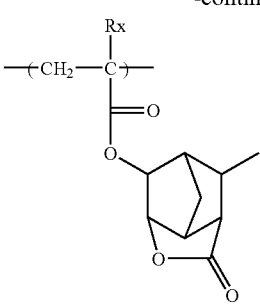 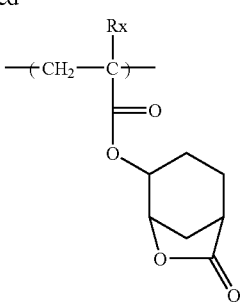
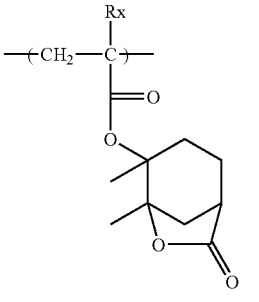 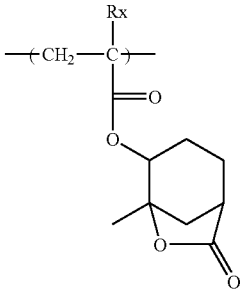
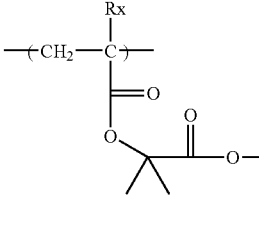 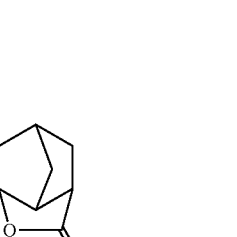
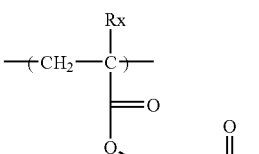 
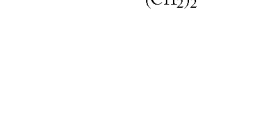 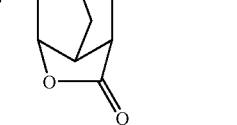
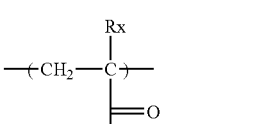 
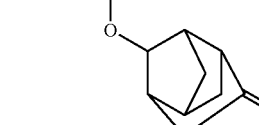 
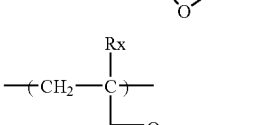 
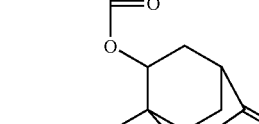 
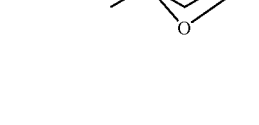 
 

-continued
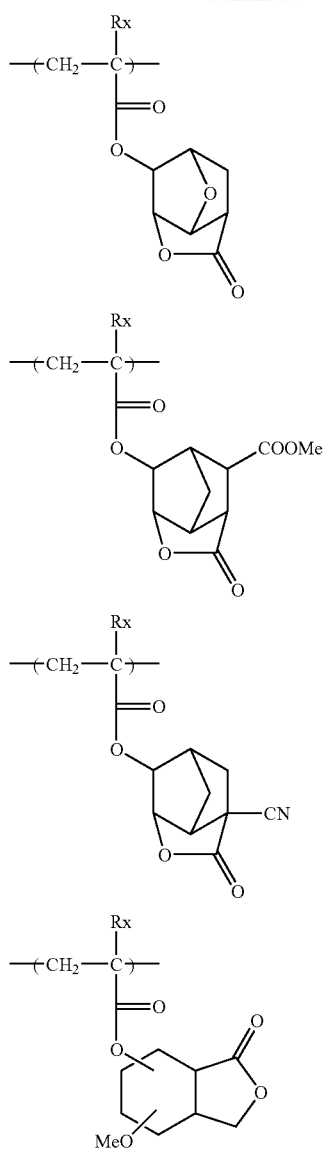
-continued
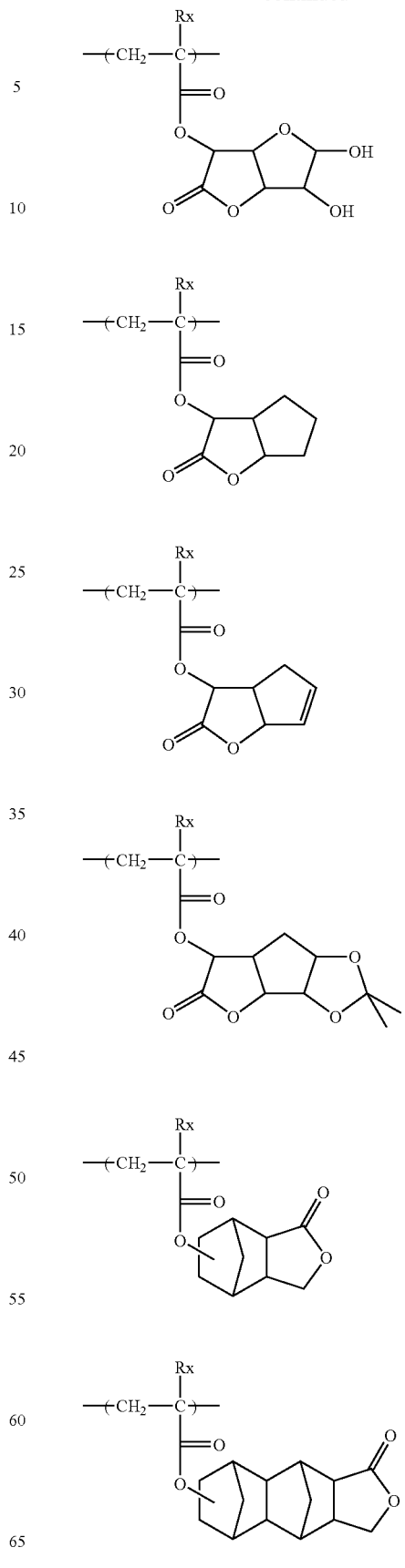

In the following formulae, $R_x$ represents H, $CH_3$, $CH_2OH$ or $CF_3$.

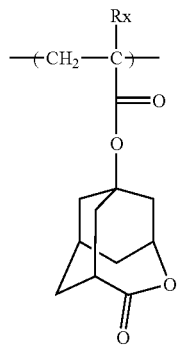
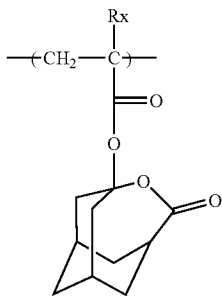
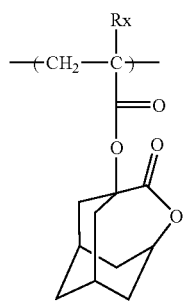
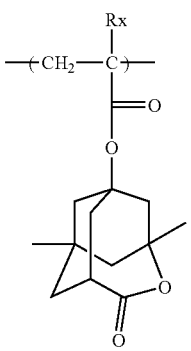
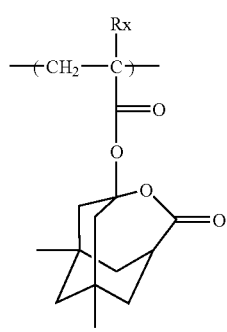
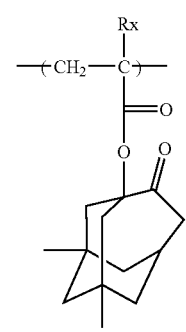
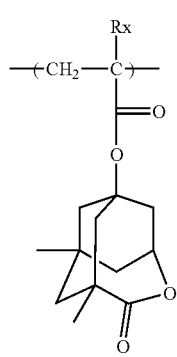
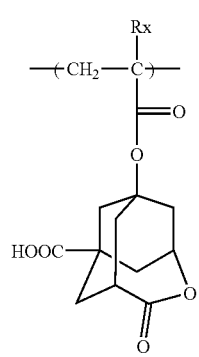

-continued

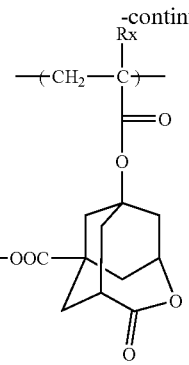
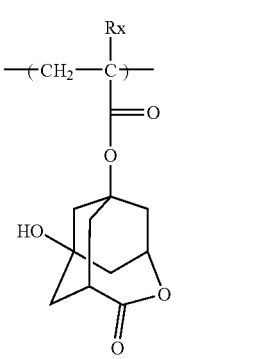
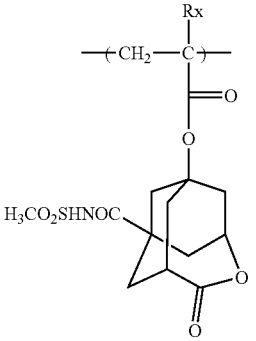

In addition to the hydroxyl group-containing alicyclic hydrocarbon group in the repeating unit represented by the general formula (NGH-1) as described above, it is preferable that the alicyclic hydrocarbon-based acid-decomposable resin according to the invention has a repeating unit having an organic group having a polar group, in particular, a repeating unit having an alicyclic hydrocarbon structure substituted by a polar group. Thus, the adhesiveness to a substrate can be further improved. Preferable examples of the alicyclic hydrocarbon structure of the alicyclic hydrocarbon structure substituted by a polar group include an adamantyl group, a diamantyl group and a norbornyl group. Preferable examples of the polar group include a carboxyl group and a cyano group.

Preferable examples of the alicyclic hydrocarbon structure substituted by a polar group include partial structured represented by the following general formulae (VIIa) to (VIId).

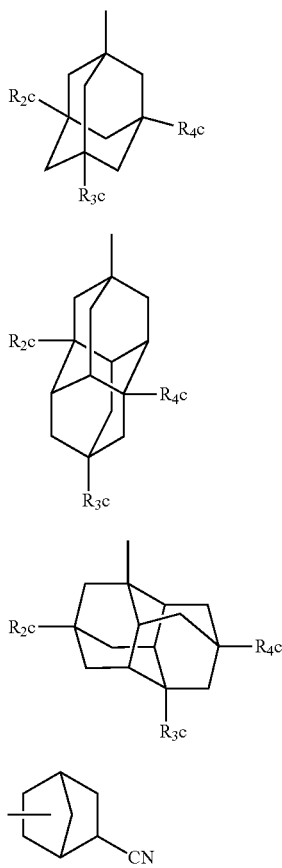

(VIIa)

(VIIb)

(VIIc)

(VIId)

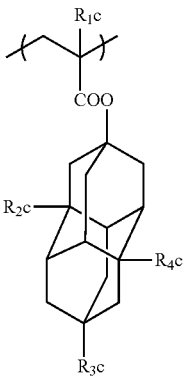

(AIIb)

(AIIc)

(AIId)

In the general formulae (VIIa) to (VIIa), $R_{2c}$ to $R_{4c}$ each independently represents a hydrogen atom, a carboxyl group or a cyano group, provided that at least one of $R_{2c}$ to $R_{4c}$ represents a carboxyl group or a cyano group. It is preferable that one or two of $R_{2c}$ to $R_{4c}$ are hydroxyl group(s) and the remainders are hydrogen atoms.

It is more preferable that in the general formula (VIIa), two of $R_{2c}$ to $R_{4c}$ are cyano groups and the remainders are hydrogen atoms.

Examples of the repeating unit having a group represented by any of the general formulae (VIIa) to (VIId) include those wherein at least one of $R_{13}'$ to $R_{16}'$ in the above general formula (II-AB1) or (II-AB2) has a group represented by any one of the general formulae (VIIa) to (VIId) (for example, a group —COOR$_5$ wherein R$_5$ is a group represented by any of the general formulae (VIIa) to (VIId)), or repeating units represented by the following general formulae (AII-a) to (AII-d).

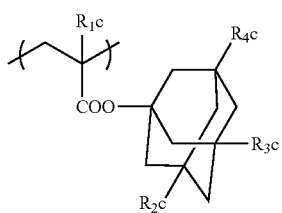

(AIIa)

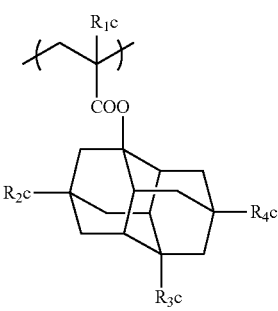

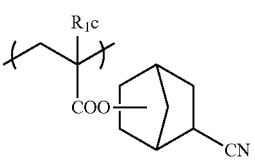

In the general formulae (AII-a) to (AII-d), $R_{1c}$ represents a hydrogen atom, a methyl group, a trifluoromethyl group or a hydroxymethyl group. $R_{2c}$ to $R_{4c}$ have the same meanings as $R_{2c}$ to $R_{4c}$ in the general formulae (VIIa) to (VIId).

Next, specific examples of the repeating unit having a structure represented by any of the general formulae (AII-a) to (AII-d) will be given, though the invention is not restricted thereto.

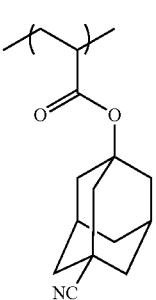 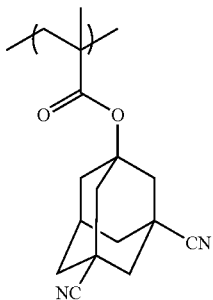

-continued

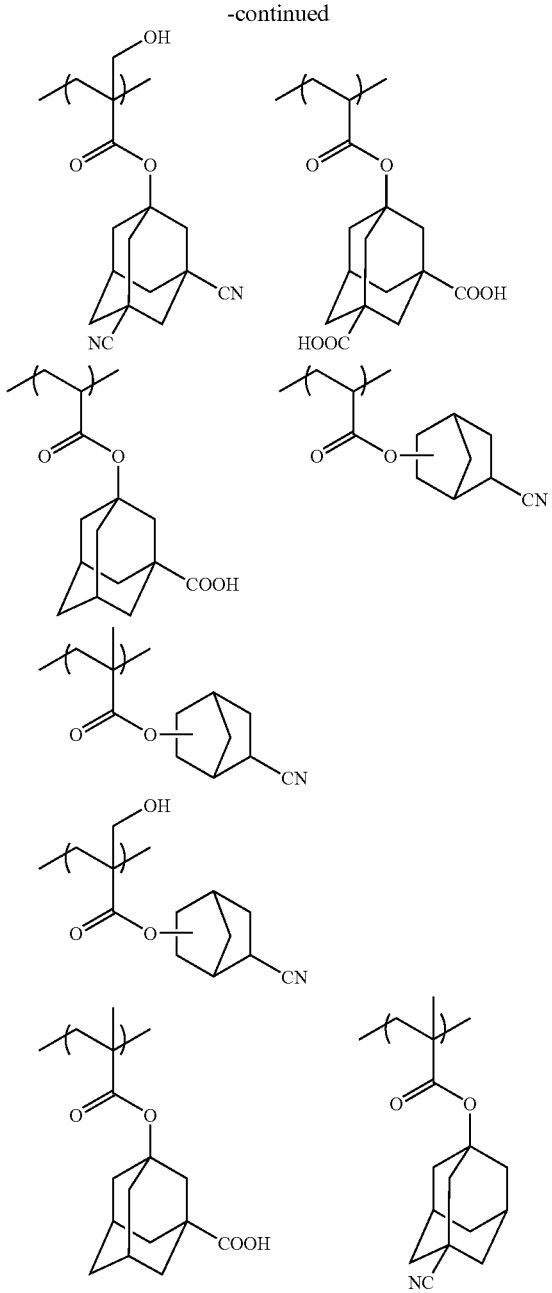

The alicyclic hydrocarbon-based acid-decomposable resin according to the invention may have a repeating unit represented by the following general formula (VIII).

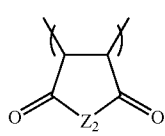
(VIII)

In the general formula (VIII), $Z_2$ represents —O— or —N($R_{41}$)— wherein $R_{41}$ represents a hydrogen atom, a hydroxyl group, an alkyl group or —OSO$_2$—$R_{42}$ wherein $R_{42}$ represents an alkyl group, a cycloalkyl group or a camphor residue. The alkyl groups $R_{41}$ and $R_{42}$ may be further substituted by a halogen atom (preferably a fluorine atom) or the like.

Next, specific examples of the repeating unit represented by the general formula (VIII) will be presented, though the invention is not restricted thereto.

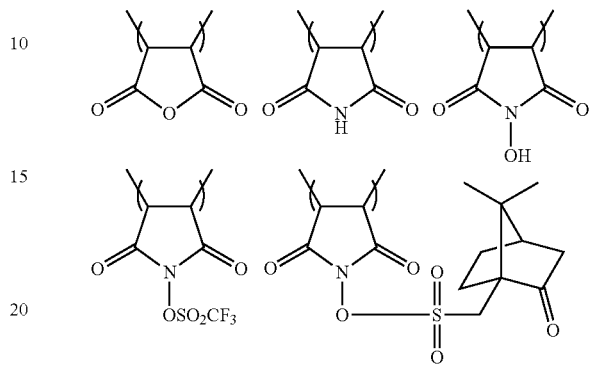

It is preferable that the alicyclic hydrocarbon-based acid-decomposable resin according to the invention has a repeating unit having an alkali-soluble group, more preferably a repeating unit having a carboxyl group. Owing to the presence of such a repeating unit, the resolution can be improved when used in a contact hole. Preferable examples of the repeating unit having a carboxyl group include any one of a repeating unit wherein a carboxyl group is directly attached to the main chain of a resin such as a repeating unit of acrylic acid or methacrylic acid, a repeating unit wherein a carboxyl group is attached to the main chain of a resin via a linking group and a repeating unit carrying, at the terminus of a polymer chain, an alkali-soluble group having been introduced in the course of polymerization by using a polymerization initiator or a chain transfer agent having the alkali-soluble group. The linking group may have a monocyclic or polycyclic hydrocarbon structure. A repeating unit including acrylic acid or methacrylic acid is particularly preferred.

The alicyclic hydrocarbon-based acid-decomposable resin according to the invention may have a repeating unit having from 1 to 3 groups represented by the following general formula (F1). Thus, the line edge roughness performance can be improved.

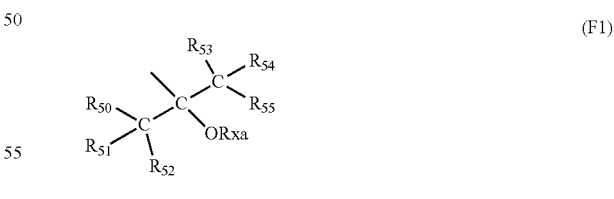
(F1)

In the general formula (F1), $R_{50}$ to $R_{55}$ each independently represents a hydrogen atom, a fluorine atom or an alkyl group, provided that at least one of $R_{50}$ to $R_{55}$ represents a fluorine atom or an alkyl group in which at least one hydrogen atom is substituted by a fluorine atom.

$R_{xa}$ represents a hydrogen atom or an organic group (preferably an acid-decomposable protecting group, an alkyl group, a cycloalkyl group, an acyl group, an alkoxycarbonyl group, an alkoxycarbonylmethyl group, an alkoxymethyl group or a 1-alkoxyethyl group).

The alkyl groups $R_{50}$ to $R_{55}$ may be substituted by a halogen atom such as a fluorine atom, a cyano group and so on. Preferable examples thereof include an alkyl group having from 1 to 3 carbon atoms such as a methyl group and a trifluoromethyl group.

It is preferable that all of $R_{50}$ to $R_{55}$ are fluorine atoms.

Preferable examples of the organic group represented by $R_{xa}$ include an acid-decomposable protecting group, an optionally substituted alkyl group, a cycloalkyl group, an acyl group, an alkylcarbonyl group, an alkoxycarbonylmethyl group, an alkoxymethyl group and a 1-alkoxyethyl group.

As a preferable example of the repeating unit having a group represented by the general formula (F1), a repeating unit represented by the following general formula (F2) can be cited.

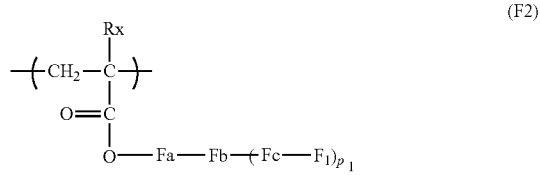

(F2)

In the general formula (F2), $R_x$ represents a hydrogen atom, a halogen atom or an alkyl group (preferably having from 1 to 4 carbon atoms). As preferable examples of a substituent which may be carried by the alkyl group $R_x$, a hydroxyl group and a halogen atom can be cited.

$F_a$ represents a single bond or a linear or branched alkylene group and a single bond is preferred.

$F_b$ represents a monocyclic or polycyclic hydrocarbon group.

$F_c$ represents a single bond or a linear or branched alkylene group and a single bond or a methylene group is preferred.

$F_1$ represents a group represented by the general formula (F1).

$p_1$ represents from 1 to 3.

As the cyclic hydrocarbon group in $F_b$, a cyclopentylene group, a cyclohexylene group or a norbornylene group is preferred.

Next, specific examples of the repeating unit having the structure represented by the general formula (F1) will be presented, though the invention is not restricted thereto.

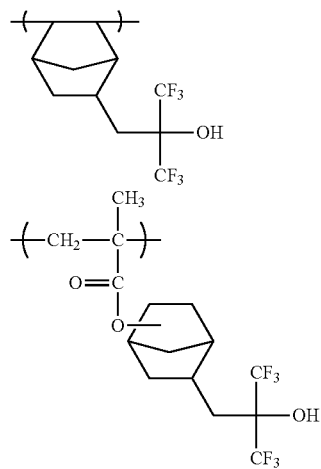

-continued

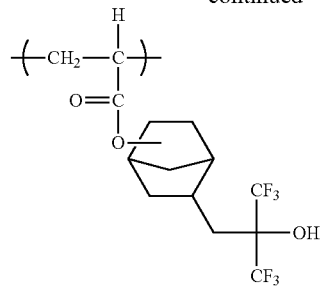

The alicyclic hydrocarbon-based acid-decomposable resin according to the invention may further have a repeating unit which has an alicyclic hydrocarbon structure but shows no acid-decomposability. Thus, the elution of low-molecular components from a resist film into an immersion liquid can be prevented during immersion exposure. Examples of such a repeating unit include repeating units including 1-adamantyl (meth)acrylate, tricyclodecanyl(meth)acrylate, cyclohexyl (meth)acrylate and so on.

Examples of the repeating units having alicyclic hydrocarbon structures and not showing acid decomposability include repeating units containing neither a hydroxy group nor a cyano group, and are preferably repeating units represented by the following formula (IX),

(IX)

In the formula (IX), $R_5$ represents a hydrocarbon group having at least one cyclic structure and containing neither a hydroxyl group nor a cyano group.

Ra represents a hydrogen atom, an alkyl group or —$CH_2$—O—$Ra_2$. Herein, $Ra_2$ represents a hydrogen atom, an alkyl group or an acyl group. Ra is preferably a hydrogen atom, a methyl group, a hydroxymethyl group or a trifluoromethyl group, and more preferably a hydrogen atom or a methyl group.

The cyclic structure contained in $R_5$ may be a monocyclic hydrocarbon group or a polycyclic hydrocarbon group. Examples of the monocyclic hydrocarbon group include 3-12C cycloalkyl groups such as a cyclopentyl group, a cyclohexyl group, a cycloheptyl group and a cyclooctyl group, and 3-12C cycloalkenyl groups such as a cyclohexenyl group. Of these monocyclic hydrocarbon groups, 3-7C monocyclic hydrocarbon groups, especially a cyclopentyl group and a cyclohexyl group, are preferred over the others.

The polycyclic hydrocarbon group may be an assembled-ring hydrocarbon group or a bridged-ring hydrocarbon group. Examples of the assembled-ring hydrocarbon group include a bicyclohexyl group and a perhydronaphthalenyl group. Examples of the bridged hydrocarbon ring include bicyclic hydrocarbon rings such as a pinane ring, a bornane ring, a norpinane ring, a norbornane ring and bicyclooctane rings (e.g., a bicyclo[2.2.2]octane ring, a bicyclo[3.2.1]octane ring), tricyclic hydrocarbon rings such as a homobredane ring, an adamantane ring, a tricyclo[5.2.1.0$^{2,6}$]decane ring and a tricyclo[4.3.1.1$^{2,5}$]undecane ring, and tetracyclic hydrocarbon rings such as a tetracyclo[4.4.0.1$^{2,5}$1$^{7,10}$]dodecane ring and a perhydro-1,4-methano-5,8-methanonaphthalene ring. And additional examples of the bridged hydrocarbon ring include condensed hydrocarbon rings formed by fusing together two or more of 5- to 8-membered cycloalkane rings such as perhydronaphthalene (decaline), perhydroanthracene, perhydrophenanthrene, perhydroacenaphthene, perhydrofluorene, perhydroindene and perhydrophenalene rings.

Examples of a bridged-ring hydrocarbon group suitable as the cyclic structure of $R_5$ include a norbornyl group, an adamantyl group, a bicyclooctanyl group and a tricyclo [5.2.1.0$^{2.6}$]decanyl group. Of these groups, a norbornyl group and an adamantyl group are preferred over the others.

Each of the alicyclic hydrocarbon groups recited above may have a substituent. Examples of a substituent suitable for those groups each include a halogen atom, an alkyl group, a hydroxyl group protected by a protective group, and an amino group protected by a protective group. Suitable examples of the halogen atom include bromine, chlorine and fluorine atoms. Suitable examples of the alkyl group include methyl, ethyl, butyl and t-butyl groups. These alkyl groups each may further have a substituent. Examples of the substituent include a halogen atom, an alkyl group, a hydroxyl group protected by a protective group and an amino group protected by a protective group.

Examples of such protective groups include an alkyl group, a cycloalkyl group, an aralkyl group, a substituted methyl group, a substituted ethyl group, an acyl group, an alkoxycarbonyl group and an aralkyloxycarbonyl group. Suitable examples of the alkyl group include 1-4C alkyl groups, those of the substituted methyl group include methoxymethyl, methoxythiomethyl, benzyloxymethyl, t-butoxymethyl and 2-methoxyethoxymethyl groups, those of the substituted ethyl group include 1-ethoxyethyl and 1-methyl-1-methoxyethyl groups, those of the acyl group include 1-6C aliphatic acyl groups such as formyl, acetyl, propionyl, butyryl, isobutyryl, valeryl and pivaloyl groups, and those of the alkoxycarbonyl group include 1-4C alkoxycarbonyl groups.

The proportion of repeating units represented by the formula (IX), which have neither a hydroxyl group nor a cyano group is preferably from 0 to 40 mole %, far preferably from 0 to 20 mmole %, with respect to the total repeating units of the alicyclic hydrocarbon-containing acid-decomposable resin.

Examples of a repeating unit represented by the formula (IX) are illustrated below, but these examples should not be construed as limiting the scope of the invention.

In the following structural formulae, Ra represents H, CH$_3$, CH$_2$OH or CF$_3$.

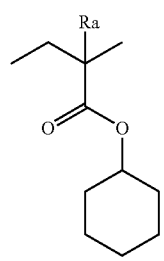
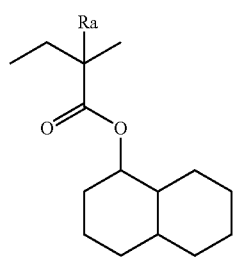
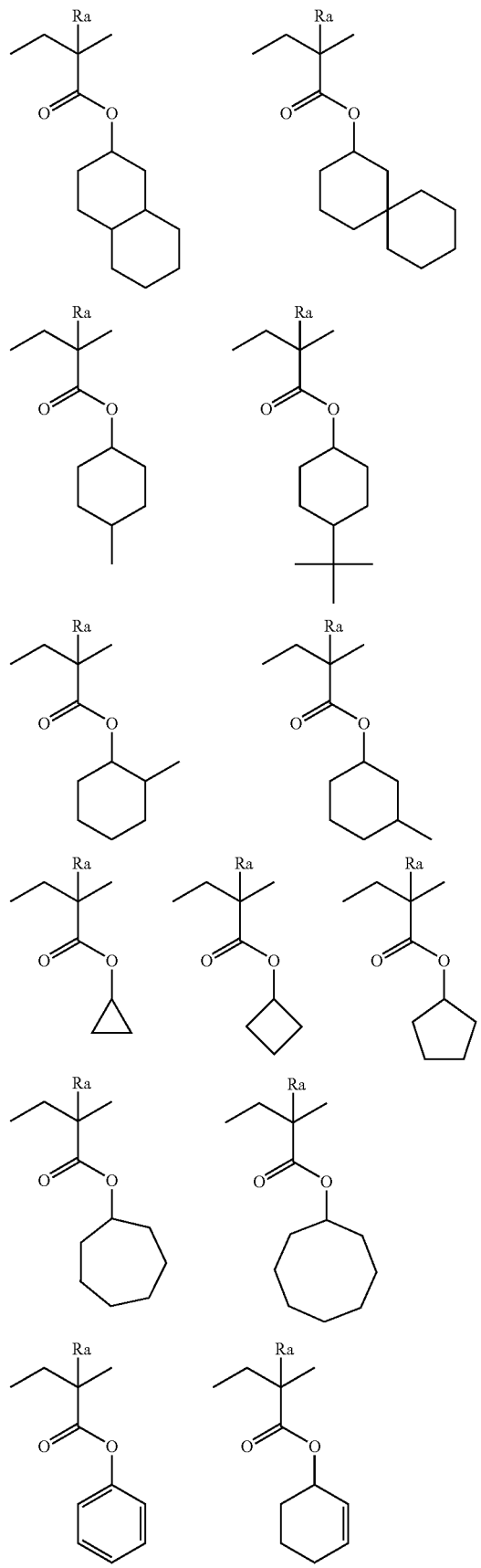
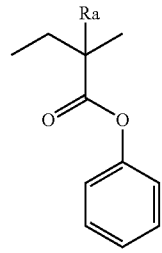
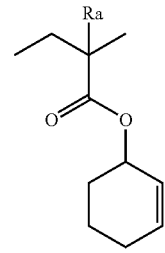

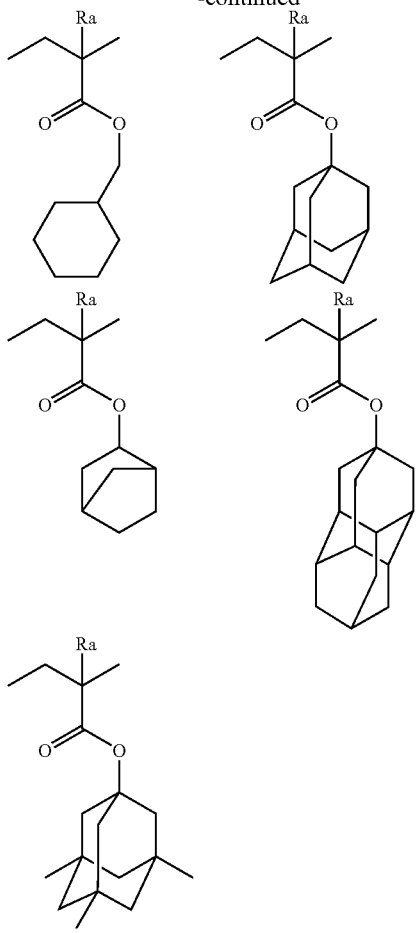

In addition to the repeating structural units as described above, the alicyclic hydrocarbon-based acid-decomposable resin according to the invention may have various repeating structural units in order to control resistance to dry etching, suitability for standard developing solutions, adhesiveness to a substrate, resist profile and other characteristics generally required in resists (for example, resolution, heat resistance and sensitivity).

Examples of these repeating structural units include structural units corresponding to the following monomers. However, the invention is not restricted thereto.

Thus, it becomes possible to finely control characteristics required for the alicyclic hydrocarbon-based acid-decomposable resin, in particular, the following ones.

(1) Solubility in a coating solvent.
(2) Film-forming properties (glass transition point).
(3) Solubilities in a positive developing solution and a negative developing solution.
(4) Film loss (selection of a hydrophilic/hydrophobic and alkali-soluble group).
(5) Adhesiveness of a non-exposed part to a substrate.
(6) Dry etching resistance, and so on.

Examples of such monomers include a compound having one addition-polymerizable unsaturated bond selected from among acrylic esters, methacrylic esters, acrylamides, methacrylamides, allyl compounds, vinyl ethers, vinyl esters and so on.

Furthermore, such a monomer having various repeating structural units as cited above may be copolymerized with an addition-polymerizable unsaturated compound so long as it can be copolymerized with the monomer.

In the alicyclic hydrocarbon-based acid-decomposable resin, the molar ratio of each repeating structural unit may be appropriately determined so as to control the dry etching resistance, suitability for standard developing solutions, adhesiveness of the resist, the resist profile and other characteristics generally required in resists, for example, resolution, heat resistance and sensitivity.

Preferable examples of the mode of the alicyclic hydrocarbon-based acid-decomposable resin according to the invention are as follows.

(1) An alicyclic hydrocarbon-based acid-decomposable resin having a repeating unit represented by the general formula (NGH-1) and a repeating unit having a partial structure containing an alicyclic hydrocarbon represented by one of the above-described general formulae (pI) to (pV) (a side chain type), preferably one having a repeating unit of (meth)acrylate having a structure of one of (pI) to (pV).

(2) One having a repeating unit represented by the general formula (NGH-1) and a repeating unit represented by the general formula (II-AB) (a main chain type), provided that examples of (2) include the following ones.

(3) One having a repeating unit represented by the general formula (NGH-1) and a repeating unit represented by the general formula (II-AB), a maleic anhydride derivative structure and a (meth)acrylate structure (a hybrid type).

In the alicyclic hydrocarbon-based acid-decomposable resin, the content of the repeating unit having an acid-decomposable group is preferably from 10 to 60% by mol, more preferably from 20 to 50% by mol and more preferably from 25 to 40% by mol based on the total repeating units.

In the alicyclic hydrocarbon-based acid-decomposable resin, the content of the repeating unit having a partial structure containing an alicyclic hydrocarbon represented by one of the general formulae (pI) to (pV) is preferably from 20 to 70% by mol, more preferably from 20 to 50% by mol and more preferably from 25 to 40% by mol based on the total repeating units.

In the alicyclic hydrocarbon-based acid-decomposable resin, the content of the repeating unit having a repeating unit represented by the general formula (II-AB) is preferably from 10 to 60% by mol, more preferably from 15 to 55% by mol and more preferably from 20 to 50% by mol based on the total repeating units.

In the alicyclic hydrocarbon-based acid-decomposable resin, the content of the repeating unit having a lactone structure is preferably from 10 to 70% by mol, more preferably from 20 to 60% by mol and more preferably 25 to 40% by mol based on the total repeating units.

In the alicyclic hydrocarbon-based acid-decomposable resin, the content of the repeating unit represented by the general formula (NGH-1) is preferably from 1 to 15% by mol and more preferably 5 to 15% by mol.

In the alicyclic hydrocarbon-based acid-decomposable resin, the content of the repeating unit having a polar group other than the polar group contained in the general formula (NGH-1) is preferably from 1 to 30% by mol, more preferably from 1 to 20% by mol and more preferably 5 to 15% by mol based on the total repeating units.

Although the content of a repeating unit based on a monomer employed as an additional copolymerizable component as described above in the resin may be appropriately determined depending on the desired resist performance, it is generally preferred that the content thereof is not more than 99% by mol, more preferably not more than 90% by mol and more preferably not more than 80% by mol based on the sum of the moles of the repeating unit represented by the general formula (NGH-1), the repeating unit having a partial structure containing an alicyclic hydrocarbon represented by one of the general formulae (pI) to (pV) as described above and the repeating unit represented by the general formula (II-AB) as described above.

In the case where the composition according to the invention is to be used for ArF exposure, it is preferred from the viewpoint of the transparency to the ArF beam that the resin (A) is free from aromatic group.

As the alicyclic hydrocarbon-based acid-decomposable resin to be used in the invention, one wherein all of the repeating units consist of (meth)acrylate repeating units is preferred. In this case, use can be made of any of one wherein all of the repeating units consist of acrylate, one wherein all of the repeating units consist of methacrylate and one wherein all of the repeating units consist of acrylate/(meth)acrylate mixture, though it is preferred to use one wherein the content of acrylate repeating units is 50% by mol or less based on the total repeating units.

It is preferable that the alicyclic hydrocarbon-based acid-decomposable resin is a copolymer at least having the repeating unit represented by the general formula (NGH-1), a (meth)acrylate-based repeating unit having a lactone ring, and a (meth)acrylate-based repeating unit having an acid-decomposable group.

It is still preferable that the alicyclic hydrocarbon-based acid-decomposable resin is a copolymer containing from 1 to 15% by mol of the repeating unit represented by the general formula (NGH-1), from 20 to 50% by mol of the repeating unit having a partial structure containing an alicyclic hydrocarbon represented by one of the general formulae (pI) to (pV) and 20 to 50% by mol of the repeating unit having a lactone structure, or a copolymer which further contains from 0 to 20% by mol of another repeating unit.

Particularly preferable examples of the resin include a ternary copolymer which contains from 20 to 50% by mol of a repeating unit having an acid-decomposable group represented by one of the following general formulae (ARA-1) to (ARA-7), from 20 to 50% by mol of a repeating unit having a lactone structure represented by one of the following general formulae (ARL-1) to (ARL-6) and from 1 to 15% by mol of a repeating unit having an alicyclic hydrocarbon structure substituted by a polar group represented by one of the following general formulae (ARH-1) to (ARH-2) and a quaternary copolymer which further contains from 5 to 20% by mol of a repeating unit which has a carboxyl group or a repeating unit represented by the general formula (F1) and an alicyclic hydrocarbon structure but shows no acid decomposability.

(In the following formulae, $R_{xy1}$ represents a hydrogen atom or a methyl group; $R_{xa1}$ and $R_{xb1}$ each independently represents a methyl group or an ethyl group; and $R_{xc1}$ represents a hydrogen atom or a methyl group).

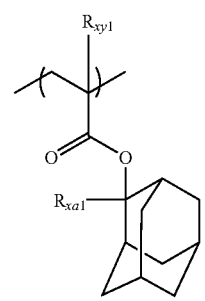

(ARA-1)

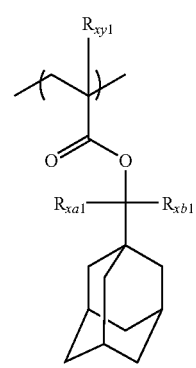

(ARA-2)

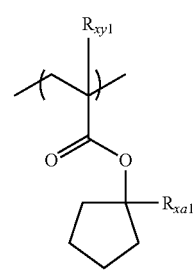

(ARA-3)

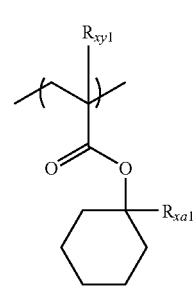

(ARA-4)

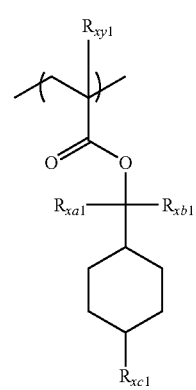

(ARA-5)

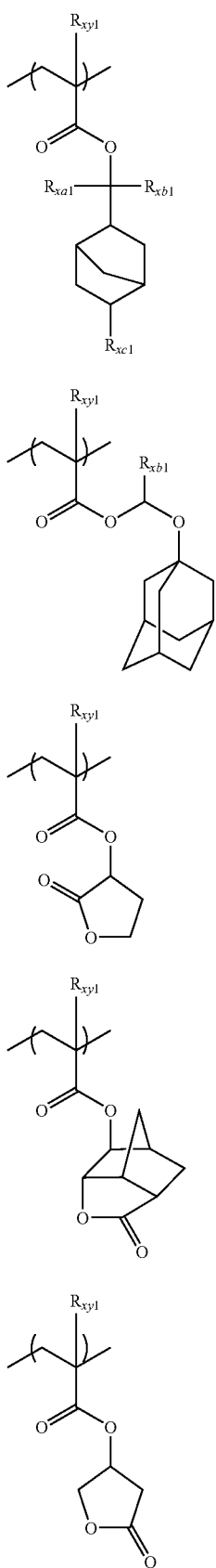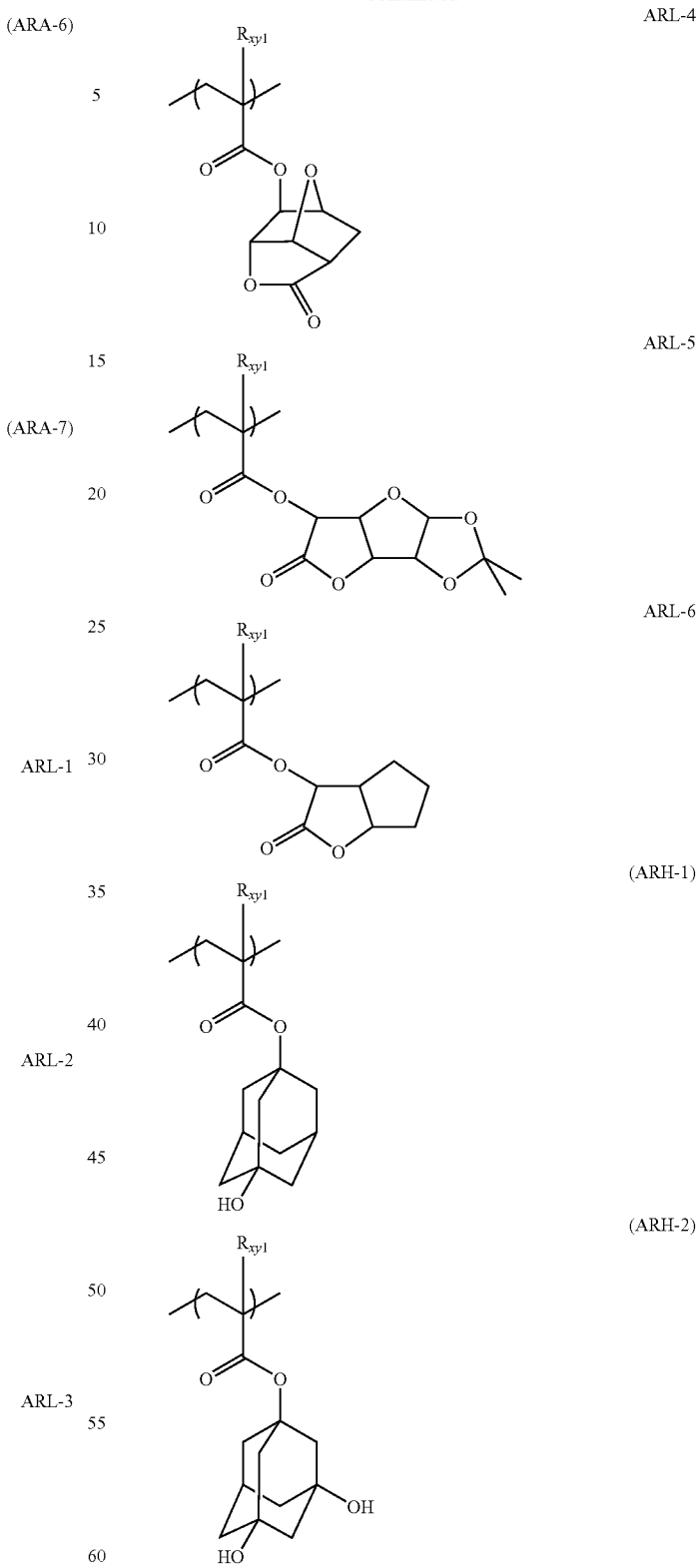
The alicyclic hydrocarbon-based acid-decomposable resin to be used in the invention can be synthesized in accordance with a method commonly employed (for example, radical polymerization). Examples of the synthesis method commonly employed include a bulk polymerization method which includes dissolving monomer species and an initiator in a solvent and heating to thereby conduct polymerization, a drop polymerization method which includes dropping a solution of monomer species and an initiator to a heated solvent over 1 to 10 hours, and so on. The drop polymerization method is preferred. Examples of the reaction solvent include tetrahydrofuran, 1,4-dioxane, ethers such as diisopropyl ether, ketones such as methyl ethyl ketone and methyl isobutyl ketone, ester solvents such as ethyl acetate, amide solvents such as dimethylformamide and dimethylacetamide, and solvents in which the composition according to the invention is soluble as will be discussed hereinafter, for example, propylene glycol monomethyl ether acetate, propylene glycol monomethyl ether and cyclohexanone. It is more preferable to employ the same solvent as the one used in the resist composition according to the invention so that the occurrence of particles can be prevented during preservation.

It is preferred to conduct the polymerization under an inert gas atmosphere such as nitrogen or argon. As the polymerization initiator, a commercially available radical initiator (an azo type initiator, a peroxide, etc.) is used to initiate the polymerization. As the radical initiator, an azo type initiator is preferable. An azo type initiator having an ester group, a cyano group or a carboxyl group is preferred. Preferable examples of the initiator include azobisisobutyronitrile, azobisdimethylvaleronitrile, dimethyl 2,2'-azobis(2-methylpropionate) and so on. If desired, the initiator may be additionally employed or added in portions. Namely, the initiator may be added to the solvent after the completion of the reaction and thus the desired polymer is collected as a powder or a solid. The reaction concentration is from 5 to 50% by mass, preferably from 10 to 30% by mass. The reaction temperature is usually from 10° C. to 150° C., preferably from 30° C. to 120° C. and more preferably from 60° C. to 100° C.

For the purification, use can be made of the same method as in the case of resin (D) as will be described hereinafter. For example, use can be made of water washing, the liquid-liquid extraction method which includes combining appropriate solvents and thus removing the residual monomers and oligomer components, the purification method in the solution state which includes conducting ultrafiltration to thereby extract and remove components having a specific molecular weight or less, the reprecipitation method which includes dropping the resin solution into a poor solvent, thus solidifying the resin in the poor solvent and separating the residual monomers and the like, and the purification method in the solid state which includes filtering the resin slurry and washing with a poor solvent.

The weight-average molecular weight of the resin (A) according to the invention, calculated in terms of polystyrene by the GPC method, is preferably from 1,000 to 200,000, more preferably from 1,000 to 20,000 and particularly preferably from 1,000 to 15,000. By regulating the weight-average molecular weight to 1,000 to 200,000, worsening in heat resistance or dry etching resistance can be prevented and, at the same time, worsening in the development properties and worsening in the film-forming properties caused by an increase in the viscosity can be prevented.

In another embodiment, the weight-average molecular weight of the resin (A) according to the invention, calculated in terms of polystyrene by the GPC method, is preferably from 3,000 to 95,000. By regulating the weight-average molecular weight to 3,000 to 95,000, the formation of resist residue (hereinafter also called "scum") can be prevented and thus an improved pattern can be formed.

Use is made of a resin having the degree of dispersion (molecular weight distribution) of usually from 1 to 5, preferably from 1 to 3, more preferably from 1.2 to 3.0 and particularly preferably from 1.2 to 2.0. A resin having a smaller degree of dispersion can bring about the better resolution, resist shape, smoothness in the side wall of a resist pattern and roughness.

In the resist composition according to the invention, the content of the all of the resins according to the invention in the whole composition is preferably from 50 to 99.99% by mass based on the total solid matters, more preferably from 60 to 99.0% by mass.

In the invention, either a single resin or two or more resins may be employed.

From the viewpoint of the compatibility with the resin (D), it is preferable that the alicyclic hydrocarbon-based acid-decomposable resin is free from fluorine and silicon atoms.

(B) Compound Capable of Generating Acid when Irradiated with Actinic Ray or Radiation The resist composition according to the invention contains a compound capable of generating an acid upon irradiation with an actinic ray or radiation (hereinafter also referred to as "photo acid-generating agent" or "component (B)").

As the photo acid-generating agent, use can be appropriately made of a photo initiator for photo cation polymerization, a photo initiator for photo radical polymerization, a photo decoloring agent for dyes, a photo color changing agent, a publicly known compound, which generates an acid upon irradiation with an actinic ray or radiation, employed in microresists and the like and a mixture thereof.

For example, there can be enumerated a diazonium salt, a phosphonium salt, a sulfonium salt, an iodonium salt, imide sulfonate, oxime sulfonate, diazosulfone, disulfone, o-nitrobenzyl sulfonate and so on.

Furthermore, use can be made of a compound wherein a group or a compound capable of generating an acid upon irradiation with an actinic ray or radiation has been introduced into the main chain or a side chain of a polymer, for example, compounds described in U.S. Pat. No. 3,849,137, German Patent 3914407, JP-A-63-26653, JP-A-55-164824, JP-A-62-69263, JP-A-63-146038, JP-A-63-163452, JP-A-62-153853, JP-A-63-146209 and so on.

Moreover, use can be also made of a compound capable of generating an acid by the action of light as described in, for example, U.S. Pat. No. 3,779,778, EP 126,712 and so on.

As preferable compounds among the compounds capable of generating an acid upon irradiation with an actinic ray or radiation, compounds represented by the following general formulae (ZI), (ZII) and (ZIII) may be cited.

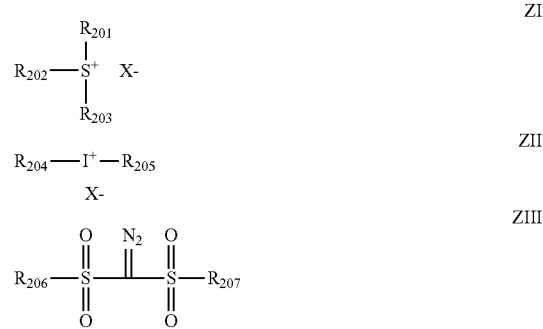

In the general formula (ZI), $R_{201}$, $R_{202}$ and $R_{203}$ each independently represents an organic group.

$X^-$ represents a non-nucleophilic anion preferably exemplified by a sulfonate anion, a carboxylate anion, a bis(alkylsulfonyl)amide anion, a tris(alkylsulfonyl)methide anion, $BF_4^-$, $PF_6^-$, $SbF_6^-$ and so on. An organic anion having a carbon atom is preferred.

As preferable examples of the organic anion, the following ones can be enumerated.

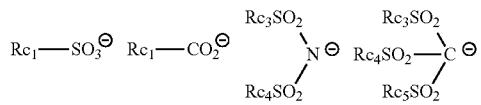

In the above general formulae, $R_{c1}$ represents an organic group.

As the organic group $R_{c1}$, one having from 1 to 30 carbon atoms may be cited. Preferable examples thereof include an optionally substituted alkyl group, an aryl group and a group wherein a plural number of these groups are bonded via a single bond or a linking group such as —O—, —$CO_2$—, —S—, —$SO_3$—, —$SO_2N(R_{d1})$— and so on, $R_{d1}$ represents a hydrogen atom or an alkyl group.

$R_{c3}$, $R_{c4}$ and $R_{c5}$ each independently represents an organic group. As preferable examples of the organic groups $R_{c3}$, $R_{c4}$ and $R_{c5}$, the same ones as those cited above as preferable examples of $R_{c1}$ can be enumerated. A perfluoroalkyl group having from 1 to 4 carbon atoms is particularly preferred.

$R_{c3}$ and $R_{c4}$ may be bonded together to form a ring. Examples of the ring formed by $R_{c3}$ and $R_{c4}$ bonded together include an alkylene group and an arylene group. A perfluoroalkylene group having from 1 to 4 carbon atoms is preferred.

Particularly preferable examples of the organic groups $R_{c1}$ and $R_{c3}$ to $R_{c5}$ include an alkyl group substituted at the 1-position by a fluorine atom or a fluoroalkyl group and a phenyl group substituted by a fluorine atom or a fluoroalkyl group. Owing to the presence of a fluorine atom or a fluoroalkyl group, the acidity of the acid generated by photo irradiation is increased and thus the sensitivity is elevated. When $R_{c3}$ and $R_{c4}$ are bonded together to form a ring, the acidity of the acid generated by photo irradiation is increased and thus the sensitivity is elevated thereby.

Each of the organic acids represented by $R_{201}$, $R_{202}$ and $R_{203}$ generally has from 1 to 30, preferably from 1 to 20, carbon atoms.

Two of $R_{201}$, $R_{202}$ and $R_{203}$ may be bonded together to form a cyclic structure which may contain an oxygen atom, a sulfur atom, an ester bond, an amide bond or a carbonyl group in the ring. As examples of the group formed by two of $R_{201}$, $R_{202}$ and $R_{203}$ bonded together, an alkylene group (for example, a butylene group or a pentylene group) may be cited.

Specific examples of the organic groups represented by $R_{201}$, $R_{202}$ and $R_{203}$ include the corresponding groups in the compounds (ZI-1), (ZI-2) and (ZI-3) as will be described hereinafter.

Also, use may be made of a compound having a plural number of the structures represented by the general formula (ZI). For example, a compound having a structure wherein at least one of $R_{201}$, $R_{202}$ and $R_{203}$ in the compound represented by the general formula (ZI) is bonded to at least one of $R_{201}$, $R_{202}$ and $R_{203}$ in another compound represented by the general formula (ZI) may be employed.

Still preferable examples of the component (ZI) include the compounds (ZI-1), (ZI-2) and (ZI-3) as will be described hereinafter.

The compound (ZI-1) is an arylsulfonium compound wherein at least one of $R_{201}$, $R_{202}$ and $R_{203}$ in the above general formula (Z1) is an aryl group, i.e., a compound having arylsulfonium as a cation.

In the arylsulfonium compound, all of $R_{201}$, $R_{202}$ and $R_{203}$ may be aryl groups, Alternatively, a part of $R_{201}$, $R_{202}$ and $R_{203}$ may be aryl group(s) while the remainder(s) are an alkyl or cycloalkyl group.

Examples of the arylsulfonium compound include a triarylsulfonium compound, a diarylalkylsulfonium compound, an aryldialkylsulfonium compound, a diarylcycloalkylsulfonium compound, an aryldicycloalkylsulfonium compound and so on.

As the aryl group in the arylsulfonium compound, an aryl group such as a phenyl group or a naphthyl group and a heteroaryl group such as an indole residue or a pyrrole residue are preferable. A phenyl group or an indole residue is still preferred. In the case where the arylsulfonium compound has two or more aryl groups, these aryl groups may be either the same or different.

As the alkyl group carried, if necessary, by the arylsulfonium compound, a linear or branched alkyl group having from 1 to 15 carbon atoms is preferred. Examples thereof include a methyl group, an ethyl group, a propyl group, an n-butyl group, a sec-butyl group, a t-butyl group and so on.

As the cycloalkyl group carried, if necessary, by the arylsulfonium compound, a cycloalkyl group having from 3 to 15 carbon atoms is preferred. Examples thereof include a cyclopropyl group, a cyclobutyl group, a cyclohexyl group and so on.

The aryl, alkyl and cycloalkyl groups represented by $R_{201}$ to $R_{203}$ may have a substituent such as an alkyl group (for example, one having from 1 to 15 carbon atoms), a cycloalkyl group (for example, one having from 3 to 15 carbon atoms), an aryl group (for example, one having from 6 to 14 carbon atoms), an alkoxy group (for example, one having from 1 to 15 carbon atoms), a halogen atom, a hydroxyl group or a phenylthio group. Preferable examples of the substituent include a linear or branched alkyl group having from 1 to 12 carbon atoms, a cycloalkyl group having from 3 to 12 carbon atoms and a linear, branched or cyclic alkoxy group having from 1 to 12 carbon atoms. An alkyl group having from 1 to 4 carbon atoms or an alkoxy group having from 1 to 4 carbon atoms is still preferred. Such a substituent may be attached to either one of $R_{201}$ to $R_{203}$ or all of them. In the case where $R_{201}$ to $R_{203}$ are aryl groups, it is preferable that a substituent is attached to the p-position of an aryl group.

Next, the compound (ZI-2) will be illustrated.

The compound (ZI-2) is a compound wherein $R_{201}$ to $R_{203}$ in the formula (ZI) each independently represents an organic group having no aromatic ring. The term "aromatic ring" as used herein involves an aromatic ring having a hetero atom.

The organic groups having no aromatic ring represented by $R_{201}$ to $R_{203}$ generally have from 1 to 30 carbon atoms, preferably from 1 to 20 carbon atoms.

$R_{201}$ to $R_{203}$ each independently represents preferably an alkyl group, a cycloalkyl group, an allyl group or a vinyl group, more preferably a linear, branched or cyclic 2-oxoalkyl group or an alkoxycarbonylmethyl group, and more preferably a linear or branched 2-oxoalkyl group.

The alkyl groups represented by $R_{201}$ to $R_{203}$ may be either linear or branched. Preferable examples thereof include linear or branched alkyl groups having from 1 to 10 carbon atoms (for example, methyl, ethyl, propyl, butyl and pentyl groups). As the alkyl groups $R_{201}$ to $R_{203}$, a linear or branched 2-oxoalkyl group or an alkoxycabronylmethyl group is more preferable.

Preferable examples of the cycloalkyl groups represented by $R_{201}$ to $R_{203}$ include cycloalkyl groups having from 3 to 10 carbon atoms (cyclopentyl, cyclohexyl and norbonyl groups). As the cycloalkyl groups $R_{201}$ to $R_{203}$, a cyclic 2-oxoalkyl group is more preferable.

Preferable examples of the linear, branched or cyclic 2-oxoalkyl group as $R_{201}$ to $R_{203}$ include the alkyl and cycloalkyl groups as described above having >C=O attached to the 2-position thereof.

Preferable examples of the alkoxy group in the alkoxycarbonylmethyl group as $R_{201}$ to $R_{203}$ include an alkoxy group having from 1 to 5 carbon atoms (methoxy, ethoxy, propoxy, butoxy and pentoxy groups).

$R_{201}$ to $R_{203}$ may be further substituted by a halogen atom, an alkoxy group (for example, one having from 1 to 5 carbon atoms), a hydroxyl group, a cyano group or a nitro group.

The compound (ZI-3) is a compound represented by the following general formula (ZI-3), i.e., a compound having a phenacylsuflonium salt structure,

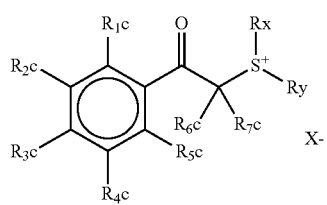

(ZI-3)

In the general formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more of $R_{1c}$ to $R_{7c}$ may be bonded together to thereby respectively form cyclic structures. Such a cyclic structure may contain an oxygen atom, a sulfur atom, an ester bond or an amide bond. Examples of the rings formed by any two or more of $R_{1c}$ to $R_{7c}$ bonded together include a butylene group, a pentylene group and so on.

$X^-$ represents a non-nucleophilic anion that is the same as the non-nucleophilic anion $X^-$ in the general formula (ZI).

The alkyl groups represented by $R_{1c}$ to $R_{7c}$ may be either linear or branched. Examples thereof include linear or branched alkyl groups having from 1 to 20 carbon atoms, preferably a linear or branched alkyl group having from 1 to 12 carbon atoms (for example, methyl, ethyl, linear or branched propyl, linear or branched butyl and linear or branched pentyl groups).

Preferable examples of the cycloalkyl groups represented by $R_{1c}$ to $R_{7c}$ include cycloalkyl groups having from 3 to 8 carbon atoms (for example, cyclopentyl and cyclohexyl groups).

The alkoxy groups represented by $R_{1c}$ to $R_{5c}$ may be linear, branched or cyclic. For example, there can be enumerated an alkoxy group having from 1 to 10 carbon atoms, preferably a linear or branched alkoxy group having from 1 to 5 carbon atoms (for example, methoxy, ethoxy, linear or branched propoxy, linear or branched butoxy and linear or branched pentoxy groups) and a cyclic alkoxy group having from 3 to 8 carbon atoms (for example, cyclopentyloxy and cyclohexyloxy groups).

It is preferable that any one of $R_{1c}$ to $R_{5c}$ is a linear or branched alkyl group, a cycloalkyl group or a linear, branched or cyclic alkoxy group. It is more preferable that the sum of the carbon atoms in $R_{1c}$ to $R_{5c}$ amounts to 2 to 15. Thus, the solubility in a solvent can be elevated and the occurrence of particles can be prevented during preservation.

Examples of the alkyl groups as $R_x$ and $R_y$ include those which are the same as the alkyl groups cited above as $R_{1c}$ to $R_{7c}$. As the alkyl groups $R_x$ and $R_y$, a linear or branched 2-oxoalkyl group or an alkoxycarbonylmethyl group is more preferred.

Examples of the cycloalkyl groups as $R_x$ and $R_y$ include those which are the same as the cycloalkyl groups cited above as $R_{1c}$ to $R_{7c}$. As the cycloalkyl groups $R_x$ and $R_y$, a cyclic 2-oxoalkyl group is more preferred.

Preferable examples of the linear, branched or cyclic 2-oxoalkyl group include the alkyl and cycloalkyl groups having >C=O attached to the 2-position thereof as described above as $R_{1c}$ to $R_{7c}$.

Preferable examples of the alkoxy group in the alkoxycarbonylmethyl group include those which are the same as the alkoxy groups cited above as $R_{1c}$ to $R_{5c}$.

It is preferable that $R_x$ and $R_y$ are alkyl groups having 4 or more carbon atoms, more preferably alkyl groups having 6 or more carbon atoms and more preferably alkyl groups having 8 or more carbon atoms.

In the above general formulae (ZII) and (ZIII), $R_{204}$ to $R_{207}$ each independently represents an aryl group, an alkyl group or a cycloalkyl group.

Preferable examples of the aryl groups represented by $R_{204}$ to $R_{207}$ include an aryl group such as a phenyl group or a naphthyl group. A phenyl group is still preferred.

The alkyl groups represented by $R_{204}$ to $R_{207}$ may be either liner or branched. Preferable examples thereof include a linear or branched alkyl group having from 1 to 10 carbon atoms (for example, methyl, ethyl, propyl, butyl and pentyl groups).

Preferable examples of the cycloalkyl groups represented by $R_{204}$ to $R_{207}$ include a cycloalkyl group having from 3 to 10 carbon atoms (cyclopentyl, cyclohexyl and norbornyl groups).

$R_{204}$ to $R_{207}$ may be substituted. Examples of a substituent which may be carried by $R_{204}$ to $R_{207}$ include an alkyl group (for example, one having from 1 to 15 carbon atoms), a cycloalkyl group (for example, one having from 3 to 15 carbon atoms), an aryl group (for example, one having from 6 to 15 carbon atoms), an alkoxy group (for example, one having from 1 to 15 carbon atoms), a halogen atom, a hydroxyl group and a phenylthio group.

$X^-$ represents a non-nucleophilic anion that is the same as the non-nucleophilic anion $X^-$ in the general formula (ZI).

As preferable examples of the compound capable of generating an acid upon irradiation with an actinic ray or radiation, there can be further enumerated compounds represented by the following general formulae (ZIV), (ZV) and (ZVI).

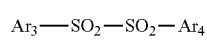

ZIV

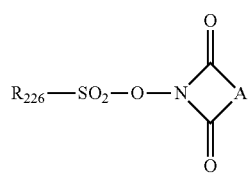

ZV

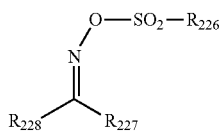

In the general formulae (ZIV) to (ZVI), $Ar_3$ and $Ar_4$ each independently represents an aryl group.

$R_{226}$ represents an alkyl group or an aryl group.

$R_{227}$ and $R_{228}$ each independently represents an alkyl group, an aryl group or an electron-withdrawing group. An aryl group is preferred as $R_{227}$. An electron-withdrawing group is preferred as $R_{228}$ and a cyano group or a fluoroalkyl group is still preferred.

A represents an alkylene group, an alkenylene group or an arylene group.

Still preferable examples of the compound capable of generating an acid upon irradiation with an actinic ray or radiation include compounds represented by the general formula (ZI) to (ZIII).

It is preferable that compound (B) is a compound capable of generating a fluorine-containing aliphatic sulfonic acid or a fluorine-containing benzenesulfonic acid upon irradiation with an actinic ray or radiation.

It is preferable that compound (B) has a triphenylsulfonium structure.

It is preferable that compound (B) is a triphenylsulfonium compound having an alkyl group or a cycloalkyl group, which has no fluorine, in the cation moiety, Next, preferable examples of the compound capable of generating an acid upon irradiation with an actinic ray or radiation will be presented.

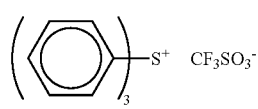

(z1)

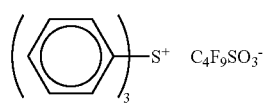

(z2)

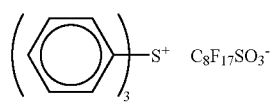

(z3)

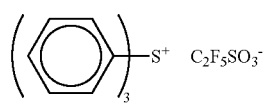

(z4)

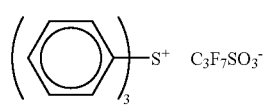

(z5)

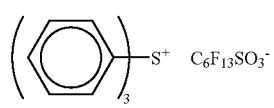

(z6)

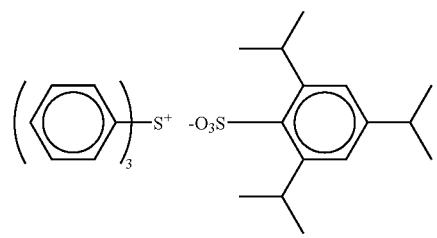

(z7)

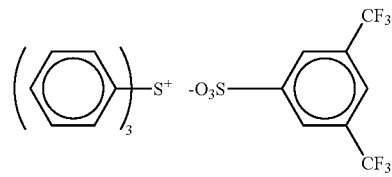

(z8)

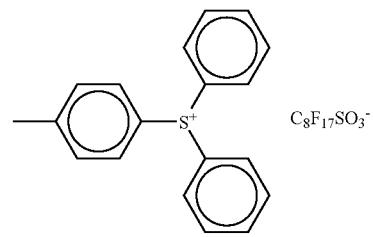

(z9)

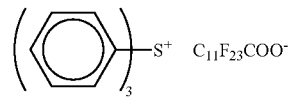

(z10)

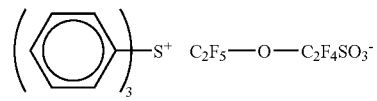

(z11)

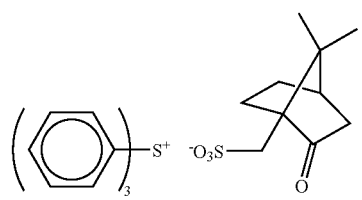

(z12)

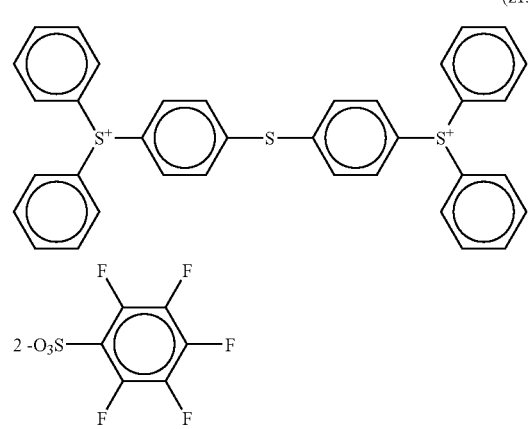

(z13)

-continued
(z14)
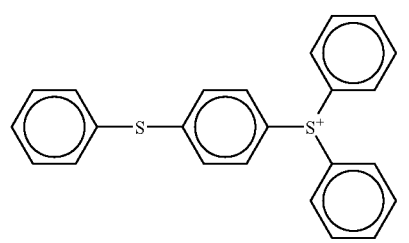
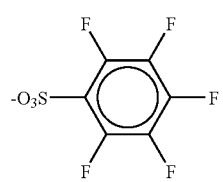
(z15)
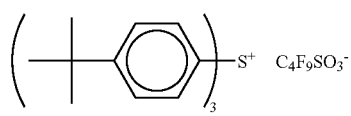
(z16)
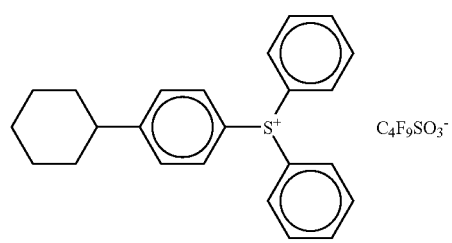
(z17)
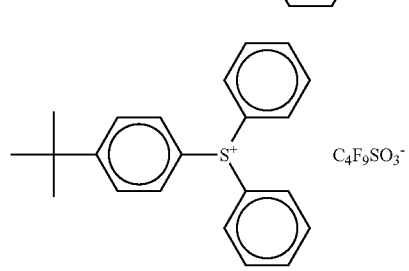
(z18)
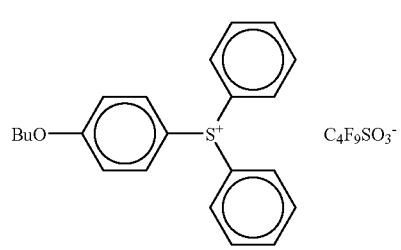
(z19)
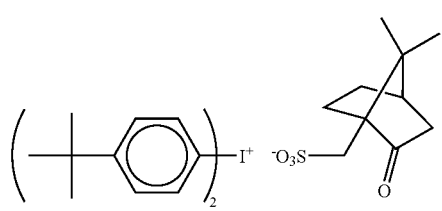
(z20)
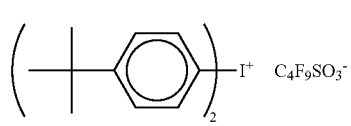
-continued
(z21)
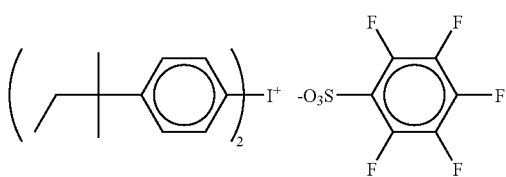
(z22)
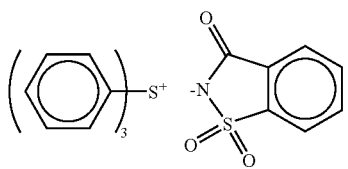
(z23)
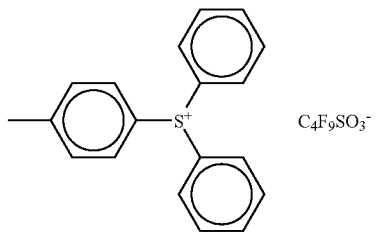
(z24)
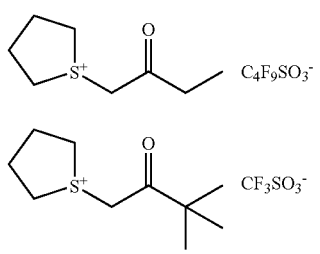
(z25)
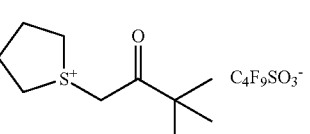
(z26)
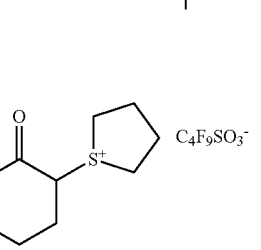
(z27)
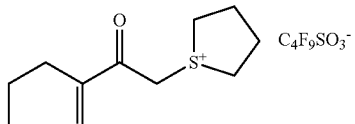
(z28)
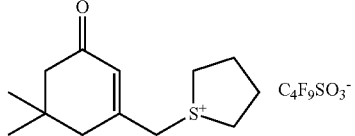
(z29)

-continued
(z30) 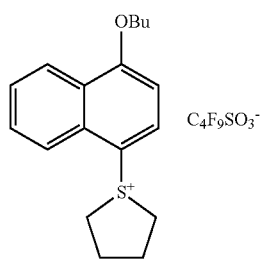
(z31) 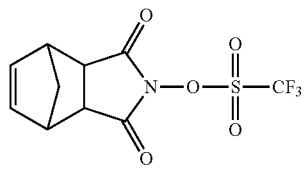
(z32) 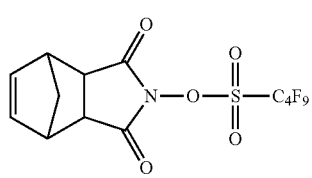
(z33) 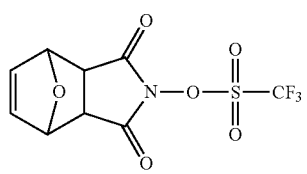
(z34) 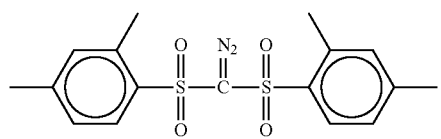
(z35) 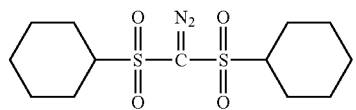
(z36) 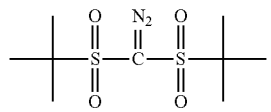
(z37) 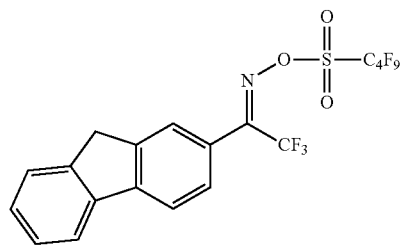
(z38) 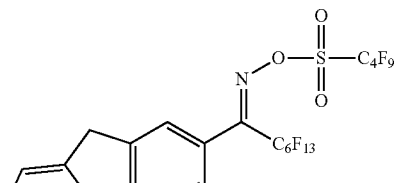
(z39) 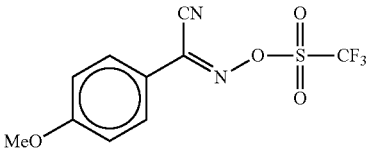
(z40) 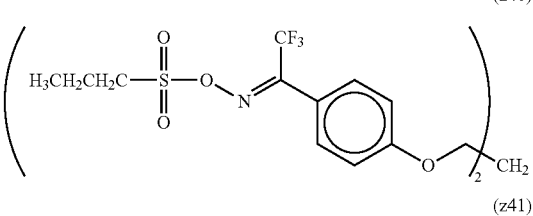
(z41) 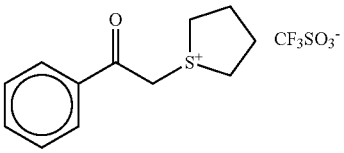
(z42) 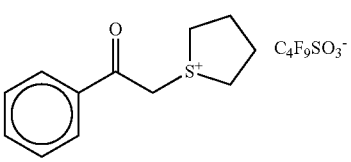
(z43) 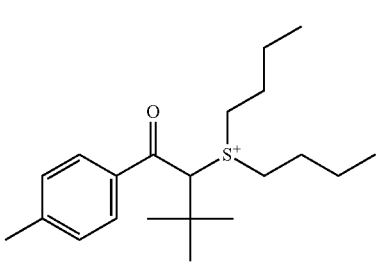
(z44) 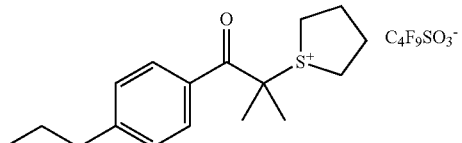
(z45) 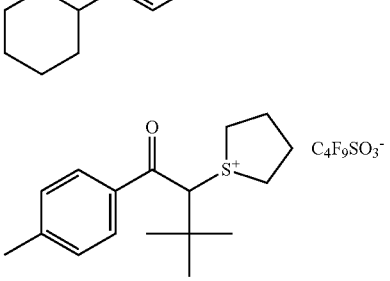

-continued
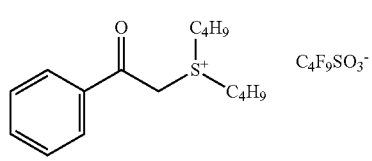 (z46)
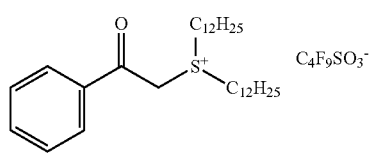 (z47)
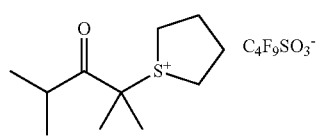 (z48)
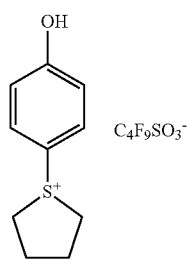 (z49)
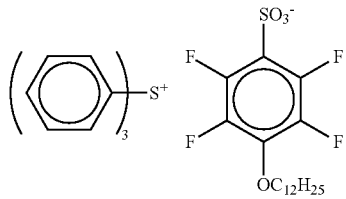 (z50)
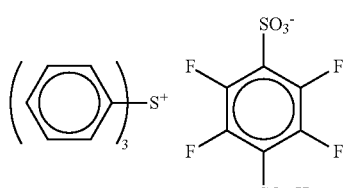 (z51)
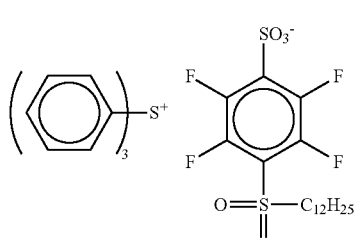 (z52)
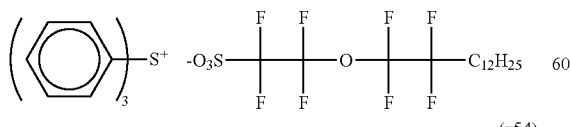 (z53)
 (z54)
-continued
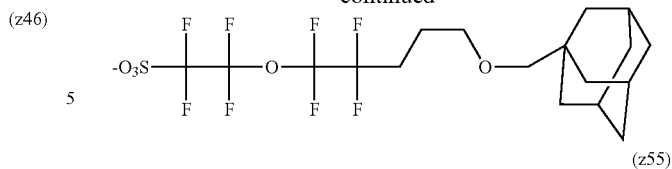
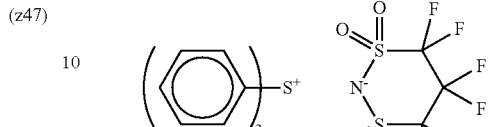 (z55)
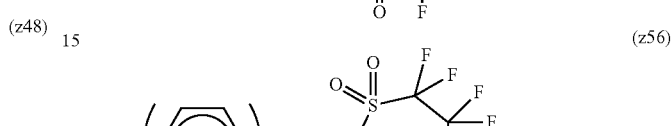 (z56)
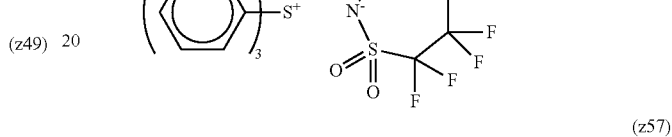 (z57)
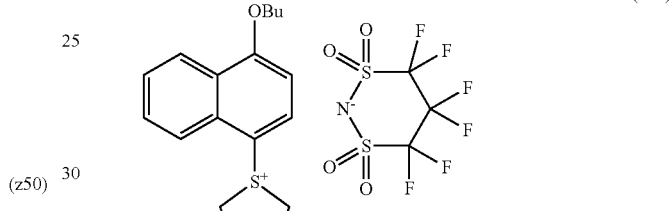 (z58)
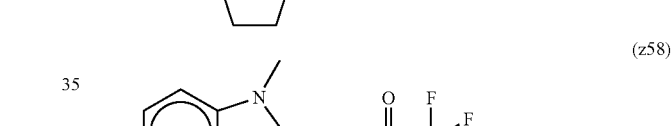 (z59)
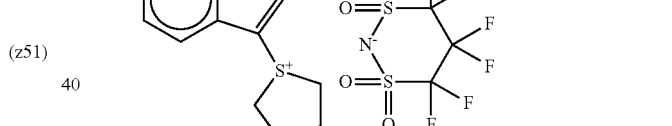 (z60)
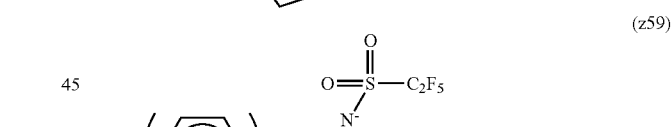 (z61)
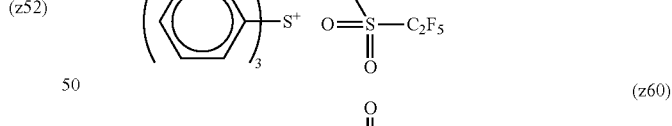
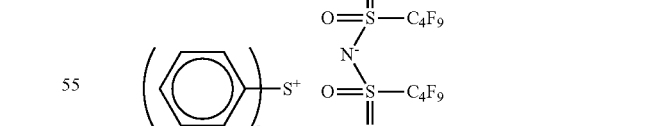
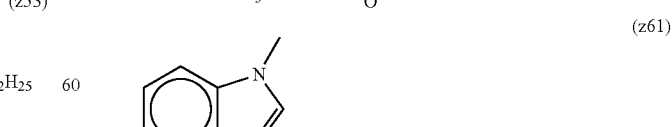
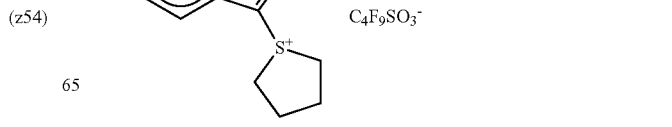

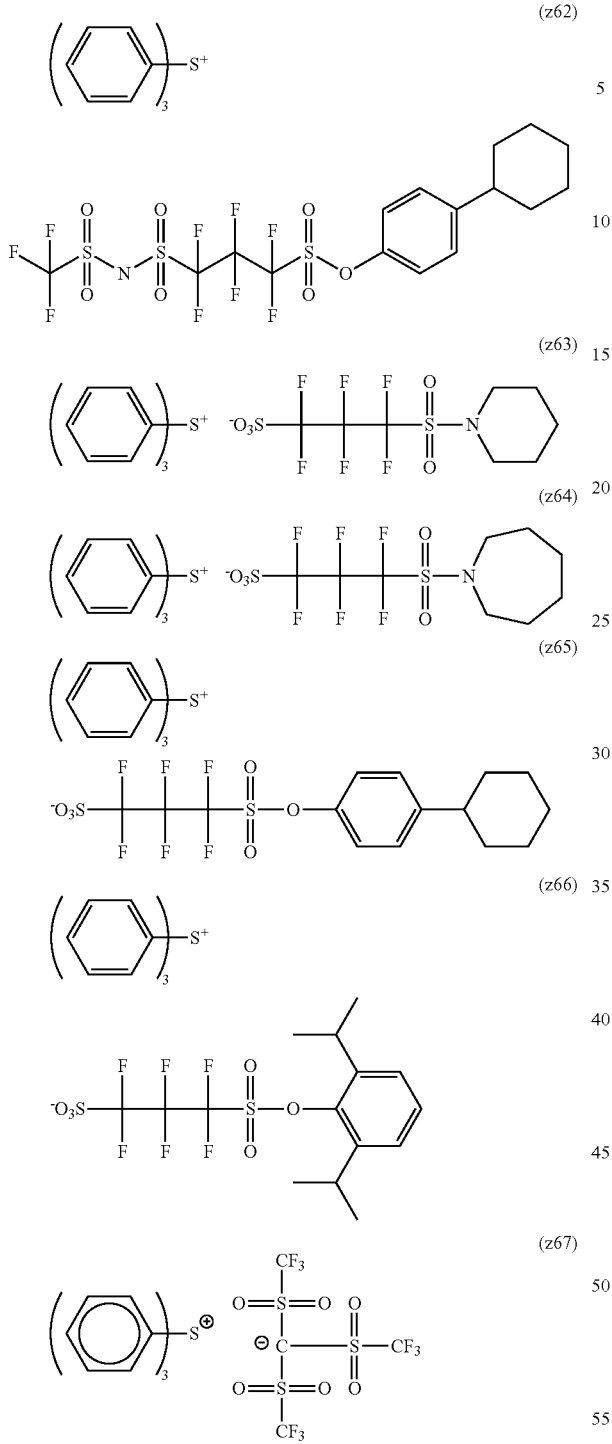
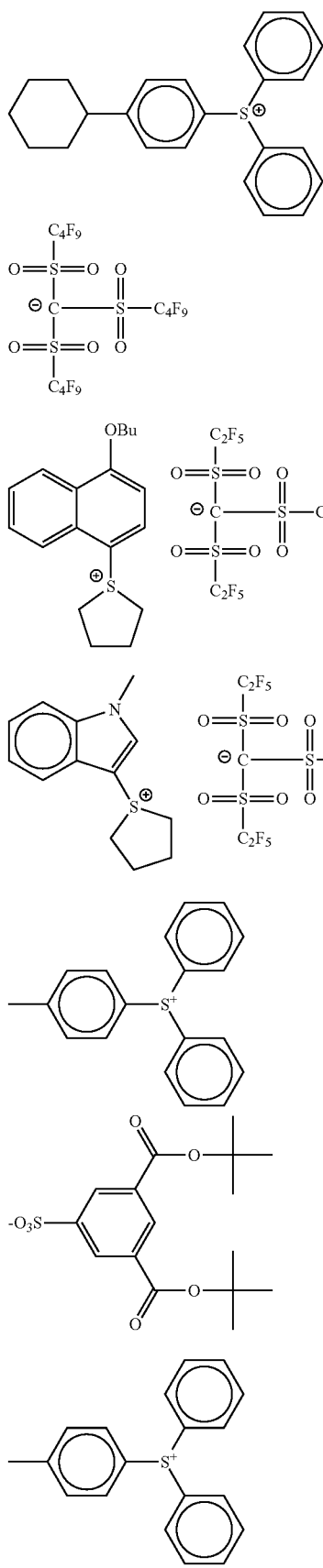

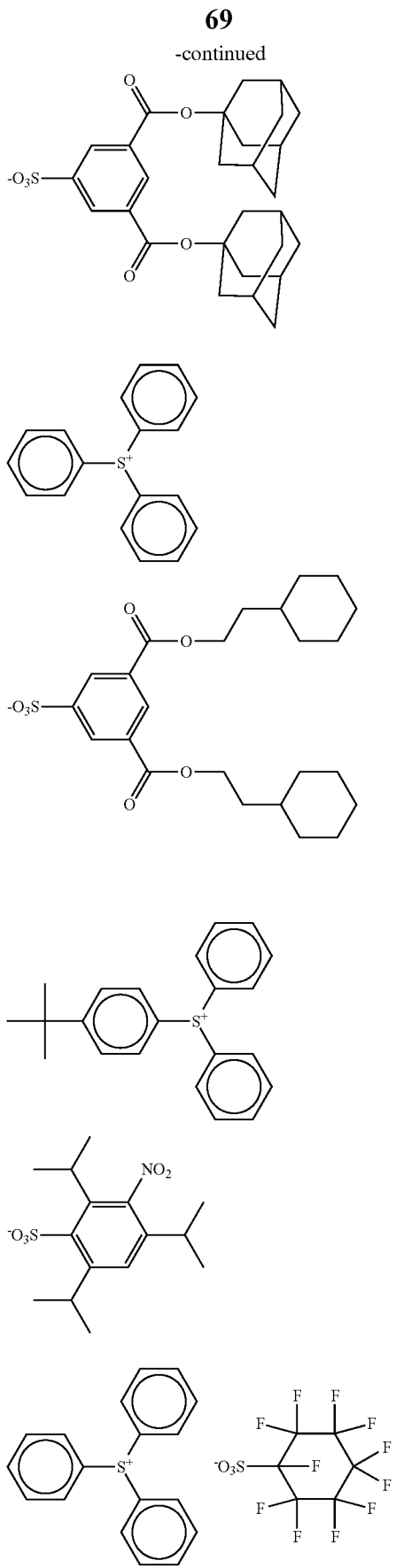

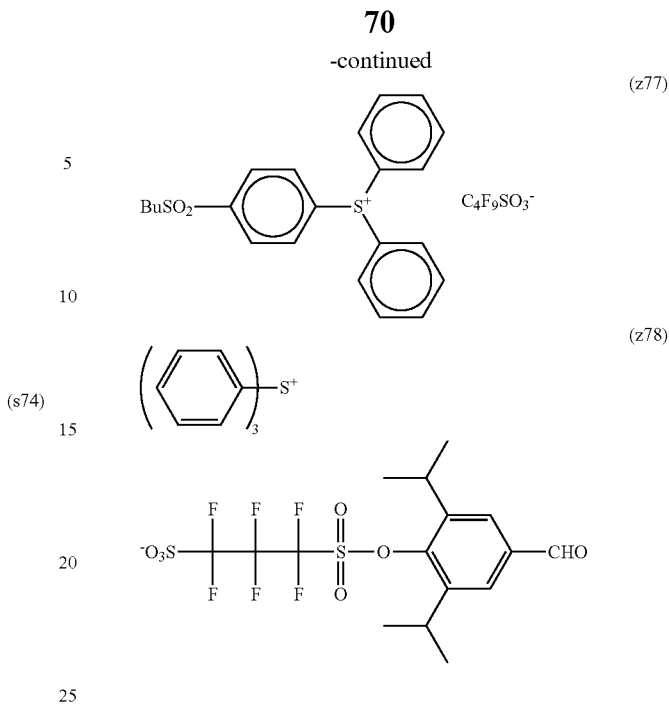

Either a single photo acid-generating agent or a combination of two or more thereof may be used. In the case of using a combination of two or more thereof, it is preferable to combine compounds capable of generating two organic acids having a difference in the sum of atoms excluding hydrogen atoms by two or more.

The content of the photo acid-generating agent is preferably from 0.1 to 20% by mass, more preferably from 0.5 to 10% by mass and more preferably from 1 to 7% by mass based on the total solid matters in the resist composition, (C) Solvent Examples of the solvent usable for dissolving the above components to prepare a resist composition include organic solvents such as an alkylene glycol monoalkyl ether carboxylate, an alkylene glycol monoalkyl ether, an alkyl lactate, an alkyl alkoxypropionate, a cyclic lactone (preferably having from 4 to 10 carbon atoms), a monoketone compound (preferably having from 4 to 10 carbon atoms) which may contain a ring, an alkylene carbonate, an alkyl alkoxyacetate and an alkyl pyruvate.

Preferable examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferable examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferable examples of the alkyl lactate include methyl lactate, ethyl lactate, propyl lactate and butyl lactate.

Preferable examples of the alkylalkoxy propionate include ethyl 3-ethoxypropionate, methyl 3-methoxypropionate, methyl 3-ethoxypropionate and ethyl 3-methoxypropionate.

Preferable examples of the cyclic lactones include β-propiolactone, β-butyrolactone, γ-butyrolactone, α-methyl-γ- butyrolactone, β-methyl-γ-butyrolactone, γ-valerolactone, γ-caprolactone, γ-octanoic lactone and α-hydroxy-γ-butyrolactone.

Preferable examples of the monoketone compounds which may contain a ring include 2-butanone, 3-methyl-butanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonane, 3-nonan, 5-nonane, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferable examples of the alkylene carbonate include propylene carbonate, vinylene carbonate, ethylene carbonate, and butylene carbonate.

Preferable examples of the alkylalkoxy acetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferable examples of the alkyl pyruvate include methyl pyruvate, ethyl pyruvate and propyl pyruvate.

A solvent having a boiling point of 130° C. or higher at room temperature under atmospheric pressure is preferably usable. Specific examples of such a solvent include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the invention one of these solvents may be used alone, or two or more solvents may be used in combination.

In the invention, use can be made of, as organic solvent, a mixed solvent including a solvent containing a hydroxyl group in the structure and a solvent not containing a hydroxyl group in the structure.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these solvents, propylene glycol monomethyl ether and ethyl lactate are particularly preferred.

Examples of the solvent not containing a hydroxyl group include propylene glycol monomethyl ether acetate, ethylethoxy propionate, 2-heptanone, γ-butyrolactone, cyclohexanone, butyl acetate, N-methylpyrrolidone, N,N-dimethylacetamide and dimethyl sulfoxide. Among these solvents, propylene glycol monomethyl ether acetate, ethylethoxy propionate, 2-heptanone, γ-butyrolactone, cyclohexanone and butyl acetate are particularly preferred, and propylene glycol monomethyl ether acetate, ethylethoxy propionate and 2-heptanone are still preferred.

The mixing ratio (by mass) of the solvent containing a hydroxyl group and the solvent not containing a hydroxyl group is from 1/99 to 99/1, preferably from 10/90 to 90/10, and more preferably from 20/80 to 60/40. A mixed solvent including 50 mass % or more of a solvent not containing a hydroxyl group is especially preferred from the viewpoint of coating uniformity.

As the solvent, a mixture of two or more solvents containing propylene glycol monomethyl ether acetate is preferred.

(D) Resin Containing at Least Either Fluorine or Silicon Atoms

It is preferable that the resist composition according to the invention contains a resin (D) containing at least either fluorine or silicon atoms.

In the resin (D), the fluorine or silicon atoms may be contained in the main chain of the resin or in a side chain thereof.

It is preferred that the resin (D) is a resin which contains an alkyl group having a fluorine atom, a cycloalkyl group having a fluorine atom, or an aryl group having a more fluorine atom as a fluorine-containing partial structure.

The alkyl group having a fluorine atom (preferably having from 1 to 10 carbon atoms, more preferably from 1 to 4 carbon atoms) is a linear or branched alkyl group in which at least one hydrogen atom has been substituted by a fluorine atom. This group may have another substituent.

The cycloalkyl group having a fluorine atom is a monocyclic or polycyclic cycloalkyl group in which at least one hydrogen atom has been substituted by a fluorine atom. This group may have another substituent.

Examples of the aryl group having a fluorine atom include an aryl group such as a phenyl group and a naphthyl group in which at least one hydrogen atom has been substituted by a fluorine atom. This group may have another substituent.

Next, specific examples of the alkyl group having a fluorine atom, the cycloalkyl group having a fluorine atom and the aryl group having a fluorine atom will be presented, though the invention is not restricted thereto.

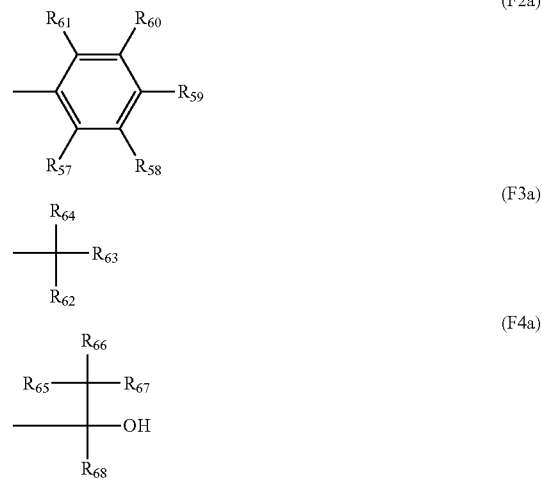

In the general formulae (F2a) to (F24), $R_{57}$ to $R_{68}$ each independently represents a hydrogen atom, fluorine atom or an alkyl group, provided that at least one of $R_{57}$ to $R_{61}$, at least one of $R_{62}$ to $R_{64}$, and at least one of $R_{65}$ to $R_{68}$ each represents a fluorine atom or an alkyl group (preferably having from 1 to 4 carbon atoms) in which at least one hydrogen atom has been substituted by a fluorine atom. It is preferred that all of $R_{57}$ to $R_{61}$ and $R_{65}$ to $R_{67}$ are fluorine atoms. It is preferable that $R_{62}$ to $R_{64}$ and $R_{68}$ are each an alkyl group (preferably having from 1 to 4 carbon atoms) in which at least one hydrogen atom has been substituted by a fluorine atom and more preferably a perfluoroalkyl group having from 1 to 4 carbon atoms. $R_{62}$ and $R_{63}$ may be bonded to each other to form a ring.

Specific examples of the group represented by the general formula (F2a) include a p-fluorophenyl group, a pentafluorophenyl group, a 3,5-di(trifluoromethyl)phenyl group and so on.

Specific examples of the group represented by the general formula (F3a) include a trifluoroethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and so on. More preferable examples are a hexafluoroisopropyl group, a heptafluoroisopropyl group, a hexafluoro(2-methyl)isopropyl group, an octafluoroisobutyl group, a nonafluoro-t-butyl group and a perfluoroisopentyl group. Moreover, a hexafluoroisopropyl group or a heptafluoroisopropyl group is more preferred.

Specific examples of the group represented by the general formula (F4a) include —C(CF$_3$)$_2$OH, —C(C$_2$F$_5$)$_2$OH, —C(CF$_3$)(CH$_3$)OH, —CH(CF$_3$)OH and so on. —C(CF$_3$)$_2$OH is preferred.

As the fluorine-containing partial structure, it is preferable that the resin (D) has an alkylsilyl structure (preferably trialkylsilyl group) or a cyclic siloxane structure.

Specific examples of the alkylsilyl structure or the cyclic siloxane structure include groups represented by following general formulae (CS-1) to (CS-3).

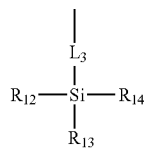

(CS-1)

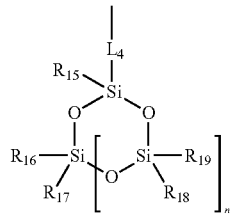

(CS-2)

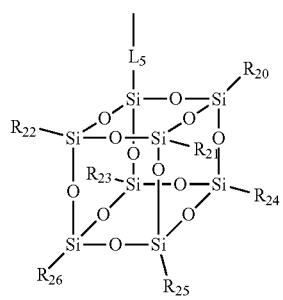

(CS-3)

In the general formulae (CS-1) to (CS-3), R$_{12}$ to R$_{26}$ each independently represents a linear or branched alkyl group (preferably having from 1 to 20 carbon atoms) or a cycloalkyl group (preferably having from 3 to 20 carbon atoms).

L$_3$ to L$_5$ each represents a single bond or a divalent linking group. Examples of the divalent linking group include one member or a combination of two or more thereof selected form the group consisting of an alkylene group, a phenylene group, an ether group, a thioether group, a carbonyl group, an ester group, an amide group, a urethane group and a ureylene group.

n represents an integer of from 1 to 5.

As an example of the resin (D), there can be enumerated a resin having at least one repeating units selected from the group consisting of the repeating units represented by the following general formulae (C-I) to (C-V).

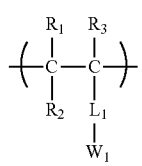

(C-I)

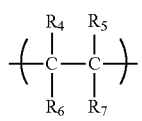

(C-II)

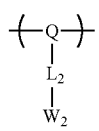

(C-III)

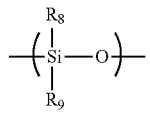

(C-IV)

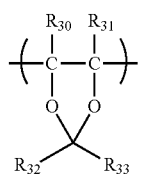

(C-V)

In the general formulae (C-I) to (C-V), R$_1$ to R$_3$ each independently represents a hydrogen atom, an alkyl group (preferably having from 1 to 4 carbon atoms) or a fluoroalkyl group (preferably having from 1 to 4 carbon atoms).

W$_1$ and W$_2$ each independently represents an organic group having at least one of fluorine and silicon atoms.

R$_4$ to R$_7$ each independently represents a hydrogen atom, a fluorine atom, an alkyl group (preferably having from 1 to 4 carbon atoms) or a fluoroalkyl group (preferably having from 1 to 4 carbon atoms), provided that at least one of R$_4$ to R$_7$ represents a fluorine atom. R$_4$ and R$_5$ or R$_6$ and R$_7$ may be bonded to form a ring.

R$_8$ represents a hydrogen atom or an alkyl group (preferably having from 1 to 4 carbon atoms).

R$_9$ represents an alkyl group (preferably having from 1 to 4 carbon atoms) or a fluoroalkyl group (preferably having from 1 to 4 carbon atoms).

L$_1$ and L$_2$ each independently represents a single bond or a divalent linking group being the same as L$_3$ to L$_5$.

Q represents a monocyclic or polycyclic aliphatic group. Namely, it represents an atomic group containing two carbon atoms bonded to each other (C—C) for forming an alicyclic structure.

R$_{30}$ and R$_{31}$ each independently represents a hydrogen atom or a fluorine atom.

$R_{32}$ and $R_{33}$ each independently represents an alkyl group, a cycloalkyl group, a fluoroalkyl group or a fluorocycloalkyl group.

It is to be noted that the repeating unit represented by the general formula (C-V) has at least one fluorine atom in at least one of $R_{30}$, $R_{31}$, $R_{32}$ and $R_{33}$.

It is preferable that the resin (D) has a repeating unit represented by the general formula (C-I), more preferably a repeating unit represented by any of the following general formulae (C-Ia) to (C-Id).

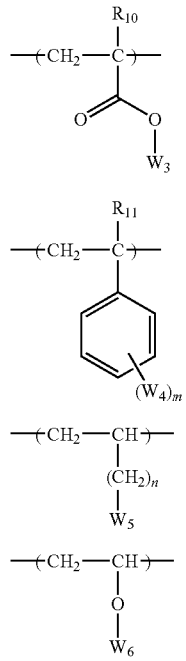

In the general formulae (C-Ia) to (C-Id), $R_{10}$ and $R_{11}$, each represents a hydrogen atom, an alkyl group (preferably having from 1 to 4 carbon atoms) or a fluoroalkyl group (preferably having from 1 to 4 carbon atoms).

$W_3$, $W_5$ and $W_6$ each represents an organic group having at least one of fluorine and silicon atoms.

$W_4$ represents a fluorine atom or an organic group having at least one of fluorine and silicon atoms.

m represents an integer of from 1 to 5.

n represents 0 or 1.

In the case where $W_1$ to $W_6$ are each an organic group having at least one of fluorine and silicon atoms, preferable examples thereof include linear or branched fluorinated alkyl group having from 1 to 20 carbon atoms or linear, branched or cyclic fluorinated alkyl ether group having from 1 to 20 carbon atoms.

Examples of the fluoroalkyl group represented by $W_1$ to $W_6$ include a trifluoroethyl group, a pentafluoropropyl group, a hexafluoroisopropyl group, a hexafluoro(2-methyl)isopropyl group, a heptafluorobutyl group, a heptafluoroisopropyl group, an octafluoroisobutyl group, a nonafluorohexyl group, a nonafluoro-t-butyl group, a perfluoroisopentyl group, a perfluorooctyl group, a perfluoro(trimethyl)hexyl group and so on.

In the case where $W_1$ to $W_6$ are each a silicon-containing organic group, an alkylsilyl structure or a cyclic siloxane structure is preferred. Specific examples of the alkylsilyl structure include groups represented by the general formulae (CS-1) to (CS-3) as described above.

Next, specific examples of the repeating unit represented by the general formula (C-I) will be presented, wherein X represents a hydrogen atom, —$CH_3$, —F or —$CF_3$.

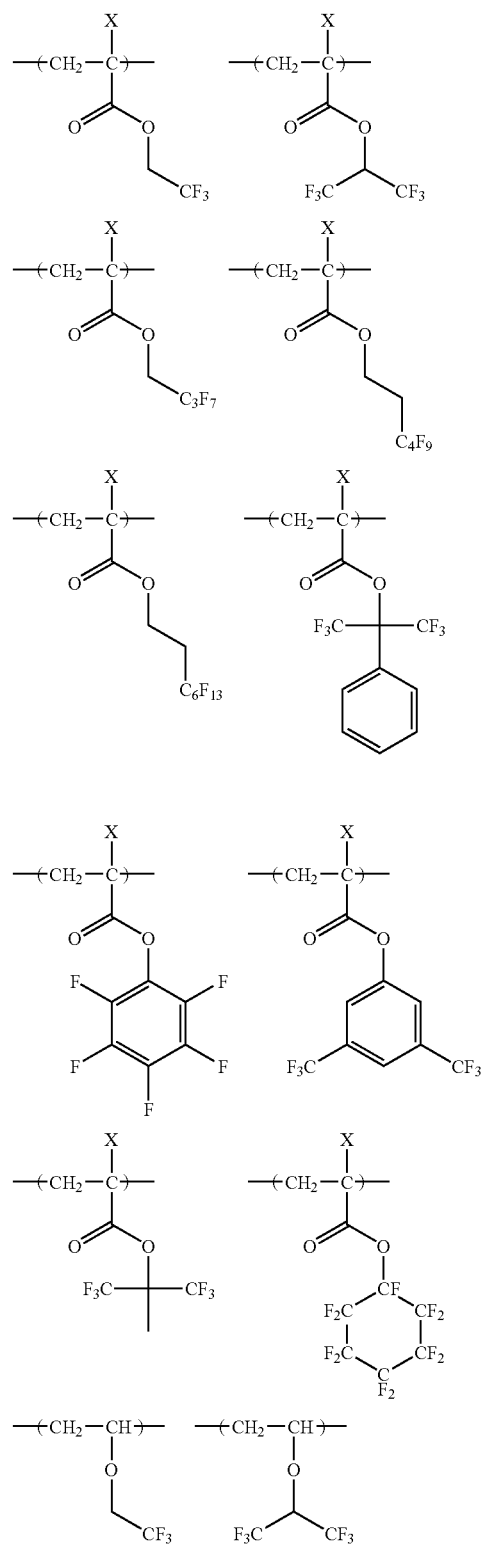

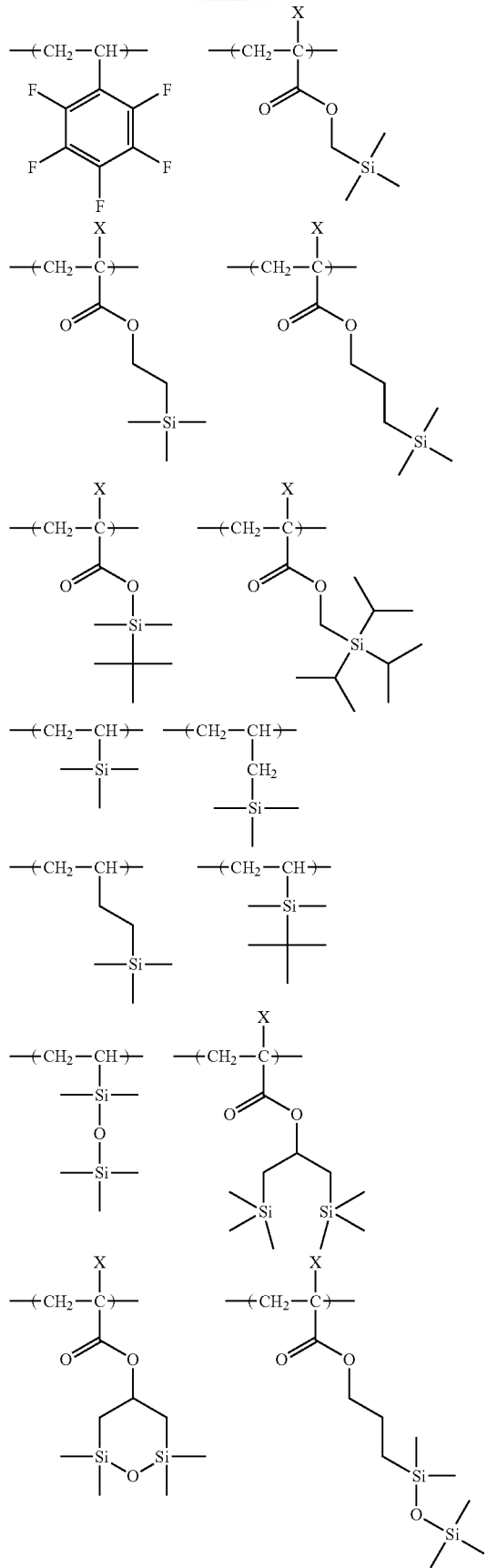
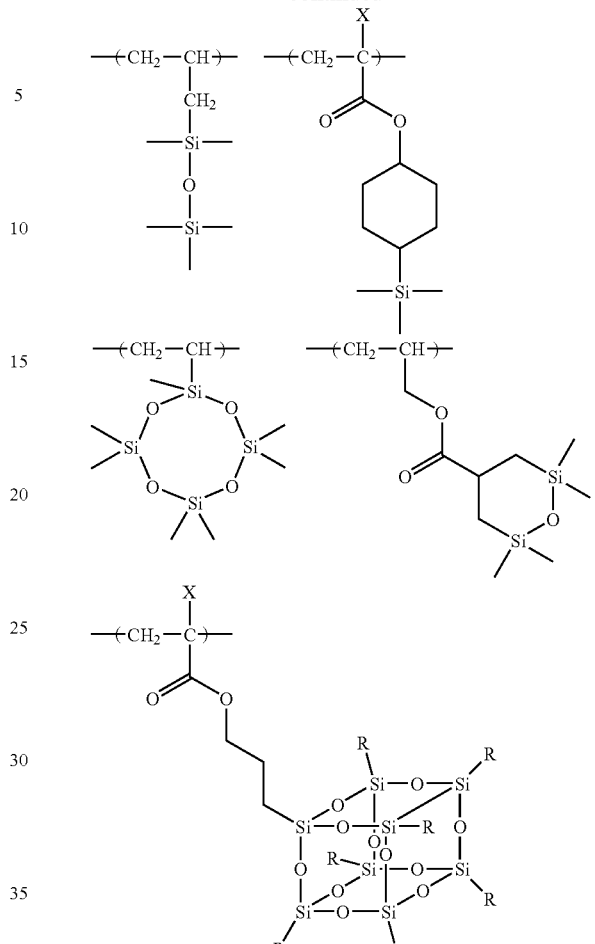

R = CH₃, C₂H₅, C₃H₇, C₄H₉

It is preferable that the resin (D) is one resin selected from among the following (D-1) to (D-6).

(D-1) A resin containing (a) a repeating unit having a fluoroalkyl group (preferably having 1 to 4 carbon atoms), more preferably containing only the repeating unit (a).

(D-2) A resin containing (b) a repeating unit having a trialkylsilyl group or a cyclic siloxane structure, more preferably containing only the repeating unit (b).

(D-3) A resin containing (a) a repeating unit having a fluoroalkyl group (preferably having 1 to 4 carbon atoms) and (c) a repeating unit having a branched alkyl group (preferably having 4 to 20 carbon atoms), a cycloalkyl group (preferably having 4 to 20 carbon atoms), a branched alkenyl group (preferably having 4 to 20 carbon atoms), a cycloalkenyl group (preferably having 4 to 20 carbon atoms) or an aryl group (preferably having 4 to 20 carbon atoms), more preferably a copolymerization resin of the repeating unit (a) and the repeating unit (c).

(D-4) A resin containing (b) a repeating unit having a trialkylsilyl group or a cyclic siloxane structure and (c) a repeating unit having a branched alkyl group (preferably having 4 to 20 carbon atoms), a cycloalkyl group (preferably having 4 to 20 carbon atoms), a branched alkenyl group (preferably having 4 to 20 carbon atoms), a cycloalkenyl group (preferably having 4 to 20 carbon atoms) or an aryl group (preferably having 4 to 20 carbon atoms), more preferably a copolymerization resin of the repeating unit (b) and the repeating unit (c).

(D-5) A resin containing (a) a repeating unit having a fluoroalkyl group (preferably having 1 to 4 carbon atoms) and (b) a repeating unit having a trialkylsilyl group or a cyclic siloxane structure, more preferably a copolymerization resin of the repeating unit (a) and the repeating unit (b).

(D-6) A resin containing (a) a repeating unit having a fluoroalkyl group (preferably having 1 to 4 carbon atoms), (b) a repeating unit having a trialkylsilyl group or a cyclic siloxane structure, and (c) a repeating unit having a branched alkyl group (preferably having 4 to 20 carbon atoms), a cycloalkyl group (preferably having 4 to 20 carbon atoms), a branched alkenyl group (preferably having 4 to 20 carbon atoms), a cycloalkenyl group (preferably having 4 to 20 carbon atoms) or an aryl group (preferably having 4 to 20 carbon atoms), more preferably a copolymerization resin of the repeating unit (a), the repeating unit (b) and the repeating unit (c).

As the repeating unit (c) having a branched alkyl group, a cycloalkyl group, a branched alkenyl group, a cycloalkenyl group or an aryl group in the resins (D-3), (D-4) and (D-6) include, an appropriate functional group can be introduced while considering hydrophilicity/hydrophobicity, interaction and the like. From the standpoints of the followability for the immersion liquid and receding contact angle, a functional group having no polar group is preferred therefor.

In the resins (D-3), (D-4) and (D-6), the content of the repeating unit (a) having a fluoroalkyl group and/or the repeating unit (b) having a trialkylsilyl group or a cyclic siloxane structure is preferably from 20 to 99% by mol.

It is preferable that the resin (D) is a resin having a repeating unit represented by the following formula (Ia).

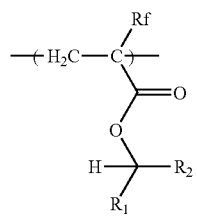
(Ia)

In the general formula (Ia), Rf represents a fluorine atom or an alkyl group in which at least one hydrogen atom has been substituted by a fluorine atom.

$R_1$ represents an alkyl group.

$R_2$ represents a hydrogen atom or an alkyl group.

In the general formula (Ia), the alkyl group Rf in which at least one hydrogen atom has been substituted by a fluorine atom is preferably an alkyl group having from 1 to 3 carbon atoms and trifluoromethyl group is more preferable.

The alkyl group of $R_1$ is preferably a linear or branched alkyl group having from 3 to 10 carbon atoms, more preferably a branched alkyl group having from 3 to 10 carbon atoms.

The alkyl group of $R_2$ is preferably a linear or branched alkyl group having from 1 to 10 carbon atoms, and more preferably a linear or branched alkyl group having from 3 to 10 carbon atoms.

Next, specific examples of the repeating unit represented by the general formula (Ia) will be presented, but the invention is not restricted thereto.

X represents F or $CF_3$.

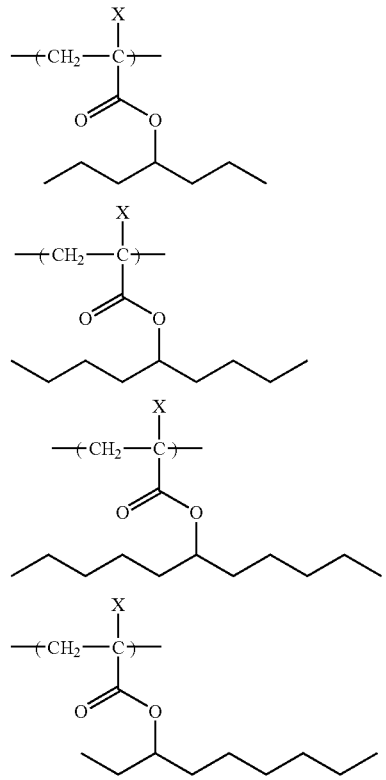

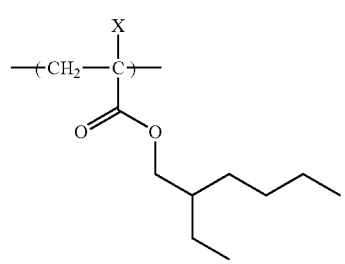

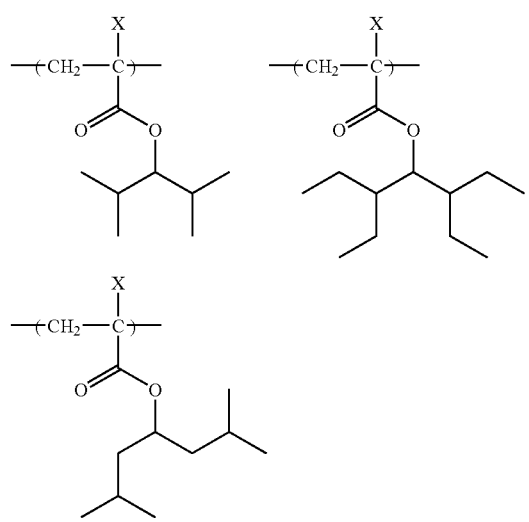

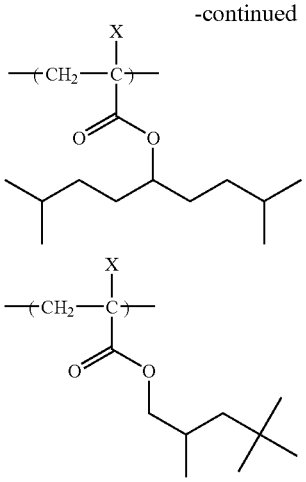

The repeating unit represented by the general formula (Ia) can be formed by polymerizing a compound represented by the following general formula (I).

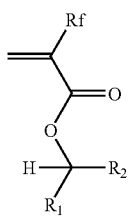
(I)

In the general formula (I), Rf represents a fluorine atom or an alkyl group in which at least one hydrogen atom has been substituted by a fluorine atom.

$R_1$ represents an alkyl group.

$R_2$ represents a hydrogen atom or an alkyl group.

In the general, formula (I), Rf, $R_1$ and $R_2$ have the same meanings as Rf, $R_1$ and $R_2$ in the general formula (Ia).

As the compound represented by the general formula (I), either a commercially available product or a compound synthesized may be used. In the case of synthesizing the compound, this can be attained by converting 2-trifluoromethyl methacrylic acid into an acid chloride and then esterifying the acid chloride.

The resin (D) having the repeating unit represented by the general formula (Ia) preferably further contains a repeating unit represented by the following formula (III).

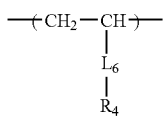
(III)

In the general formula (III), $R_4$ represents an alkyl group, a cycloalkyl group, an alkenyl group, a cycloalkenyl group, a trialkylsilyl group or a group having a cyclic siloxane structure.

$L_6$ represents a single bond or a divalent linking group.

In the general formula (III), the alkyl group of $R_4$ is preferably a linear or branched alkyl group having from 3 to 20 carbon atoms.

The cycloalkyl group is preferably a cycloalkyl group having from 3 to 20 carbon atoms.

The alkenyl group is preferably an alkenyl group having from 3 to 20 carbon atoms.

The cycloalkenyl group is preferably a cycloalkenyl group having from 3 to 20 carbon atoms.

The trialkylsilyl group is preferably a trialkylsilyl group having from 3 to 20 carbon atoms.

The group having a cyclic siloxane structure is preferably a group containing a cyclic siloxane structure having from 3 to 20 carbon atoms.

The divalent linking group of $L_6$ is preferably an alkylene group (preferably having from 1 to 5 carbon atoms) or an oxy group.

Next, specific examples of the resin (D) having a repeating unit represented by the general formula (Ia) will be presented, though the invention is not limited thereto.

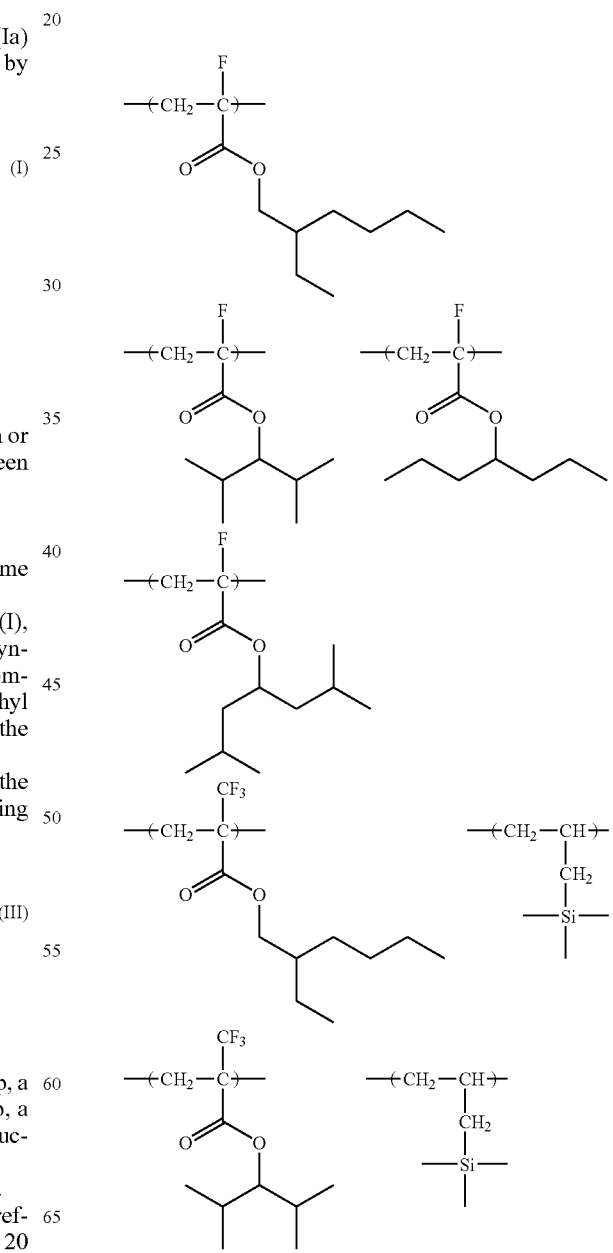

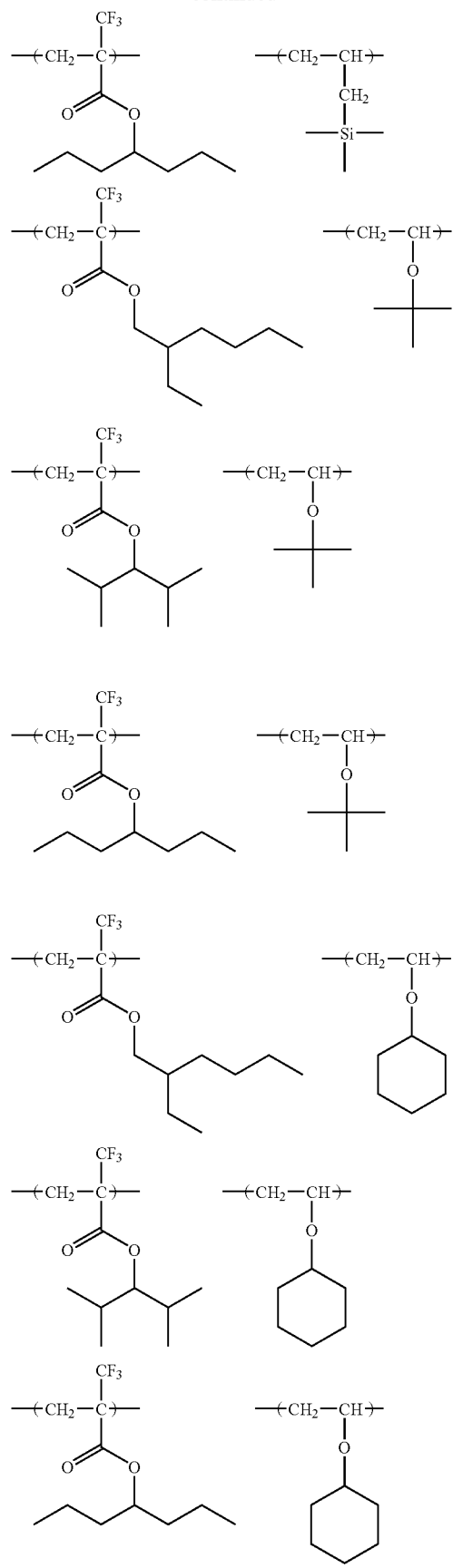
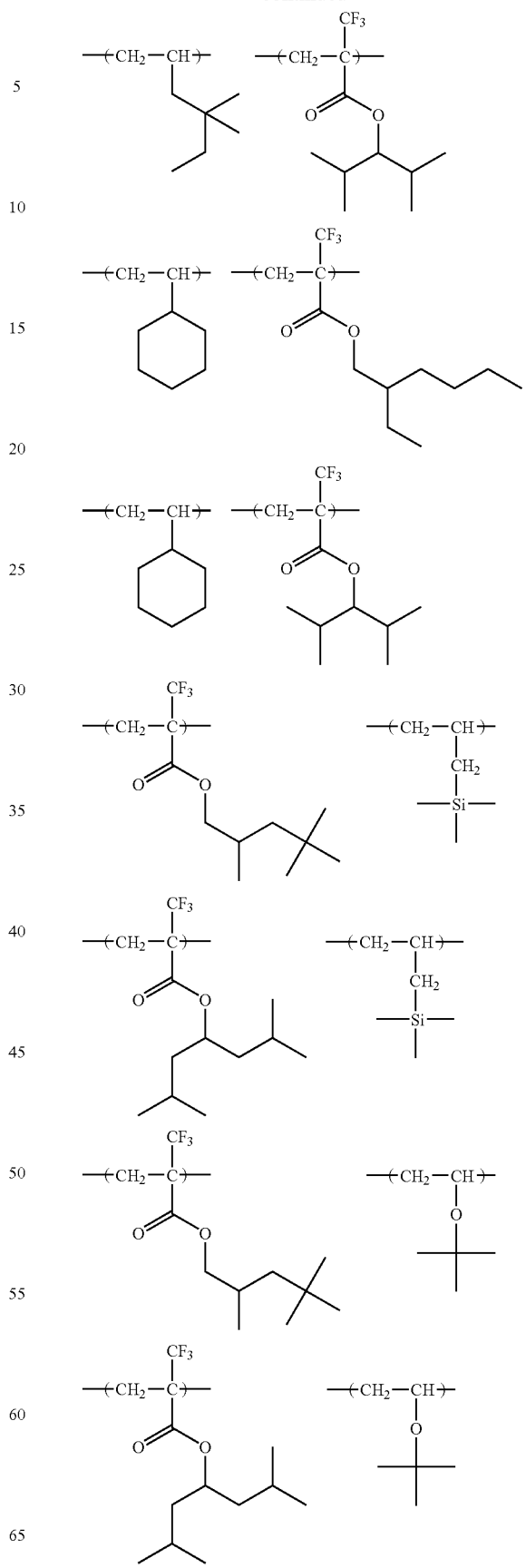

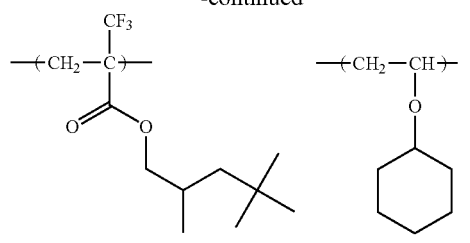
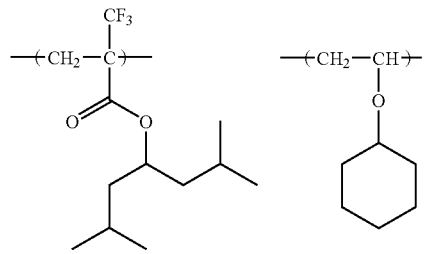
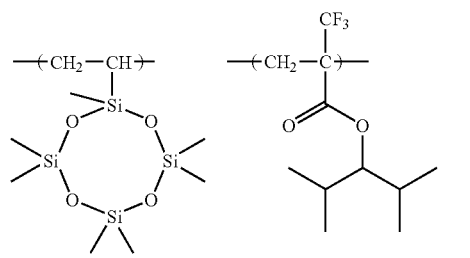
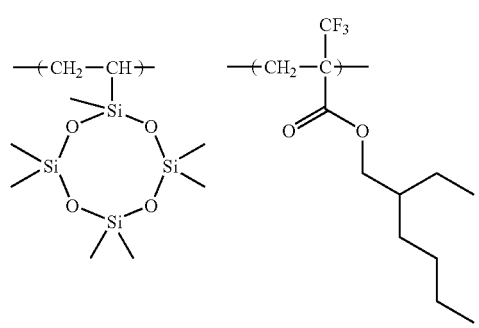
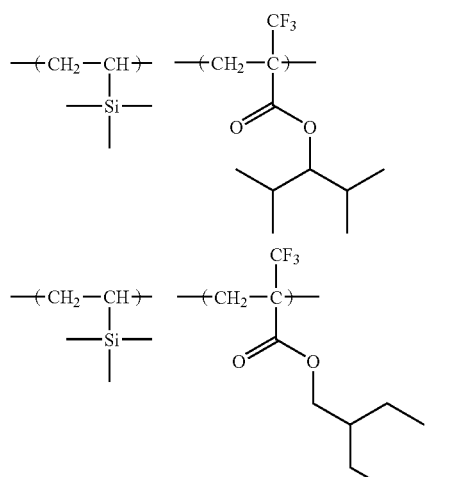
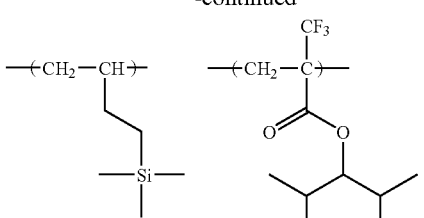
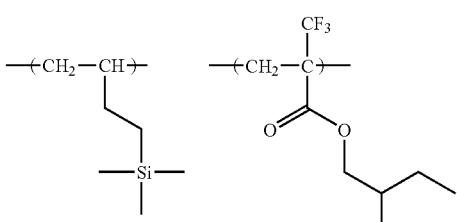
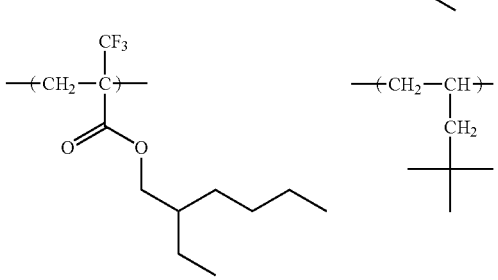
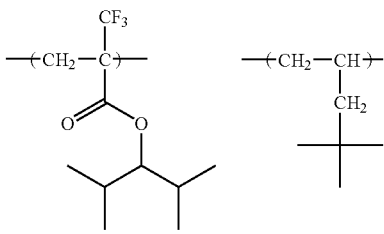
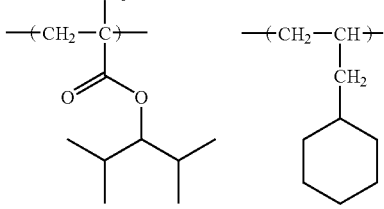
It is preferable that the resin (D) is a resin containing a repeating unit represented by the following general formula (II) and a repeating unit represented by the following general formula (III).
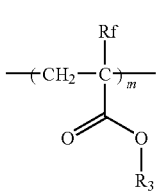
(II)

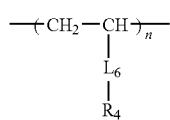 (III)

In the general formulae (II) and (III), Rf represents a fluorine atom or an alkyl group in which at least one hydrogen atom has been substituted by a fluorine atom.

$R_3$ represents an alkyl group, a cycloalkyl group, an alkenyl group or a cycloalkenyl group, or a group formed by bonding two or more of these groups.

$R_4$ represents an alkyl group, a cycloalkyl group, an alkenyl group, a cycloalkenyl group, a trialkylsilyl group or a group having a cyclic siloxane structure, or a group formed by bonding two or more of these groups.

Each of the alkyl group, cycloalkyl group, alkenyl group, cycloalkenyl group and trialkylsilyl group of $R_3$ and $R_4$ may have an appropriate functional group having been introduced thereinto. However, in view of followability of the immersion liquid, the functional group is preferably free of a polar group and more preferably unsubstituted.

$L_6$ represents a single bond or a divalent linking group.

m and n each represents the molar ratio of the corresponding repeating unit, provided that 0<m<100 and 0<n<100.

In the general formula (II), Rf has the same meaning as Rf in the general formula (Ia).

The alkyl group of $R_3$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

$L_6$ represents preferably a single bond, a methylene group, an ethylene group or an ether group.

It is preferable that m is from 30 to 70 and n is from 30 to 70, more preferably m is from 40 to 60 and n is from 40 to 60.

Next, specific examples of the resin (D) having a repeating unit represented by the general formula (II) and a repeating unit represented by the general formula (III) will be presented, but the invention is not limited thereto.

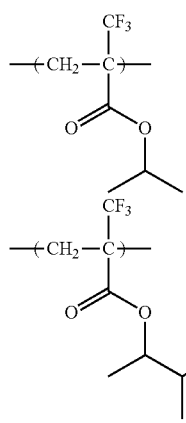

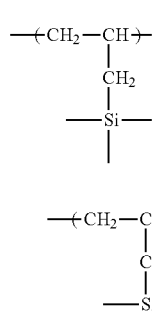

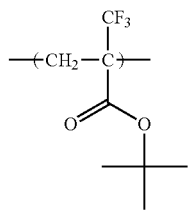

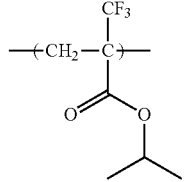

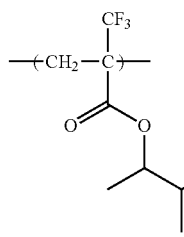

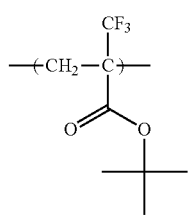

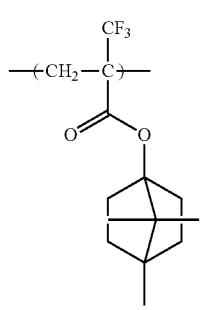

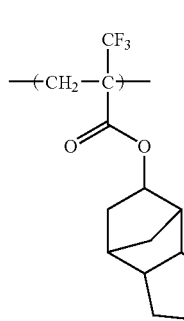

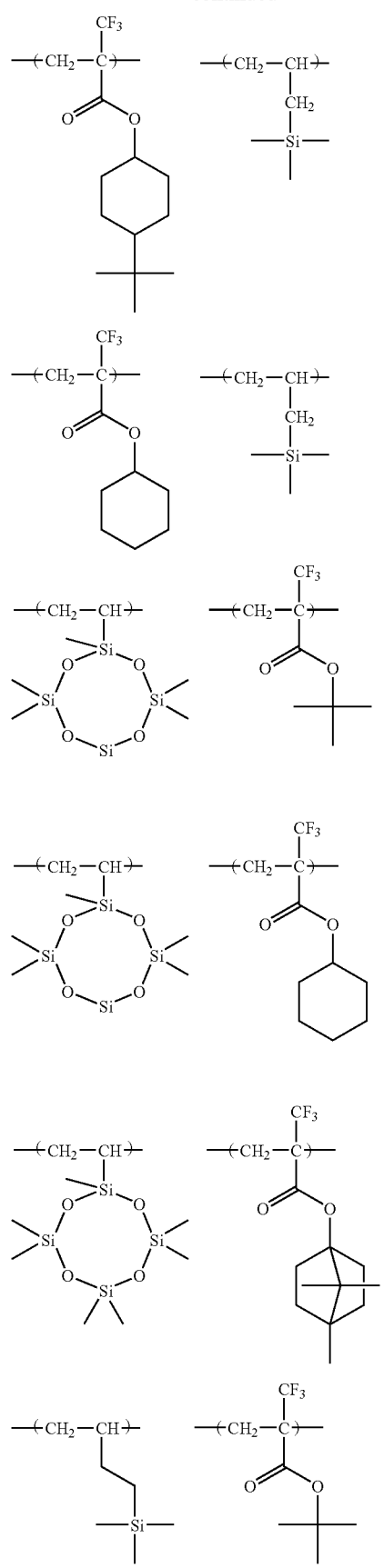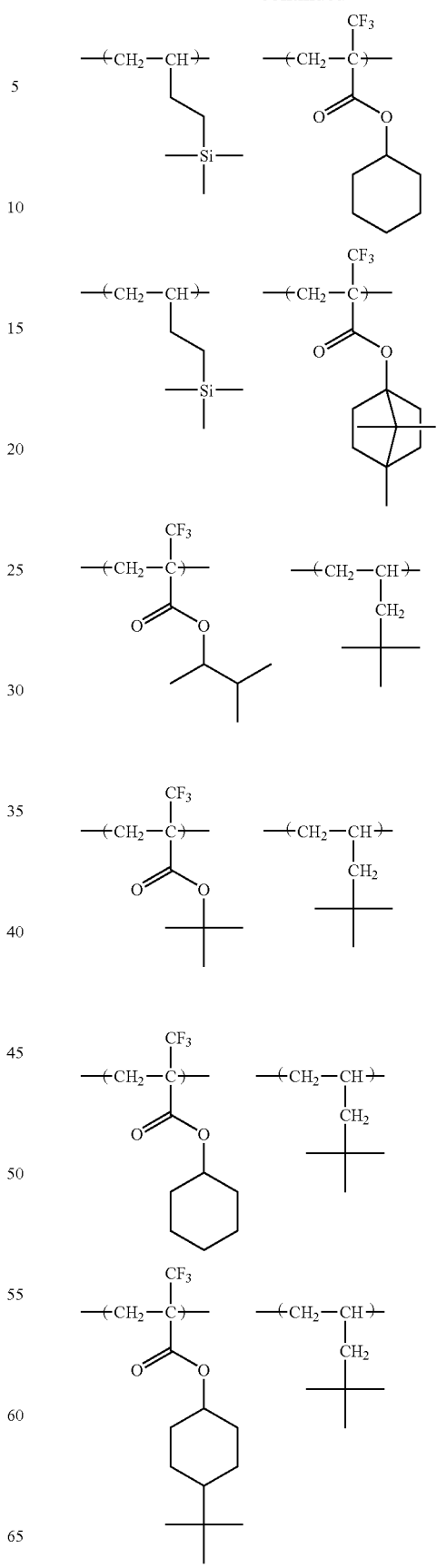

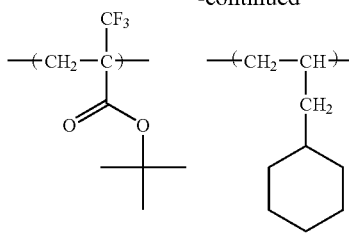

The resin (D) may have a repeating unit represented by the following general formula (VIII).

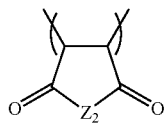

(VIII)

In the general formula (VIII), $Z_2$ represents —O— or —N($R_{41}$)— wherein $R_{41}$ represents a hydrogen atom, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably a fluorine atom) or the like.

It is preferable that the resin (D) is solid at room temperature (25° C.). Furthermore, the glass transition temperature (Tg) thereof is preferably from 50 to 200° C., more preferably from 80 to 160° C.

The resin being solid at 25° C. means that the melting point is 25° C. or higher.

The glass transition temperature (Tg) can be measured by a scanning calorimeter (Differential Scanning Calorimeter). For example, it can be determined by after heating a sample and then cooling, analyzing the change in the specific volume when the sample is heated again at 5° C./min.

It is preferable that the resin (D) is stable to an acid and insoluble in an alkali developing solution.

From the viewpoint of followability of the immersion liquid, it is preferable that the resin (D) is free from (x) an alkali-soluble group, (y) a group which decomposes by the action of an alkali (alkali developing solution) to increase the solubility in an alkali developing solution and (z) a group which decomposes by the action of an acid to increase the solubility in a developing solution.

In the resin (D), the total amount of repeating units having an alkali-soluble group or a group the solubility of which in a developing solution increases by the action of an acid or an alkali is preferably 20% by mol or less, more preferably from 0 to 10% by mol, still more preferably from 0 to 5% by mol, based on all repeating units constituting the resin (D).

Also, different from a surfactant generally used for resists, the resin (D) contains no ionic bond or hydrophilic group such as (poly(oxyalkylene)) group. In the case where the resin (D) contains a hydrophilic polar group, the followability of the immersion liquid tends to decrease. Therefore, it is more preferred that the resin (D) has no polar group selected from a hydroxyl group, alkylene glycols and a sulfone group. It is furthermore preferable that the resin (D) has no ether group bonded to the carbon atom of the main chain through a linking group, since such an ether group causes an increase in the hydrophilicity and, in its turn, deterioration in the followability of immersion liquid. On the other hand, an ether group bonded directly to the carbon atom of the main chain as in the above formula (C-Id) is preferred, because such an ether group can sometimes express an activity as a hydrophobic group.

Examples of (x) the alkali-soluble group include groups having a phenolic hydroxyl group, a carboxylate group, a fluoro alcohol group, a sulfonate group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group and so on.

Examples of (y) the group capable of decomposing by the action of an alkali (alkali developing solution) to increase the solubility in an alkali developing solution include a lactone group, an ester group, a sulfonamide group, an acid anhydride and an acid imide group.

Examples of (z) the group capable of decomposing by the action of an acid to increase the solubility in a developing solution include the same groups as those of the acid-decomposable group in the resin (A).

However, the repeating unit represented by the following general formula (pA-C) is not or scarcely decomposed by the action of an acid as compared with the acid-decomposable group of the resin (A) and, therefore is regarded as being substantially non-acid-decomposable.

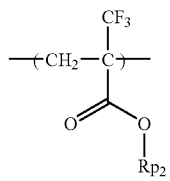

(pA-c)

In the general formula (pA-c), $R_{p2}$ represents a hydrocarbon group having a tertiary carbon atom bonded to the oxygen atom in the formula.

In the case where the resin (D) contains a silicon atom, the silicon atom content is preferably from 2 to 50% by mass, more preferably from 2 to 30% by mass, based on the molecular weight of the resin (D). Also, the silicon atom-containing repeating unit preferably amounts to from 10 to 100% by mass, more preferably from 20 to 100% by mass, in the resin (D).

In the case where the resin (D) contains a fluorine atom, the fluorine atom content is preferably from 5 to 80% by mass, more preferably from 10 to 80% by mass, based on the molecular weight of the resin (D). Also, the fluorine atom-containing repeating unit preferably amounts to from 10 to 100% by mass, more preferably from 30 to 100% by mass, in the resin (D).

The weight-average molecular weight of the resin (D) calculated in terms of polystyrene is preferably from 1,000 to 100,000, more preferably from 1,000 to 50,000, still more preferably from 2,000 to 15,000, particularly more preferably from 3,000 to 15,000.

The residual monomer amount in the resin (D) is preferably from 0 to 10% by mass, more preferably from 0 to 5% by mass, still more preferably from 0 to 1% by mass. Also, From the viewpoints of the resolution, resist profile and side wall, roughness or the like of the resist pattern, the molecular weight distribution (Mw/Mn, also called degree of dispersion) is preferably from 1 to 5, more preferably from 1 to 3, still more preferably from 1 to 1.5.

The amount of the resin (D) added in the resist composition is preferably from 0.1 to 20% by mass, and more preferably from 0.1 to 10% by mass, based on the total solid content of the resist composition. Furthermore, from 0.1 to 5% by mass is preferred, from 0.2 to 3.0% by mass is more preferred, and from 0.3 to 2.0% by mass is still more preferred.

Similar to the resin (A), it is preferable, as a matter of course, that the resin (D) contains only a minute amount of impurities such as metals. It is also preferable that the resin (D) contains the residual monomers and oligomer components at a definite level or less, for example, 0.1% by mass or less determined by HPLC. Thus, not only the sensitivity, resolution, process stability, pattern shape, etc. as a resist can be further improved but also the obtained resist is free from contaminants in the liquid or changes in sensitivity with the passage of time.

As the resin (D), use can be made of a commercially available product. Alternatively, it can be synthesized in accordance with a commonly employed method (for example, radical polymerization). Examples of the synthesis method commonly employed include a bulk polymerization method which includes dissolving monomer species and an initiator in a solvent and heating to thereby conduct polymerization, a drop polymerization method which includes dropping a solution of monomer species and an initiator to a heated solvent over 1 to 10 hours, and so on. Examples of the reaction solvent include tetrahydrofuran, 1,4-dioxane, ethers such as diisopropyl ether, ketones such as methyl ethyl ketone and methyl isobutyl ketone, ester solvents such as ethyl acetate, amide solvents such as dimethylformamide and dimethylacetamide, and solvents in which the composition according to the invention is soluble as will be discussed hereinafter, for example, propylene glycol monomethyl ether acetate, propylene glycol monomethyl ether and cyclohexanone. It is more preferable to employ the same solvent as the one used in the resist composition according to the invention so that the occurrence of particles can be prevented during preservation.

It is preferred to conduct the polymerization under an inert gas atmosphere such as nitrogen or argon. As the polymerization initiator, a commercially available radical initiator (an azo type initiator, a peroxide, etc.) is used to initiate the polymerization. As the radical initiator, an azo type initiator is preferable. An azo type initiator having an ester group, a cyano group or a carboxyl group is preferred. Preferable examples of the initiator include azobisisobutyronitrile, azobisdimethylvaleronitrile, dimethyl 2,2'-azobis(2-methylpropionate) and so on. It is also possible to use a chain transfer if necessary. The reaction concentration is from 5 to 50% by mass, preferably from 20 to 50% by mass and more preferably from 30 to 50% by mass. The reaction temperature is usually from 10° C. to 150° C., preferably from 30° C. to 120° C. and more preferably from 60° C. to 100° C.

After the completion of the reaction, the reaction solution is cooled to room temperature by allowing to stand and then purified. For the purification, use can be made of a commonly employed method, for example, water washing, the liquid-liquid extraction method which includes combining appropriate solvents and thus removing the residual monomers and oligomer components, the purification method in the solution state which includes conducting ultrafiltration to thereby extract and remove components having a specific molecular weight or less, the reprecipitation method which includes dropping the resin solution into a poor solvent, thus solidifying the resin in the poor solvent and separating the residual monomers and the like, and the purification method in the solid state which includes filtering the resin slurry and washing with a poor solvent. For example, the reaction solution is brought into contact with a solvent (a poor solvent), in which the above resin is hardly or not soluble, in an amount of not more than 10 times by volume, preferably from 5 to 10 times by volume, as much as the reaction solution so that the resin is precipitated as a solid.

The solvent to be used in the precipitation or reprecipitation from the polymer solution (precipitation or reprecipitation solvent) may be an arbitrary one so long as it is a poor solvent to the polymer. It may be appropriately selected from, for example, a hydrocarbon (for example, an aliphatic hydrocarbon such as pentane, hexane, heptane and octane; an alicyclic hydrocarbon such as cyclohexane and methylcyclohexane; an aromatic hydrocarbon such as benzene, toluene and xylene), a halogenated hydrocarbon (for example, a halogenated aliphatic hydrocarbon such as methylene chloride, chloroform and carbon tetrachloride; a halogenated aromatic hydrocarbon such as chlorobenzene and dichlorobenzene), a nitro compound (for example, nitromethane, nitroethane), a nitrile (for example, acetonitrile, benzonitrile), an ether (for example, a chain ether such as diethyl ether, diisopropyl ether, dimethoxyethane; and a cyclic ether such as tetrahydrofuran and dioxane), a ketone (for example, acetone, methyl ethyl ketone, diisobutyl ketone), an ester (for example, ethyl acetate, butyl acetate), a carbonate (for example, dimethyl carbonate, diethyl carbonate, ethylene carbonate, propylene carbonate), an alcohol (for example, methanol, ethanol, propanol, isopropyl alcohol, butanol), a carboxylic acid (for example, acetic acid), water, and a mixed solvent containing the same. Among these, the precipitation or reprecipitation solvent is preferably a solvent containing at least an alcohol (particularly methanol or the like) or water. In such a solvent containing at least a hydrocarbon, the ratio of the alcohol (particularly, methanol or the like) to other solvents (for example, an ester such as ethyl acetate, and ethers such as tetrahydrofuran) is, for example, the former/the latter (volume ratio, at 25° C.) ranging from 10/90 to 99/1, preferably the former/the latter (volume ratio, at 25° C.) ranging from 30/70 to 98/2, more preferably the former/the latter (volume ratio, at 25° C.) ranging from 50/50 to 97/3.

The amount of the precipitation or reprecipitation solvent used may be appropriately selected by taking into consideration the efficiency, yield and so on. In general, it is used in an amount of from 100 to 10,000 parts by mass, preferably from 200 to 2,000 parts by mass and more preferably from 300 to 1,000 parts by mass, per 100 parts by mass of the polymer solution.

In the step of feeding the polymer solution into a precipitation or reprecipitation solvent (poor solvent), the nozzle pore diameter is preferably 4 mm or less (for example, from 0.2 to 4 mm) and the feeding rate (dropping rate) of the polymer solution into the poor solvent is, for example, in terms of a linear velocity, from 0.1 to 10 m/sec, preferably from about 0.3 to about 5 msec.

The precipitation or reprecipitation procedure is preferably performed under stirring. Examples of the stirring blade which can be used for the stirring include a disc turbine, a fan turbine (including paddle), a curved vane turbine, an arrow feather turbine, a Pfaudler type, a bull margin type, an angled vane fan turbine, a propeller, a multistage type, an anchor type (or horseshoe type), a gate type, a double ribbon type and a screw type. It is preferable that the stirring is further performed for 10 minutes or more, more preferably 20 minutes or more, after the completion of feeding of the polymer solution. If the stirring time is too short, the monomer content in the polymer particles may not be sufficiently reduced in some cases. The mixing and stirring of the polymer solution and the poor solvent may also be performed by using a line mixer instead of the stirring blade.

Although the temperature at the precipitation or reprecipitation may be appropriately selected by taking into consideration the efficiency or performance, the temperature is usually from about 0 to about 50° C., preferably in the vicinity of room temperature (for example, from about 20 to about 35° C.). The precipitation or reprecipitation procedure may be performed by using a commonly employed mixing vessel such as stirring tank according to a known method such as batch system and continuous system.

The precipitated or reprecipitated particulate polymer is usually subjected to commonly employed solid-liquid separation such as filtration and centrifugation and then dried before using. The filtration is performed by using a solvent-resistant filter material preferably under elevated pressure. The drying is performed under atmospheric pressure or reduced pressure (preferably under reduced pressure) at a temperature of from about 30 to about 100° C., preferably from about 30 to about 50° C.

After the resin is once precipitated and separated, it may be redissolved in a solvent and then brought into contact with a solvent in which the resin is hardly or not soluble.

That is, the method may include, after the completion of radical polymerization reaction, precipitating a resin by bringing the polymer into contact with a solvent in which the polymer is hardly or not soluble (step a), separating the resin from the solution (step b), dissolving the resin in a solvent again to prepare a resin solution A (step c), precipitating a resin solid by bringing the resin solution A into contact with a solvent in which the resin is hardly or not soluble and which is in a volume amount of less than 10 times (preferably a volume amount of 5 times or less) the resin solution A (step d), and separating the precipitated resin (step e).

As the solvent used for the preparation of the resin solution A, the same solvent as the solvent for dissolving the monomer at the polymerization reaction may be used, and the solvent may be the same or different from the solvent used for the polymerization reaction, (E) Basic Compound It is preferable that the resist composition according to the invention contains (E) a basic compound to thereby relieve changes in the properties with the passage of time in the course of from exposure to heating.

As examples of the basic compound, there can be enumerated compounds having structures represented by the following formulae (A) to (E).

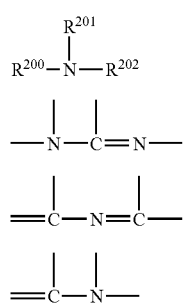

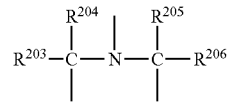

In the general formulae (A) and (E), $R^{200}$, $R^{201}$ and $R^{202}$ may be either the same or different and each represents a hydrogen atom, an alkyl group (preferably having from 1 to 20 carbon atoms), a cycloalkyl group (preferably having from 3 to 20 carbon atoms) or an aryl group (having from 6 to 20 carbon atoms). $R^{201}$ and $R^{202}$ may be bonded together to form a ring.

These groups may have a substituent. Preferable examples of the alkyl group having a substituent include an aminoalkyl group (preferably having from 1 to 20 carbon atoms), a hydroxyalkyl group (preferably having from 1 to 20 carbon atoms) and a cyanoalkyl group (preferably having from 1 to 20 carbon atoms).

$R^{203}$, $R^{204}$, $R^{205}$ and $R^{206}$ may be either the same or different and each represents an alkyl group (preferably having from 1 to 20 carbon atoms).

The alkyl groups in the general formulae (A) and (E) are preferably unsubstituted alkyl groups.

Preferable compounds include guanidine, iminopyrrolidine, pyrazole, pyrazoline, piperazine, aminomorpholine, aminoalkylmolpholine, piperidine and so on. More preferable compounds include a compound having an imidazole structure, a diazabicyclo structure, an onium hydroxide structure, an onium carboxylate structure, a trialkylamine structure, an aniline structure or a pyridine structure, an alkylamine derivative having a hydroxyl group and/or an ether bond, an aniline derivative having a hydroxyl structure and/or an ether bond and so on.

Examples of the compound having an imidazole structure include imidazole, 2,4,5-triphenylimidazole, benzimidazole and so on. Examples of the compound having a diazabicyclo structure include 1,4-diazabicyclo[2,2,2]octane, 1,5-diazabicyclo[4,3,0]nona-5-ene, 1,8-diazabicyclo[5,4,0]undeca-7-ene and so on. Examples of the compound having an onium hydroxide structure include triarylsulfonium hydroxide, phenacylsulfonium hydroxide, a sulfonium hydroxide having a 2-oxoalkyl group (more specifically, triphenylsulfonium hydroxide, tris(t-butylphenyl)sulfonium hydroxide, bis(t-butylphenyl)iodonium hydroxide, phenacylthiophenium hydroxide or 2-oxopropylthiophenium hydroxide) and so on. Examples of the compound having an onium carboxylate structure include a compound in which the anion moiety of a compound having an onium hydroxide structure has been converted into carboxylate such as acetate, adamantane-1-carboxylate and perfluoroalkyl carboxylate. Examples of the compound having a trialkylamine structure include tri(n-butyl)amine, tri(n-octyl)amine and so on. Examples of the aniline compound include 2,6-diisopropylaniline, N,N-dimethylaniline, N,N-dioctylaniline and so on. Examples of the alkylamine derivative having a hydroxyl structure and/or an ether bond include ethanolamine, diethanolamine, triethanolamine, tris(methoxyethoxyethyl)amine and so on. Examples of the aniline derivative having a hydroxyl structure and/or an ether bond include N,N-bis(hydroxyethyl)aniline and so on.

Either one of these basic compounds or a combination of two or more of the same may be used.

The basic compound is used in an amount of usually from 0.001 to 10% by mass, preferably from 0.01 to 5% by mass, based on the solid matters in the resist composition.

It is preferable that the acid-generating agent and the basic compound are used in the composition at an acid-generating agent/basic compound ratio by mol of from 2.5 to 300. That is to say, a molar ratio of 2.5 or more is preferred from the viewpoints of sensitivity and resolution, while a ratio of 300 or less is preferred form the viewpoint of preventing lowering in the resolution caused by thickening of the resist pattern with the passage of time in the course of from exposure to heating. The acid-generating agent/basic compound ratio by mol preferably ranges 5.0 t 200 and more preferably from 7.0 to 150.

(F) Surfactant

It is preferable that the resist composition according to the invention contains (F) a surfactant. More preferably, it contains one or more surfactants selected from among fluorine-based and/or silicon-based surfactants (a fluorine-based surfactant, a silicon-based surfactant and a surfactant having both of fluorine and silicon atoms).

Owing to the (F) surfactant contained in the resist composition according to the invention, it becomes possible to present a resist pattern having a favorable sensitivity and resolution and a high adhesiveness and suffering from little development failures in the cause of using an exposure light source of 250 nm or less, in particular, 220 nm or less.

Examples of such fluorine and/or silicon-based surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. No. 5,405,720, U.S. Pat. No. 5,360,692, U.S. Pat. No. 5,529,881, U.S. Pat. No. 5,296,330, U.S. Pat. No. 5,436,098, U.S. Pat. No. 5,576,143, U.S. Pat. No. 5,294,511 and U.S. Pat. No. 5,824,451. It is also possible to employ commercially available surfactants as will be shown below as such.

Examples of the commercially available surfactants usable herein include fluorine and/or silicon-based surfactants such as Eftops EF301 and EF 303 (manufactured by Shin-Akita Kasei K.K.), Florads FC430, 431 and 4430 (manufactured by Sumitomo 3M, Inc.), Megafacs F171, F173, F176, F189, F113, F110, F177, F120 and R08 (manufactured by Dainippon Ink & Chemicals, Inc.), Surflons S-382, SC101, 102, 103, 104, 105 and 106 (manufactured by Asahi Glass Co., Ltd.), Troysol S-366 (manufactured by Troy Chemical Industries, Inc.), GF-130 and OF-150 (manufactured by TOA GOSEI Co., Ltd.), Surflon S-393 (manufactured by AGC SEIMI CHEMICAL Co., Ltd.), Eftops EF121, EF122A, EF122B, RF122C, EF125M, EF135M, EF351, 352, EF801, EF802 and EF601 (manufactured by JEMCO Inc.), PF636, PF656, PF6320 and PF6520 (manufactured by OMNOVA), FTXs-204G, 208G, 218G 230G, 204D, 208D, 212D, 218D and 222D (manufactured by NEOS Co.) and so on. It is also possible to use Polysiloxane polymer KP341 (manufactured by Shin-Etsu Chemical Industry Col., Ltd.) as a silicon-based polymer.

In addition to the publicly known surfactants as described above, use can be also made of surfactants including a polymer having a fluoro aliphatic group derived from a fluoro aliphatic compound which is produced by the telomerization method (also called the telomer method) or the oligomerization method (also called the oligomer method). Such a fluoro aliphatic compound can be synthesized by a method described in JP-A-2002-90991.

As the polymer having a fluoro aliphatic group, a copolymer of a monomer having a fluoro aliphatic group with a (poly(oxyalkylene)) acrylate and/or a (poly(oxyalkylene)) methacrylate is preferable. Either a copolymer with irregular distribution or a block copolymer may be used. Examples of the poly(oxyalkylene) group include a poly(oxyethylene) group, a poly(oxypropylene) group, a poly(oxybutylene) group and so on. Use may be also made of units having alkylenes with different chain lengths within a single chain such as a poly(oxyethylene-oxypropylene0oxyethylene block unit) and poly(oxyethylene-oxypropylene block unit). Moreover, use may be made of not only a copolymer or a dimer of a monomer having a fluoro aliphatic group with a (poly(oxyalkylene)) acrylate (or methacrylate) but also a trimer or a higher copolymer having two or more different monomers having a fluoro aliphatic group or two or more different (poly(oxyalkylene)) acrylates (or methacrylates) copolymerized at the same time.

Examples of commercially available surfactants include Megafacs F178, F-470, F-473, F-475, F-476 and F-472 (manufactured by Dainippon Ink & Chemicals, Inc.). Further examples thereof include a copolymer of a $C_6F_{13}$-containing acrylate (or methacrylate) with a (poly(oxyalkylene))acrylate (or methacrylate), a copolymer of a $C_3F_7$-containing acrylate (or methacrylate) with a (poly(oxyalkylene))acrylate (or methacrylate) and (poly(oxypropylene))acrylate (or methacrylate).

In the invention, use can be also made of a surfactant other than fluorine and/or silicon-based surfactant. As specific examples thereof, there can be enumerated nonionic surfactants such as polyoxyethylene alkyl ethers such as polyoxyethylene lauryl ether, polyoxyethylene stearyl ether and polyoxyethylene oleyl ether; polyoxyethylene alkyl allyl ethers such as polyoxyethylene octyl phenol ether and polyoxyethylene nonyl phenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; polyoxyethylene sorbitan fatty acid esters such as polyoxyethylene sorbitan monolaurate, polyoxyethylene sorbitan monopahnitate, polyoxyethylene sorbitan monostearate, polyoxyethylene sorbitan trioleate and polyoxyethylene sorbitan tristearate; and so on.

Either one of these surfactants or a combination of two or more thereof may be used.

It is preferable to use (F) the surfactant in an amount of from 0.01 to 10% by mass, more preferably from 0.1 to 5% by mass, based on the whole resist composition (excluding the solvent).

(G) Onium Carboxylate

The resist composition according to the invention may include (G) an onium carboxylate. Examples of the onium carboxylate include sulfonium carboxylate, iodonium carboxylate, ammonium carboxylate and so on. In particular, the (G) onium carboxylate is preferably an iodonium salt or a sulfonium salt. Furthermore, the carboxylate residue of the (G) onium carboxylate for use in the invention preferably contains no aromatic group and no carbon-carbon double bond. The anion moiety is preferably a linear, branched, monocyclic or polycyclic alkylcarboxylate anion having from 1 to 30 carbon atoms, more preferably an anion of the carboxylic acid in which the alkyl group has been partially or entirely fluorine-substituted. The alkyl chain may contain an oxygen atom. Owing to this construction, the transparency to light of 220 nm or less is ensured, the sensitivity and the resolution are enhanced, and the defocus latitude depended on line pitch and the exposure margin are improved.

Examples of the anion of a fluorine-substituted carboxylic acid include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, 2,2-bistrifluoromethylpropionic acid and so on.

These (G) onium carboxylates can be synthesized by reacting sulfonium hydroxide, iodonium hydroxide or ammonium hydroxide and a carboxylic acid with silver oxide in an appropriate solvent.

The content of the (G) onium carboxylate in the composition is generally from 0.1 to 20% by mass, preferably from 0.5 to 10% by mass, more preferably from 1 to 7% by mass, based on the total solid content of the composition.

(H) Other Additives

The resist composition according to the invention may further contain, if required, a dye, a plasticizer, a photosensitizer, a photo absorbing agent, an alkali-soluble resin, a dissolution inhibitor, a compound accelerating dissolution in a developing solution (for example, a phenol compound having a molecular weight of 1000 or less or an alicyclic or aliphatic compound having a carboxyl group) and so on.

Such a phenolic compound having a molecular weight of 1,000 or less can be easily synthesized by a person skilled in the art by referring to, for example, methods described in JP-A-4-122938, JP-A-2-28531, U.S. Pat. No. 4,916,210, EP219294 and so on.

Specific examples of the alicyclic or aliphatic compound having a carboxyl group include a derivative of a carboxylic acid having a steroid structure such as cholic acid, deoxycholic acid and lithocholic acid, an adamantane carboxylic acid derivative, adamantane dicarboxylic acid, cyclohexane carboxylic acid, cyclohexane carboxylic acid, cyclohexane dicarboxylic acid and so on, though the invention is not restricted thereto.

In the pattern forming method according to the invention, the step of forming on a substrate a film made of a resin composition which shows an increase in the solubility in a positive developing solution and a decrease in the solubility in a negative developing solution upon irradiation with an actinic ray or radiation, the step of exposing the film, the step of heating the film and the step of subjecting the film to positive development can be conducted by a commonly known method.

Although the wavelength of the light source to be used in the exposure device in the invention is not particularly restricted, it is possible to use a KrF excimer laser beam wavelength (248 nm), an ArF excimer laser beam wavelength (193 nm), an $F_2$ excimer laser beam wavelength (157 nm) and so on.

In the step of exposing in the invention, use can be made of the immersion method.

The immersion method is a technique wherein the space between a projector lens and a sample is filled with a liquid having a high refractive index (hereinafter also called "immersion liquid").

Concerning this "immersion effect", the resolution and focal depth can be indicated by the following formulae, wherein $\lambda_0$ represents the wavelength of the exposure light in air, n represents the air refractive index of the immersion liquid, θ represents the convergence half angle of the light, and $NA_o$ is referred to as sin θ.

(Resolution)=$k_1 \cdot (\lambda_1/n)NA_0$ (Focal depth)=$\pm k_2 \cdot (\lambda_0/n)NA_0^2$ Namely, the immersion effect is equivalent to using exposure light of the wavelength 1/n. In other words, the immersion makes it possible to elevate n-fold the focal depth in the case of using a projection optical system of the same NA. This is effective on any patterns and, moreover, can be combined with the super-resolution techniques under study, for example, the phase-shift method and the distortion illumination method.

In the immersion method, the step of washing the film surface with an aqueous solution at the point (1) between the step of forming of the film on the substrate and the step of exposing and/or (2) between the step of exposing the film via the immersion liquid and the step of heating the film.

As the immersion liquid, it is preferable to employ a liquid which is transparent to the exposure wavelength and has a temperature coefficient of the refractive index as low as possible so as to minimize deformation in an optical image projected on the resist. In the case where an ArF excimer laser beam (wavelength: 193 nm) is employed as an exposure light source, in particular, it is favorable to use water because of the high availability and easiness in handling thereof, in addition to the viewpoints as discussed above.

In the case of using water as the immersion liquid, use may be made of a small amount of an additive (a liquid), which causes no dissolution of the resist layer on a wafer and exhibits only ignorable effect on the optical coat at the bottom face of the lens device, so as to lower the surface tension of water and elevate the interfacial activity.

As such an additive, it is preferable to use an aliphatic alcohol having a refractive index almost the same as water, for example, methyl alcohol, ethyl alcohol, isopropyl alcohol or the like. By adding such an alcohol having a refractive index almost the same as water, there arises an advantage that the refractive index change in the whole liquid can be minimized even though the alcoholic component in water is vaporized and thus the concentration thereof is altered.

When the immersion liquid is contaminated with a substance which is opaque to the light of 193 nm or has a refractive index largely differing from water, on the other hand, an optical image projected on the resist is deformed. Therefore, it is preferable to use distilled water as the water. Use may be also made of purified water having been filtered through, for example, an ion exchange filter.

In the invention, the substrate on which the film is formed is not particularly restricted. For example, it is possible to use a substrate commonly employed in the process of producing semiconductors such as IC, in the process of producing circuit substrates such as liquid crystals or thermal heads and in the process of lithographing other photofabrications, for example an inorganic substrate made of silicon, SiN, $SiO_2$ or the like or a coated inorganic substrate such as SOG. If necessary, an organic antireflective film may be formed between the film and the substrate.

In conducting the positive development, it is preferable to use an alkali developing solution.

As the alkali developing solution for conducting the positive development, use can be made of aqueous alkaline solutions of inorganic alkalis such as sodium hydroxide, potassium hydroxide, sodium carbonate, sodium silicate, sodium metasilicate and aqueous ammonia; primary amines such as ethylamine and n-propyl amine; secondary amines such as diethylamine and di-n-butylamine; tertiary amines such as triethylamine and methyldiethylamine; alcohol amines such as dimethyl ethanol amine and triethanol amine; quaternary ammonium salts such as tetramethylammonium hydroxide and tetraethylammonium hydroxide; and cyclic amines such as pyrrole and piperidine.

It is also possible to use such an alkali developing solution as cited above which further contains an alcohol or a surfactant in an appropriate amount.

The alkali concentration in the alkali developing solution is usually from 0.1 to 20% by mass.

The pH value of the alkali developing solution is usually from 10.0 to 15.0.

A 2.38% aqueous solution of trimethylammonium hydroxide is particularly desirable.

In the rinsing treatment to be conducted after the positive development, purified water is used as a rinsing solution. It is also possible to add an appropriate amount of a surfactant thereto.

In conducting negative development, it is preferable to use an organic developing solution containing an organic solvent.

As the organic developing solution usable in conducting the negative development, use can be made of a polar solvent such as a ketone solvent, an ester solvent, an alcohol solvent, an amide solvent or an ether solvent and a hydrocarbon solvent.

Examples of the usable ketone solvent include 1-octanone, 2-octanone, 1-nonanone, 2-nonanone, acetone, 4-heptanone, 1-hexanone, 2-hexanone, diisobutyl ketone, cyclohexanone, methyl cyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate and so on.

Examples of the usable ester solvent include methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate and so on.

Examples of the alcohol solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and so on; glycol solvents such as ethylene glycol, diethylene glycol, triethylene glycol and so on; and glycol ether solvents such as ethylene glycol monomethyl ether, propylene glycol monomethyl ether, ethylene glycol monoethyl ether, propylene glycol monoethyl ether, diethylene glycol monoethyl ether, triethylene glycol monoethyl ether, methoxy methyl butanol and so on.

Examples of the ether solvent include the glycol ether solvents cited above, dioxane, tetrahydrofuran and so on.

Examples of the usable amide solvent include N-methyl-2-pyrrolidone, N,N-dimethylacetamide, N,N-dimethylformamide, hexamethylphosphoric triamide, 1,3-dimethyl-2-imidazolidinone and so on.

Examples of the hydrocarbon solvent include aromatic hydrocarbon solvents such as toluene, xylene and so on and aliphatic hydrocarbon solvents such as pentane, hexane, octane, decane and so on.

Two or more kinds of these solvents may be used. Moreover, the above solvents may be mixed with other solvents or water.

As examples of the development system, there can be enumerated a method including heaping up the developing solution on the substrate surface due to surface tension and allowing it to stand for a definite time to thereby conduct the development (the paddle method), a method including spraying the developing solution onto the substrate surface (the spray method), a method including rotating the substrate at a definite speed and continuously coating it with the developing solution by scanning a developing solution-coating nozzle at a definite speed (the dynamic dispense method), and so on. In the case of the negative developing solution has a high vapor pressure in using such a development method, the substrate surface is cooled by the evaporation of the developing solution and thus the temperature of the developing solution is lowered. Thus, it is impossible to achieve a constant dissolution speed of the film of the resist composition formed on the substrate, which worsens dimensional uniformity. Therefore, the developing solution usable in conducting the negative development preferably has a vapor pressure at 20° C. of 5 kPa or lower, more preferably 3 kPa or lower and most preferably 2 kPa or lower.

Specific examples of the developing solution having a vapor pressure of 5 kPa or lower include ketone solvents such as 1-octanone, 2-octanone, 1-nonanone, 2-nonanone, 4-heptanone, 2-hexanone, diisobutyl ketone, cyclohexanone, methyl cyclohexanone, phenyl acetone, methyl isobutyl ketone and so on; ester solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate, propyl lactate and so on; alcohol solvents such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and so on; glycol solvents such as ethylene glycol, diethylene glycol, triethylene glycol and so on; glycol ether solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, methoxy methyl butanol and so on; ether solvents such as tetrahydrofuran and so on; amide solvents such as N-methyl-2-pyrrolidone, N,N-dimethylacetamide and N,N-dimethylformamide; aromatic hydrocarbon solvents such as toluene, xylene and so on; and aliphatic hydrocarbon solvents such as octane, decane and so on.

Specific examples of the developing solution having a vapor pressure of 2 kPa or lower, i.e., being the more preferable range, include ketone solvents such as 1-octanone, 2-octanone, 1-nonanone, 2-nonanone, 4-heptanone, 2-hexanone, diisobutyl ketone, cyclohexanone, methyl cyclohexanone, phenyl acetone and so on; ester solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate, propyl lactate and so on; alcohol solvents such as alcohols such as n-butyl alcohol, sec-butyl alcohol, tert-butyl alcohol, isobutyl alcohol, n-hexyl alcohol, n-heptyl alcohol, n-octyl alcohol, n-decanol and so on; glycol solvents such as ethylene glycol, diethylene glycol, triethylene glycol and so on; glycol ether solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, methoxy methyl butanol and so on; amide solvents such as N-methyl-2-pyrrolidone, N,N-dimethylacetamide and N,N-dimethylformamide; aromatic hydrocarbon solvents such as xylene and so on; and aliphatic hydrocarbon solvents such as octane, decane and so on.

The developing solution usable in conducting the negative development may contain an appropriate amount of a surfactant, if necessary.

The surfactant is not particularly restricted and use can be made of, for example, ionic or nonionic fluorine and/or silicon-based surfactants. Examples of such fluorine and/or silicon-based surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, U.S. Pat. No. 5,405,720, U.S. Pat. No. 5,360,692, U.S. Pat. No. 5,529,881, U.S. Pat. No. 5,296,330, U.S. Pat. No. 5,436,098, U.S. Pat. No. 5,576,143, U.S. Pat. No. 5,294,511 and U.S. Pat. No. 5,824,451. A nonionic surfactant is preferred. Although the nonionic surfactant is nor particularly restricted, it is particularly preferable to use a fluorine-based surfactant or a silicon-based surfactant.

The surfactant is used usually in an mount of from 0.001 to 5% by mass, preferably from 0.005 to 2% by mass and more preferably from 0.01 to 0.5% by mass, based on the whole developing solution.

As examples of the development method, there can be enumerated a method including dipping the substrate in a tank filled with the developing solution for a definite period of time (the dip method), a method including heaping up the developing solution on the substrate surface due to surface tension and allowing it to stand for a definite time to thereby conduct the development (the paddle method), a method including spraying the developing solution onto the substrate surface (the spray method), a method including rotating the substrate at a definite speed and continuously coating it with the developing solution by scanning a developing solution-coating nozzle at a definite speed (the dynamic dispense method), and so on.

After the step of conducting the negative development, the step of ceasing the development while replacing by another solvent may be carried out.

After the negative development, it is preferable to carry out the step of washing with the use of a rinsing solution for negative development containing an organic solvent.

After washing by using the rinsing solution for negative development, it is preferable to rotate the substrate at a rotational speed of 2000 rpm to 4000 rpm to thereby remove the rinsing solution from the substrate face. In the case where the rinsing solution has a low vapor pressure, the rinsing solution remains on the substrate even after removing the rinsing solution by rotating the substrate. The remaining rinsing solution penetrates into the resist pattern having been formed on the substrate and thus the resist pattern swells. As a result, the dimensional uniformity of the resist pattern is worsened. Therefore, it is preferable that the rinsing solution has a vapor pressure at 20° C. of 0.05 kPa or higher, more preferably 0.1 kPa or higher and most preferably 0.12 kPa or higher.

In the rinsing step after the negative development, it is preferable to conduct the washing with the use of a rinsing solution which contains at least one organic solvent selected form among a hydrocarbon solvent, a ketone solvent, an ester solvent, an alcohol solvent, an amide solvent and an ether solvent. It is more preferable to conduct the washing step with the use of a rinsing solution which contains at least one organic solvent selected form among a ketone solvent, an ester solvent, an alcohol solvent and an amide solvent, after the negative development. It is still more preferable to conduct the washing step with the use of a rinsing solution which contains an alcohol solvent or an ester solvent, after the negative development. It is particularly preferable to conduct the washing step with the use of a rinsing solution containing a monohydric alcohol having from 5 to 8 carbon atoms after the negative development. Examples of the monohydric alcohol having from 5 to 8 carbon atoms that is usable in the rinsing step after the negative development include linear, branched and cyclic monohydric alcohols such as 1-pentanol, 2-pentanol, 1-hexanol, 1-heptanol, 1-octanol, 2-hexanol, 2-heptanol, 2-octanol, 3-hexanol, 3-heptanol, 3-octanol, 4-octanol and so on and 1-hexanol, 2-hexanol and 2-heptanol are preferred.

The individual components as described above may be a mixture of multiple components. Also, a mixture with an organic solvent other than those cited above may be used.

The water content of the rinsing solution is preferably 10% by mass or less, more preferably 5% by mass or less and particularly preferably 3% by mass or less. By regulating the water content to 10% by mass or less, favorable development properties can be established.

It is also possible to employ a rinsing solution containing an appropriate amount of a surfactant.

In the rinsing step, the wafer having been subjected to the negative development is washed with the use of the above-described rinsing solution containing an organic solvent. The washing treatment method is not particularly restricted. For example, use can be made of a method including coating the substrate under rotation at a definite speed with the rinsing solution (the spin coating method), a method including dipping the substrate in a tank filled with the rinsing solution for a definite period of time (the dip method), a method including spraying the rinsing solution onto the substrate surface (the spray method) and so on. Among all, it is preferable to conduct the washing treatment by the spin coating method and, after the completion of the washing, rotating the substrate at a rotational speed of 2000 rpm to 4000 rpm to thereby remove the rinsing solution from the substrate.

EXAMPLES

Now, the invention will be illustrated by referring to the following Examples, though the invention is not restricted thereto.

[Synthesis Example 1: Synthesis of Resin (A1)]

Into a three necked flask, 20 g of a solvent mixture including propylene glycol monomethyl ether acetate and propylene glycol monomethyl ether at a ratio (by mass) of 6/4 was introduced under a nitrogen gas stream and heated to 80° C. (solvent 1). γ-Butyrolactone methacrylate, hydroxyadamantane methacrylate and 2-methyl-2-adamantyl methacrylate were added at a molar ratio of 45/15/40 to s solvent mixture of propylene glycol monomethyl ether acetate and propylene glycol monomethyl ether at a ratio (by mass) of 6/4 to give a 22% by mass monomer solution (200 g). To this solution, 8% by mol of a polymerization initiator V-601 (manufactured by Wako Pure Chemical Industries, Ltd.) was added and dissolved. The resulting solution was dropped for 6 hours into the above solvent 1. After the completion of dropping, the reaction mixture was reacted for additional 2 hours at 80° C. Then, the liquid reaction mixture was cooled by standing and poured into hexane 1800 ml/ethyl acetate 200 ml. The powder thus precipitated was collected by filtration and dried. Thus, 37 g of a resin (A1) was obtained. The weight-average molecular weight of the obtained resin (A1) was 9500 while the degree of dispersion (Mw/Mn) thereof was 1.80.

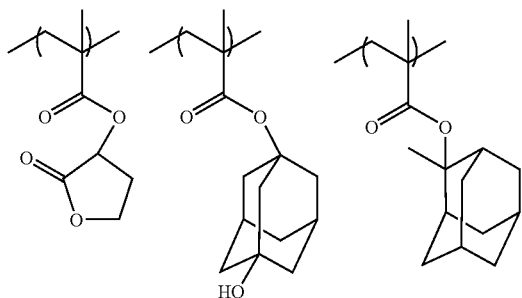

(Resin A1) Mw = 9500, Mw/Mn = 1.80
Molar composition ratio 45/15/40

[Resist Composition (A1)]

The following components were dissolved in a solvent mixture of propylene glycol monomethyl ether acetate/propylene glycol monomethyl ether (60:40) and the resulting solution having a solid concentration of 5.8% by mass was filtered through a polyethylene filter having a pore size of 0.1 μm. Thus, a positive resist composition (A1) was prepared.

Resin (A1) 1.83 g, triphenylsulfonium nonaflate 69.6 mg, diphenylaniline 8.7 mg, and PF6320 (a fluorine-based surfactant manufactured by OMNOVA) 1.7 mg.

[Resist Composition (A2)]

A resist composition (A2) was prepared by using the following resin (A2) as a substitute for the resin (A1).

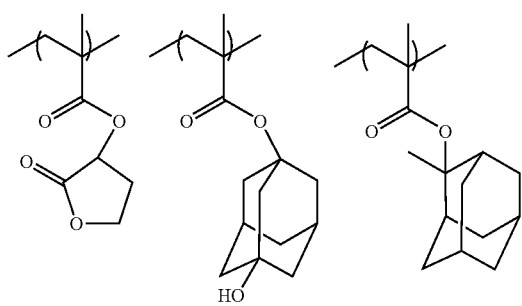

(Resin A2) Mw = 8000, Mw/Mn = 1.85
Molar composition ratio 50/10/40

[Resist Composition (A3)]

A resist composition (A3) was prepared by using the following resin (A3) as a substitute for the resin (A1).

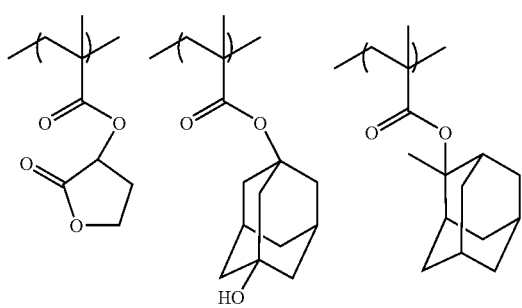

(Resin A3) Mw = 7500, Mw/Mn = 1.80
Molar composition ratio 50/5/45

[Resist Composition (A4)]

A resist composition (A4) was prepared by using the following resin (A4) as a substitute for the resin (A1).

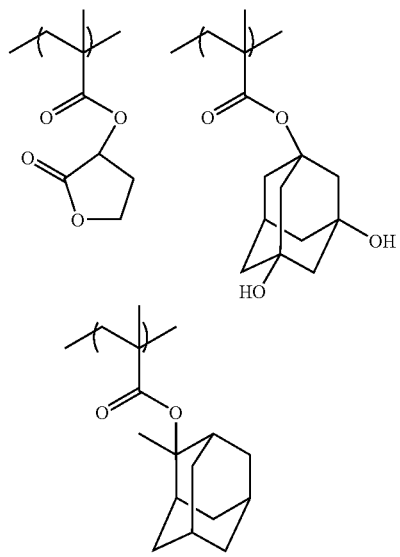

(Resin A4) Mw = 7500, Mw/Mn = 1.80
Molar composition ratio 50/5/45

[Resist Compositions (A5) to (A9)]

Resist compositions (A5) to (A9) were prepared by respectively using the following resins (A5) to (A9) each as a substitute for the resin (A1).

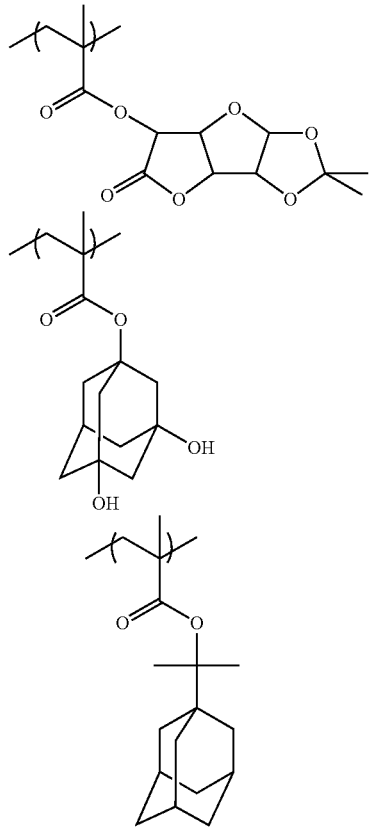

(Resin A5) Mw = 10500, Mw/Mn = 1.95
Molar composition ratio 45/5/50

-continued
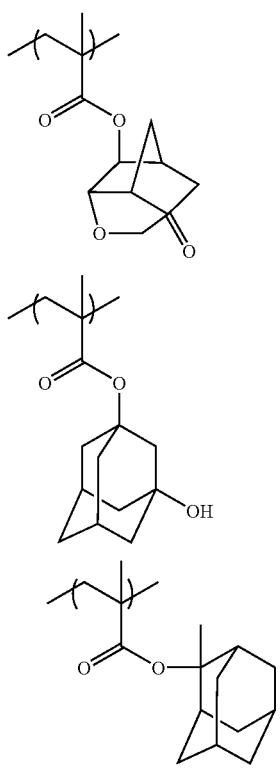
(Resin A6) Mw = 12500, Mw/Mn = 1.65
Molar composition ratio 42/8/50
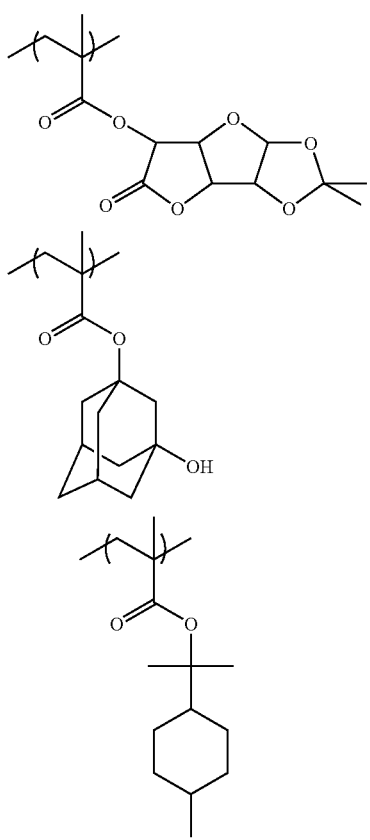
(Resin A7) Mw = 8200, Mw/Mn = 1.60
Molar composition ratio 38/13/49
-continued
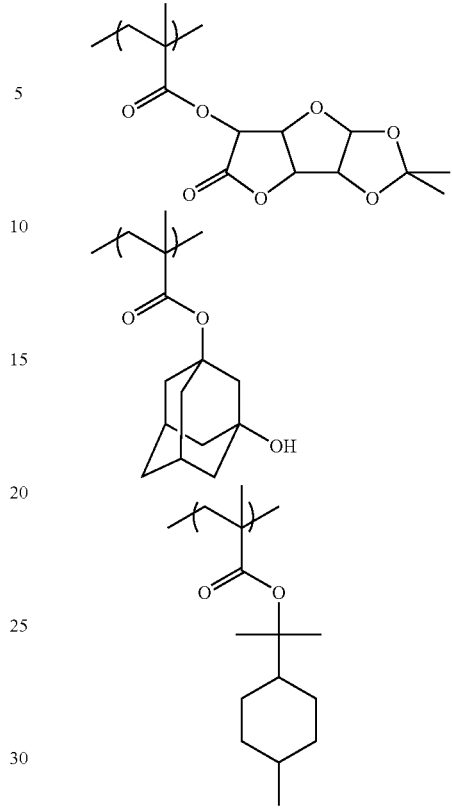
(Resin A8) Mw = 11200, Mw/Mn = 1.80
Molar composition ratio 50/2/48
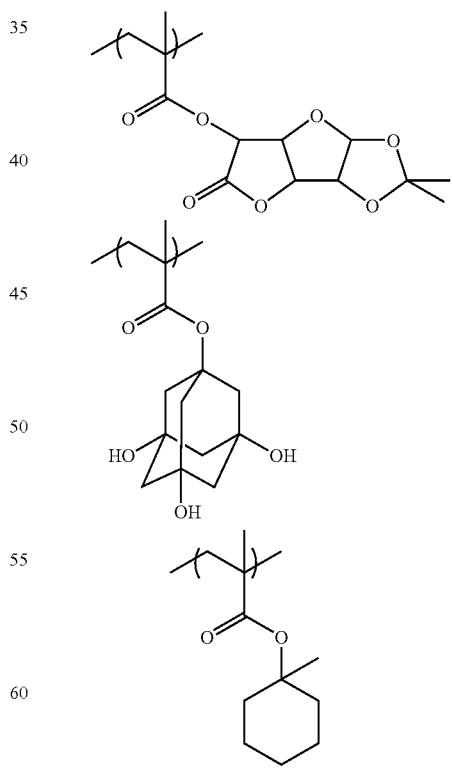
(Resin A9) Mw = 10000, Mw/Mn = 1.85
Molar composition ratio 50/4/46

[Resist Composition (B)]

A resist composition (B) was prepared by using the following resin (B) as a substitute for the resin (A1).

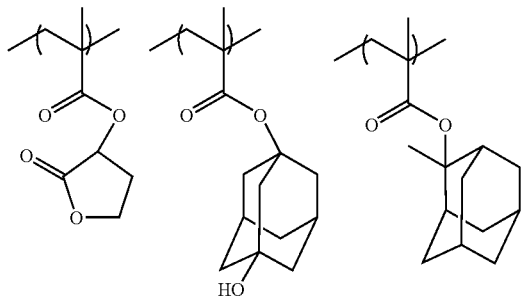

(Resin B) Mw = 9200, Mw/Mn = 1.95
Molar composition ratio 40/20/40

[Resist Compositions (C) and (D)]

Resist compositions (C) and (D) were prepared by using the following resins (C) and (D) each as a substitute for the resin (A1).

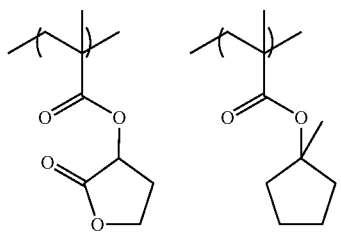

(Resin C) Mw = 6200, Mw/Mn = 1.95
Molar composition ratio 15/85

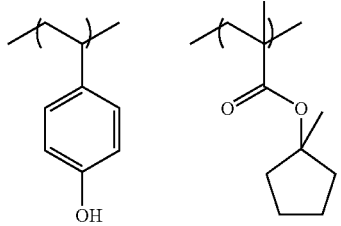

(Resin D) Mw = 1200, Mw/Mn = 2.00
Molar composition ratio 10/90

Example 1

An organic antireflective film ARC29A (manufactured by Nissan Chemical Industries, Ltd.) was coated on a silicon wafer and baked at 205° C. for 60 seconds to thereby form an antireflective film having a thickness of 78 nm. Then the resist composition (A1) was coated thereon and baked at 120° C. for 60 seconds to form a resist film having a thickness of 150 nm. The obtained wafer was subjected to pattern exposure with the use of an ArF excimer laser scanner (NA 0.75). After heating at 120° C. for 60 second, the wafer was subjected to (negative) development by the spray method with the use of butyl acetate (a negative developing solution) for 60 seconds under rotating at a rotational speed of 1000 rpm. Thus, a resist pattern of a 150 nm (1:1) line-and-space was obtained.

Example 2

An organic antireflective film ARC29A (manufactured by Nissan Chemical Industries, Ltd.) was coated on a silicon wafer and baked at 205° C. for 60 seconds to thereby form an antireflective film having a thickness of 78 nm. Then the resist composition (A1) was coated thereon and baked at 120° C. for 60 seconds to form a resist film having a thickness of 150 nm. The obtained wafer was subjected to pattern exposure with the use of an ArF excimer laser scanner (NA 0.75). After heating at 120° C. for 60 second, the wafer was subjected to (negative) development by the spray method with the use of butyl acetate (a negative developing solution) for 60 seconds under rotating at a rotational speed of 1000 rpm. Next, the wafer was rinsed with 1-hexanol for 30 seconds while continuing the rotation. Then, the wafer was rotated at a rotational speed of 4000 rpm for 30 seconds to thereby remove the rinsing solution. Thus, a resist pattern of a 150 nm (1:1) line-and-space was obtained.

Examples 3 to 5 and 8 to 13 and Comparative Examples 1 and 2

Resist patterns of a 150 nm (1:1) line-and-space were obtained as in Example 2 but using the resist compositions (A2) to (A9), (B), (C) and (D) respectively.

Example 6

An organic antireflective film ARC29A (manufactured by Nissan Chemical Industries, Ltd.) was coated on a silicon wafer and baked at 205° C. for 60 seconds to thereby form an antireflective film having a thickness of 78 nm. Then the resist composition (A1) was coated thereon and baked at 120° C. for 60 seconds to form a resist film having a thickness of 150 nm. The obtained wafer was subjected to pattern exposure with the use of an ArF excimer laser scanner (NA 0.75). After heating at 120° C. for 60 second, the wafer was subjected to (positive) development by using an aqueous tetramethylammonium hydroxide solution (2.38% by mass) (a positive developing solution) for 30 seconds and then rinsed with purified water. Thus, a pattern of a 600 nm pitch and a 450 nm line width was obtained. Next, the wafer was subjected to (negative) development by the spray method with the use of butyl acetate (a negative developing solution) for 60 seconds under rotating at a rotational speed of 1000 rpm. Next, the wafer was rinsed with 1-hexanol for 30 seconds while continuing the rotation. Then, the wafer was rotated at a rotational speed of 4000 rpm for 30 seconds to thereby remove the rinsing solution. Thus, a resist pattern of a 150 nm (1:1) line-and-space was obtained.

Example 7

An organic antireflective film ARC29A (manufactured by Nissan Chemical Industries, Ltd.) was coated on a silicon wafer and baked at 205° C. for 60 seconds to thereby form an antireflective film having a thickness of 78 nm. Then the resist composition (A1) was coated thereon and baked at 120° C. for 60 seconds to form a resist film having a thickness of 150 nm. The obtained wafer was subjected to pattern exposure with the use of an ArF excimer laser scanner (NA 0.75). After heating at 120° C. for 60 second, the wafer was subjected to (negative) development by the spray method with the use of butyl acetate (a negative developing solution) for 60 seconds under rotating at a rotational speed of 1000 rpm. Next, the wafer was rinsed with 1-hexanol for 30 seconds while continuing the rotation. Then, the wafer was rotated at a rotational speed of 4000 rpm for 30 seconds to thereby remove the rinsing solution. Thus, a pattern of a 600 nm pitch and a 450 nm line width was obtained. Next, the wafer was subjected to (positive) development by using an aqueous tetramethylammonium hydroxide solution (2.38% by mass) (a positive developing solution) for 30 seconds and then rinsed with purified water. Thus, a resist pattern of a 150 nm (1:1) line-and-space was obtained.

<Evaluation of Line Edge Roughness (LER)>

Each of the resist patterns of a 150 nm (1:1) line-and-space obtained in Examples 1 to 13 and Comparative Examples 1 and 2 was observed under a scanning electron microscope (S-9260 manufactured by Hitachi, Ltd.). Within a 2 μm area in the longitudinal direction of the 150 μm line pattern, measurement was made at 50 points from the standard line assumed as being the edge. Thus, the standard deviation was determined and 3σ was computed. A smaller value indicates the better performance. Table 1 summarizes the results.

TABLE 1

|  |  | Resist Composition | Resin | Ratio of (NGH-1) component in resin | Weight-average molecular weight (Mw) | Degree of distribution (Mw/Mn) | LER (nm) |
|---|---|---|---|---|---|---|---|
| Example | 1 | A1 | A1 | 15 | 9500 | 1.8 | 7.9 |
|  | 2 | A1 | A1 | 15 | 9500 | 1.8 | 6.7 |
|  | 3 | A2 | A2 | 10 | 8000 | 1.85 | 6.5 |
|  | 4 | A3 | A3 | 5 | 7500 | 1.8 | 5.9 |
|  | 5 | A4 | A4 | 5 | 7500 | 1.8 | 5.8 |
|  | 6 | A1 | A1 | 15 | 9500 | 1.8 | 6.2 |
|  | 7 | A1 | A1 | 15 | 9500 | 1.8 | 6.0 |
|  | 8 | A5 | A5 | 5 | 10500 | 1.95 | 6.2 |
|  | 9 | A6 | A6 | 8 | 12500 | 1.65 | 6.8 |
|  | 10 | A7 | A7 | 13 | 8200 | 1.6 | 6.8 |
|  | 11 | A8 | A8 | 2 | 11200 | 1.8 | 5.7 |
|  | 12 | A9 | A9 | 4 | 10000 | 1.85 | 5.9 |
|  | 13 | B | B | 20 | 9200 | 1.95 | 10.5 |
| Comparative | 1 | C | C | 0 | 6200 | 1.95 | 13.4 |
| Example | 2 | D | D | 0 | 1200 | 2.00 | 14.5 |

Examples 14 to 27 and Comparative Examples 3 and 4

Resist patterns of a 150 nm (1:1) line-and-space were obtained as in Example 7 but using the combinations of a negative developing solution with a rinsing solution for the negative development listed in Table 3 respectively.

Example 28

A resist pattern of a 150 nm (1:1) line-and-space was obtained as in Example 7 but using the resist composition (B).

Table 2 shows the vapor pressure and boiling point of each solvent employed in the negative developing solutions and rinsing solutions for the negative development.

TABLE 2

| Solvent | Vapor pressure (kPa at 20° C.) | Boiling point (° C.) |
|---|---|---|
| Butyl acetate | 1.200 | 126 |
| Isoamyl acetate | 0.530 | 142 |
| Methyl isobutyl ketone | 2.100 | 117-118 |
| 2-Hexanone | 0.360 | 126-128 |
| Methyl ethyl ketone | 10.500 | 80 |
| Dipropyl ether | 8.330 | 88-90 |

TABLE 2-continued

| Solvent | Vapor pressure (kPa at 20° C.) | Boiling point (° C.) |
|---|---|---|
| Dibutyl ether | 0.640 | 142 |
| 1-Hexanol | 0.130 | 157 |
| 1-Heptanol | 0.015 | 175 |
| 2-Heptanol | 0.133 | 150-160 |
| Decane | 0.170 | 174 |
| Dodecane | 0.040 | 216 |

<Evaluation of dimensional uniformity>

Each of the resist patterns of a 150 nm (1:1) line-and-space obtained in Examples 14 to 28 and Comparative Examples 3 and 4 was observed under a scanning microscope (S-9260 manufactured by Hitachi, Ltd.). Measurement was made at 50 points at intervals of 2 μm and the standard deviation at the 50 points was determined and 3σ was computed. A smaller value indicates the better performance. Table 3 summarizes the results. In Table 3, a ratio by mass represents the mixing ratio by mass of two solvents employed together in the case of using a combination of two organic solvents as a negative developing solution or in the case of using a combination of two organic solvents as a rinsing solution for negative development. In the case where a negative developing solution or a rinsing solution for negative development includes a single organic solvent, the ratio by mass is 100.

TABLE 3

|  |  | Resist composition | Negative developing solution | | Ratio by mass | Rinsing solution for negative development | | Ratio by mass | Dimensional uniformity (nm) |
|---|---|---|---|---|---|---|---|---|---|
| Example | 14 | A1 | Butyl acetate | — | 100 | 1-Hexanol | — | 100 | 2.9 |
|  | 15 | A1 | Isoamyl acetate | — | 100 | 1-Hexanol | — | 100 | 3.1 |
|  | 16 | A1 | Methyl isobutyl ketone | — | 100 | 1-Hexanol | — | 100 | 3.6 |
|  | 17 | A1 | 2-Hexanone | — | 100 | 1-Hexanol | — | 100 | 2.5 |
|  | 18 | A1 | Dibutyl ether | — | 100 | 1-Hexanol | — | 100 | 4.5 |
|  | 19 | A1 | Butyl acetate | 2-Hexanone | 80/20 | 1-Hexanol | — | 100 | 3.5 |

TABLE 3-continued

|  | | Resist composition | Negative developing solution | | Ratio by mass | Rinsing solution for negative development | | Ratio by mass | Dimensional uniformity (nm) |
|---|---|---|---|---|---|---|---|---|---|
|  | 20 | A1 | Isoamyl acetate | Dibutyl ether | 70/30 | 1-Hexanol | — | 100 | 3.6 |
|  | 21 | A1 | Isoamyl acetate | — | 100 | 2-Heptanol | — | 100 | 3.3 |
|  | 22 | A1 | Isoamyl acetate | — | 100 | Decane | — | 100 | 4.5 |
|  | 23 | A1 | Isoamyl acetate | — | 100 | 2-Heptanol | Decane | 50/50 | 4.0 |
|  | 24 | A1 | Methyl ethyl ketone | — | 100 | 1-Hexanol | — | 100 | 10.0 |
|  | 25 | A1 | Dipropyl ether | — | 100 | 1-Hexanol | — | 100 | 11.0 |
|  | 26 | A1 | Isoamyl acetate | — | 100 | 1-Heptanol | — | 100 | 9.0 |
|  | 27 | A1 | Isoamyl acetate | — | 100 | Dodecane | — | 100 | 9.5 |
|  | 28 | B | Butyl acetate | — | 100 | 1-Hexanol | — | 100 | 7.5 |
| Comparative | 3 | C | Butyl acetate | — | 100 | 1-Hexanol | — | 100 | 13.7 |
| Example | 4 | D | Butyl acetate | — | 100 | 1-Hexanol | — | 100 | 17.5 |

As Table 3 shows, by combining the resist composition according to the invention with the negative developing solution and the rinsing solution for negative development according to the invention, a highly precise fine pattern having a reduced line edge roughness and an excellent dimensional uniformity can be stably formed.

According to the invention, it is possible to provide a pattern forming method whereby line edge roughness can be relieved and the dimensional stability of the pattern can be improved, a resist composition for negative development to be used in the method, a resist composition for multiple development to be used in the method, a negative developing solution to be used in the method and a rinsing solution for negative development to be used in the method.

The entire disclosure of each and every foreign patent application from which the benefit of foreign priority has been claimed in the present application is incorporated herein by reference, as if fully set forth.

What is claimed is:

1. A negative-working pattern forming method comprising:

coating a substrate with a resist composition comprising a resin that comprises a repeating unit represented by a following general formula (NGH-1), and, by the action of an acid, increases the polarity and decreases the solubility in a negative developing solution;

pattern-wise exposing; and developing the resist composition with a negative developing solution and dissolving a non-irradiated part in the negative developing solution to form a negative pattern on the substrate:

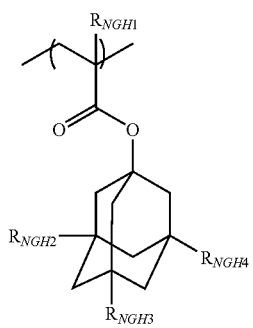

(NGH-1)

wherein $R_{NGH1}$ represents a hydrogen atom or an alkyl group; and $R_{NGH2}$ to $R_{NGH4}$ each independently represents a hydrogen atom or a hydroxyl group, provided that at least one of $R_{NGH2}$ to $R_{NGH4}$ represents a hydroxyl group.

2. The negative-working pattern forming method according to claim 1, wherein the negative developing solution comprises an organic solvent and has a vapor pressure of 5 kPa or lower at 20° C.

3. The negative-working pattern forming method according to claim 1, further comprising:

(f) washing with a rinsing solution for negative development, which comprises an organic solvent.

4. The negative-working pattern forming method according to claim 3, wherein the rinsing solution for negative development has a vapor pressure of 0.1 kPa or higher at 20° C.

5. The negative-working pattern forming method according to claim 1, wherein the negative developing solution is an organic developing solution, containing an organic solvent.

6. The negative-working pattern forming method according to claim 5, wherein the organic solvent is a ketone solvent, an ester solvent, an alcohol solvent, an amide solvent, an ether solvent or a hydrocarbon solvent.

7. The negative-working pattern forming method according to claim 6, wherein the organic solvent is an ester solvent.

8. The negative-working pattern forming method according to claim 7, wherein the ester solvent is methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutylacetate, 3-methyl-3-methoxybutylacetate, methyl formate, ethyl formate, butyl formate, propyl formate, ethyl lactate, butyl lactate, or propyl lactate.

9. The negative-working pattern forming method according to claim 8, wherein the ester solvent is butyl acetate.

10. The negative-working pattern forming method according to any one of claims 5 to 9, wherein the organic developing solution substantially consists of an organic solvent.

11. The negative-working pattern forming method according to claim 3, wherein the organic solvent in the rinsing solution is an alcohol solvent.

12. The negative-working pattern forming method according to claim 3, wherein the water content of the rinsing solution is 10% by mass or less.

13. The negative-working pattern forming method according to claim 3, wherein the water content of the rinsing solution is 3% by mass or less.

14. The negative-working pattern forming method according to claim 3, wherein the organic solvent in the rinsing solution is an alcohol solvent and the water content of the rinsing solution is 3% by mass or less.

15. The negative-working pattern forming method according to claim 6, wherein the organic solvent is a ketone solvent.

* * * * *